United States Patent
Okamoto et al.

(10) Patent No.: US 9,742,419 B2
(45) Date of Patent: Aug. 22, 2017

(54) OSCILLATOR CIRCUIT AND SEMICONDUCTOR DEVICE INCLUDING THE SAME

(71) Applicant: Semiconductor Energy Laboratory Co., Ltd., Atsugi-shi, Kanagawa-ken (JP)

(72) Inventors: Yuki Okamoto, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/151,590

(22) Filed: May 11, 2016

(65) Prior Publication Data

US 2016/0254819 A1    Sep. 1, 2016

Related U.S. Application Data

(63) Continuation of application No. 14/801,289, filed on Jul. 16, 2015, now Pat. No. 9,344,037.

(30) Foreign Application Priority Data

Jul. 25, 2014  (JP) ................................. 2014-151623

(51) Int. Cl.
*H03B 5/24*    (2006.01)
*H03L 7/099*    (2006.01)
(Continued)

(52) U.S. Cl.
CPC ........ *H03L 7/0995* (2013.01); *H01L 27/1207* (2013.01); *H01L 27/1225* (2013.01);
(Continued)

(58) Field of Classification Search
CPC .................................. H03B 5/24; H03K 3/0315
(Continued)

(56) References Cited

U.S. PATENT DOCUMENTS 4,547,749 A * 10/1985 Kuo ....................... H03K 3/011
331/111
5,012,142 A * 4/1991 Sonntag ................. H03K 5/133
327/158
(Continued)

FOREIGN PATENT DOCUMENTS

DE    10318184    1/2004
EP    0621689 A    10/1994
(Continued)

OTHER PUBLICATIONS

Gao.X et al.; "Jitter Analysis and a Benchmarking Figure-of-Merit for Phase-Locked Loops"; IEEE Transactions on Circuits and Systems, Feb. 1, 2009; vol. 56, No. 2, pp. 117-121.
(Continued)

*Primary Examiner* — Joseph Chang
(74) *Attorney, Agent, or Firm* — Fish & Richardson P.C.

(57) ABSTRACT

Controllability of an oscillator circuit is improved. The oscillator circuit has inverters in odd-numbered stages. A circuit is electrically connected to a power supply node of the inverters to which a high power supply potential is input. The circuit includes a first transistor, a second transistor, and a capacitor. The first transistor includes an oxide semiconductor in its channel. A holding circuit including the first transistor and the capacitor has a function of holding an analog potential that is input from the outside. The potential held by the holding circuit is input to a gate of the second transistor. A power supply potential is supplied to the
(Continued)

inverters through the second transistor, so that the delay time of the inverter can be controlled by the potential of the gate of the second transistor.

5 Claims, 49 Drawing Sheets

(51) Int. Cl.
  *H03K 3/03* (2006.01)
  *H03L 7/093* (2006.01)
  *H01L 27/12* (2006.01)
  *H01L 29/786* (2006.01)

(52) U.S. Cl.
  CPC ...... *H01L 27/1255* (2013.01); *H01L 29/7869* (2013.01); *H03B 5/24* (2013.01); *H03K 3/0315* (2013.01); *H03L 7/093* (2013.01); *H03L 2207/06* (2013.01)

(58) Field of Classification Search
  USPC .................................. 331/57, 108 B, 108 R
  See application file for complete search history.

(56) References Cited

U.S. PATENT DOCUMENTS

| | | |
|---|---|---|
| 5,594,391 A | 1/1997 | Yoshizawa |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,771,202 B2 | 8/2004 | Watanabe et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,921,853 B2 | 12/2014 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0201927 A1 | 10/2003 | Watanabe et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2015/0137120 A1 | 5/2015 | Yamazaki |
| 2015/0256161 A1 | 9/2015 | Okamoto et al. |

FOREIGN PATENT DOCUMENTS

| | | |
|---|---|---|
| EP | 1737044 A | 12/2006 |
| EP | 2226847 A | 9/2010 |
| JP | 56-086509 A | 7/1981 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-310994 A | 11/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-007385 A | 1/2004 |
| JP | 2004-103957 A | 4/2004 |

(56) References Cited

FOREIGN PATENT DOCUMENTS

| | | |
|---|---|---|
| JP | 2004-273614 A | 9/2004 |
| JP | 2004-273732 A | 9/2004 |
| JP | 2014-116594 A | 6/2014 |
| WO | WO-2004/114391 | 12/2004 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMD '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID Internatioanl Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUs on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID Interantional Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

(56) References Cited

OTHER PUBLICATIONS

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Lettters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FDP '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of SOL-GEL-Derived Zinc Oxide Films by Irradation with Ultraviolet Lamp", Journal of SOL-GEL Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

International Search Report (Application No. PCT/IB2015/055183) Dated Sep. 15, 2015.

Written Opinion (Application No. PCT/IB2015/055183) Dated Sep. 15, 2015.

* cited by examiner

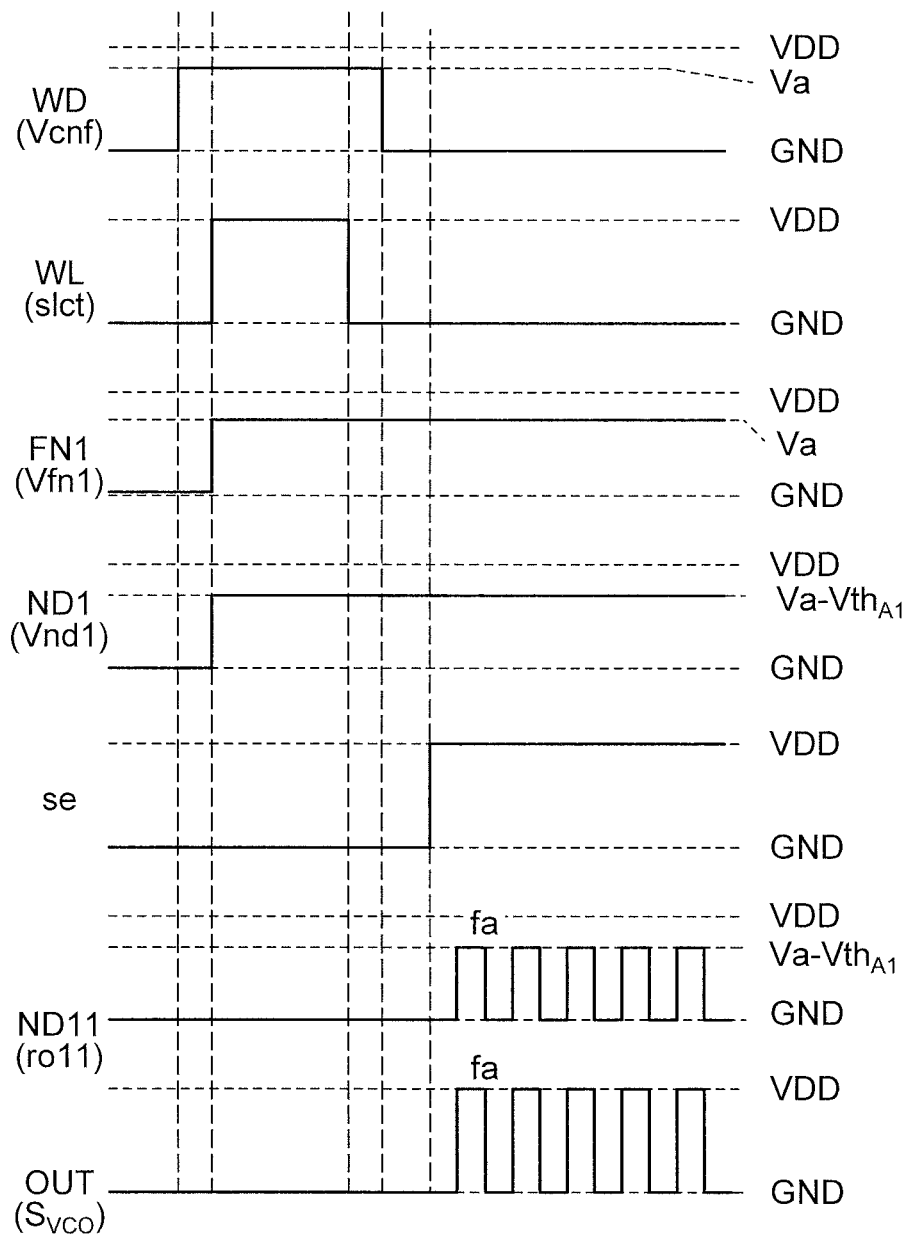

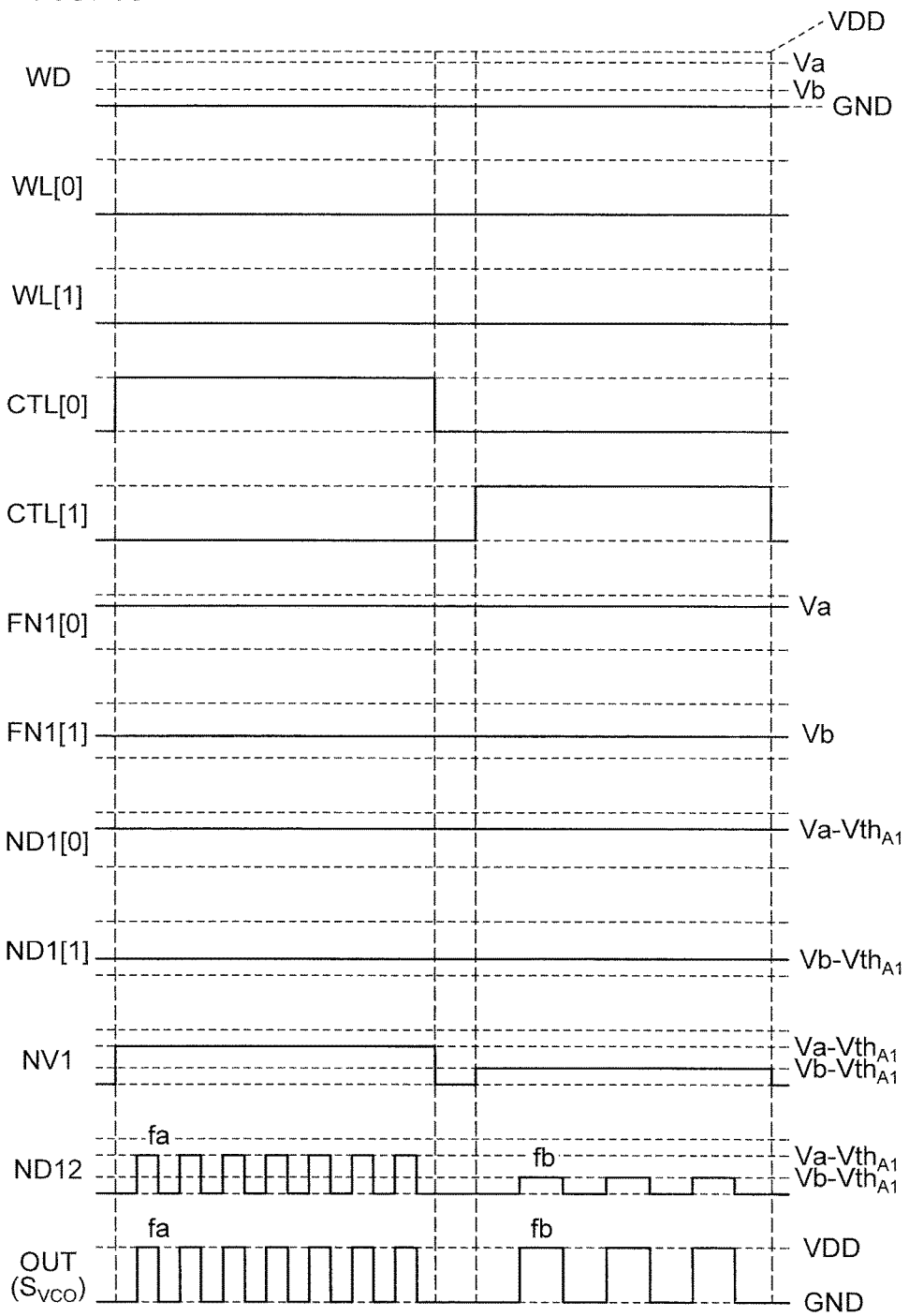

OSCILLATOR CIRCUIT AND SEMICONDUCTOR DEVICE INCLUDING THE SAME

CROSS-REFERENCE TO RELATED APPLICATIONS

This application is a continuation of U.S. application Ser. No. 14/801,289, filed Jul. 16, 2015, now allowed, which claims the benefit of a foreign priority application filed in Japan as Serial No. 2014-151623 on Jul. 25, 2014, both of which are incorporated by reference.

TECHNICAL FIELD

One embodiment of the present invention disclosed in this specification, the drawings, and the claims (hereinafter referred to as "this specification and the like") relates to a semiconductor device such as an oscillator circuit, a signal generating circuit, or a processing device, a driving method thereof, a manufacturing method thereof, and the like.

Note that one embodiment of the present invention is not limited to the above technical field. The technical field of one embodiment of the present invention relates to an object, a method, or a manufacturing method. One embodiment of the present invention relates to a process, a machine, manufacture, or a composition of matter. Specific examples of the technical field of one embodiment of the present invention include a semiconductor device, an oscillator circuit, a signal generating circuit, a processing device, a memory device, a display device, a liquid crystal display device, a light-emitting device, a lighting device, a power storage device, an input device, an imaging device, a method for driving any of them, and a method for manufacturing any of them.

BACKGROUND ART

A voltage controlled oscillator (VCO) is one of oscillator circuits and has a function of controlling the oscillation frequency of an output signal by voltage. For example, a ring-oscillator-based VCO is known (e.g., Patent Document 1). The VCO is used in a phase-locked loop (PLL), for example (e.g., Non-Patent Document 1).

PATENT DOCUMENT

Patent Document 1: Japanese Published Patent Application No. 06-310994

NON-PATENT DOCUMENT

X. Gao, et al., "Jitter Analysis and a Benchmarking Figure-of-Merit for Phase-Locked Loops", IEEE Trans. On Circuits and Systems-II, vol. 56, no. 2, pp. 117-121, February 2009.

DISCLOSURE OF INVENTION

An object of one embodiment of the present invention is to provide a novel semiconductor device or a method for driving the same. Another object of one embodiment of the present invention is to provide a semiconductor device with excellent controllability and a method for driving the same, a semiconductor device having a short starting time and a method for driving the same, or a programmable semiconductor device and a method for driving the same.

Note that the description of a plurality of objects does not preclude the existence of each object. One embodiment of the present invention does not necessarily achieve all the objects. Objects other than those listed above are apparent from the description of the specification, drawings, and claims, and also such objects could be an object of one embodiment of the present invention.

MEANS FOR SOLVING THE PROBLEMS

One embodiment of the present invention is an oscillator circuit including first- to n-th-stage first circuits (n is an odd number) and a second circuit. Each of the first- to n-th-stage first circuits includes a first input node, a first output node, an inverter, and a third circuit. The first output node of the first circuit in an i-th stage (i is an integer greater than or equal to 1 and less than or equal to (n−1)) is electrically connected to the first input node of the first circuit in a next stage. The output node of the first circuit in the n-th stage is electrically connected to the input node of the first circuit in the first stage. An input node of the inverter is electrically connected to the first input node. An output node of the inverter is electrically connected to the first output node. The inverter includes a first power supply node and a second power supply node. The third circuit includes a second input node, a second output node, a third node, a first transistor, a second transistor, and a first capacitor. The second output node is electrically connected to the first power supply node. A first potential is input to the second input node. A first terminal of the first transistor is electrically connected to the second input node. A second terminal of the first transistor is electrically connected to the third node. The first transistor includes an oxide semiconductor in its channel. The first capacitor has a function of holding a potential of the third node. A gate of the second transistor is electrically connected to the third node. A second potential is input to a first terminal of the second transistor. A second terminal of the second transistor is electrically connected to the second output node. The second circuit has a function of changing an amplitude of an output signal of the first output node of the first circuit in the n-th stage.

In the above embodiment, when a power supply potential input to the second power supply node is lower than a potential input to the first power supply node, the second transistor is preferably an n-channel transistor. Alternatively, when a power supply potential input to the second power supply node is higher than the potential input to the first power supply node, the second transistor is preferably a p-channel transistor.

In the above embodiment, the first- to n-th-stage first circuits each include a first switch. A conduction state between the output node of the inverter and the first output node may be controlled by the first switch.

In the above embodiment, the first- to n-th-stage first circuits each include a second switch. A conduction state between the first power supply node and the second output node may be controlled by the second switch.

In the above embodiment, different signals are input to gates of first transistors of the first- to n-th-stage first circuits.

In this specification and the like, ordinal numbers such as first, second, and third are used to avoid confusion among components, and the terms do not limit the components numerically or do not limit the order.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are all semiconductor devices. Moreover, a memory device, a display device, a light-emitting device, a lighting device, an electronic device, and the like themselves might be semiconductor devices, or might each include a semiconductor device.

Note that a transistor includes three terminals: a gate, a source, and a drain. The gate serves as a control terminal for controlling the on/off of the transistor. Depending on the channel type of the transistor or levels of potentials applied to the terminals, one of terminals functions as a source and the other functions as a drain. In general, in an n-channel transistor, a terminal to which a lower potential is applied is called a source, and a terminal to which a higher potential is applied is called a drain. In contrast, in a p-channel transistor, a terminal to which a lower potential is applied is called a drain, and a terminal to which a higher potential is applied is called a source. In this specification, in some cases, two terminals that are not the gate of the transistor are referred to as a first terminal and a second terminal in some cases.

In this specification, to clarify a circuit configuration and circuit operation, one of input and output terminals of a transistor is fixed as a source and the other is fixed as a drain in some cases. It is needless to say that, depending on a driving method, the magnitude relationship between potentials applied to three terminals of the transistor might be changed, and the source and the drain might be interchanged. Thus, in one embodiment of the present invention, the distinction between the source and drain of the transistor is not limited to that described in this specification and the drawings.

A node can be referred to as a terminal, a wiring, an electrode, a conductor, an impurity region, or the like depending on a circuit configuration, a device structure, and the like. Furthermore, a terminal and the like can be referred to as a node.

For example, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, a circuit, an element, a wiring, an electrode, a terminal, a node, a film, a layer, and a region).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements which enable electrical connection between X and Y (e.g., a switch, a transistor, a capacitor, an inductor, a resistor, a diode, a display element, a light-emitting element, and a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter (NOT) circuit, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another element or another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a first terminal of a transistor is electrically connected to X through (or not through) Z1 and a second terminal of the transistor is electrically connected to Y through (or not through) Z2, or the case where a first terminal of a transistor is directly connected to one part of Z1 and another part of Z1 is directly connected to X while a second terminal of the transistor is directly connected to one part of Z2 and another part of Z2 is directly connected to Y, can be expressed by using any of the following expressions.

Examples of the expressions include, "X Y, a first terminal of a transistor, and a second terminal of the transistor are electrically connected to each other, and X, the first terminal of the transistor, the second terminal of the transistor, and Y are electrically connected to each other in this order", "a first terminal of a transistor is electrically connected to X, a second terminal of the transistor is electrically connected to Y, and X the first terminal of the transistor, the second terminal of the transistor, and Y are electrically connected to each other in this order", and "X is electrically connected to Y through a first terminal and a second terminal of a transistor, and X, the first terminal of the transistor, the second terminal of the transistor, and Y are provided to be connected in this order. When the connection order in a circuit configuration is defined by an expression similar to the above examples, a first terminal and a second terminal of a transistor can be distinguished from each other to specify the technical scope Another example of the expression is "a first terminal of a transistor is electrically connected to X through at least a first connection path, the first connection path does not include a second connection path, the second connection path is a path between the first terminal of the transistor and a second terminal of the transistor, Z1 is on the first connection path, the second terminal of the transistor is electrically connected to Y through at least a third connection path, the third connection path does not include the second connection path, and Z2 is on the third connection path." It is possible to use the expression "a first terminal of a transistor is electrically connected to X through Z1 on at least a first connection path, the first connection path does not include a second connection path, the second connection path includes a connection path through the transistor, a second terminal of the transistor is electrically connected to Y through Z2 on at least a third connection path, and the third connection path does not include the second connection path." It is also possible to use the expression "a first terminal of a transistor is electrically connected to X through Z1 on at least a first electrical path, the first electrical path does not include a second electrical path, the second electrical path is an electrical path from the first terminal of the transistor to a second terminal of the transistor, the second terminal of the transistor is electrically connected to Y through Z2 on at least a third electrical path, the third electrical path does not include a fourth electrical path, and the fourth electrical path is an electrical path from the second terminal of the transistor to the first terminal of the transistor." When the connection path in a circuit configuration is defined by an expression similar to the above examples, a first terminal and a second terminal of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a node, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least a connection portion of a circuit is specified. Alternatively, it might be possible for those skilled in the art to specify the invention when at least a function of a circuit is specified. In other words, when a function is specified, an embodiment of the invention can be obvious. Further, it can be determined that one embodiment of the present invention whose function is specified is disclosed in this specification and the like. Therefore, when a connection portion of a circuit is specified, the circuit is disclosed as one embodiment of the invention even when a function of the circuit is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification, the terms "film" and "layer" can be interchanged depending on the case or circumstances. For example, the term "conductive layer" can be changed into the term "conductive film", and the term "insulating film" can be changed into the term "insulating layer" in some cases.

One embodiment of the present invention can provide a novel semiconductor device or a method for driving the same. Alternatively, one embodiment of the present invention can provide a semiconductor device with excellent controllability and a method for driving the same, a semiconductor device with a short starting time and a method for driving the same, or a programmable semiconductor device and a method for driving the same.

Note that the description of the plurality of effects does not disturb the existence of other effects. In one embodiment of the present invention, there is no need to achieve all the effects described above. In one embodiment of the present invention, an object other than the above objects, an effect other than the above effects, and a novel feature will be apparent from the description of the specification and the drawings.

BRIEF DESCRIPTION OF DRAWINGS

In the accompanying drawings:

FIG. 9 is a timing chart showing an operation example of a circuit;

FIG. 19 is a timing chart showing an operation example of a circuit;

FIG. 41A is a top view; FIG. 41B is a cross-sectional view taken along line y1-y2; FIG. 41C is a cross-sectional view taken along line x1-x2; and FIG. 41D is a cross-sectional view taken along line x3-x4;

FIG. 42A is a top view; FIG. 42B is a cross-sectional view taken along line y1-y2; FIG. 42C is a cross-sectional view taken along line x1-x2; and FIG. 42D is a cross-sectional view taken along line x3-x4;

FIG. 43A is a top view; FIG. 43B is a cross-sectional view taken along line y1-y2; FIG. 43C is a cross-sectional view taken along line x1-x2; and FIG. 43D is a cross-sectional view taken along line x3-x4;

FIG. 44A is a top view; FIG. 44B is a cross-sectional view taken along line y1-y2; FIG. 44C is a cross-sectional view taken along line x1-x2; and FIG. 44D is a cross-sectional view taken along line x3-x4;

FIG. 45A is a top view; FIG. 45B is a cross-sectional view taken along line y1-y2; FIG. 45C is a cross-sectional view taken along line x1-x2; and FIG. 45D is a cross-sectional view taken along line x3-x4;

FIG. 46A is a top view; FIG. 46B is a cross-sectional view taken along line y1-y2; FIG. 46C is a cross-sectional view taken along line x1-x2; and FIG. 46D is a cross-sectional view taken along line x3-x4;

BEST MODE FOR CARRYING OUT THE INVENTION

Figure 1:
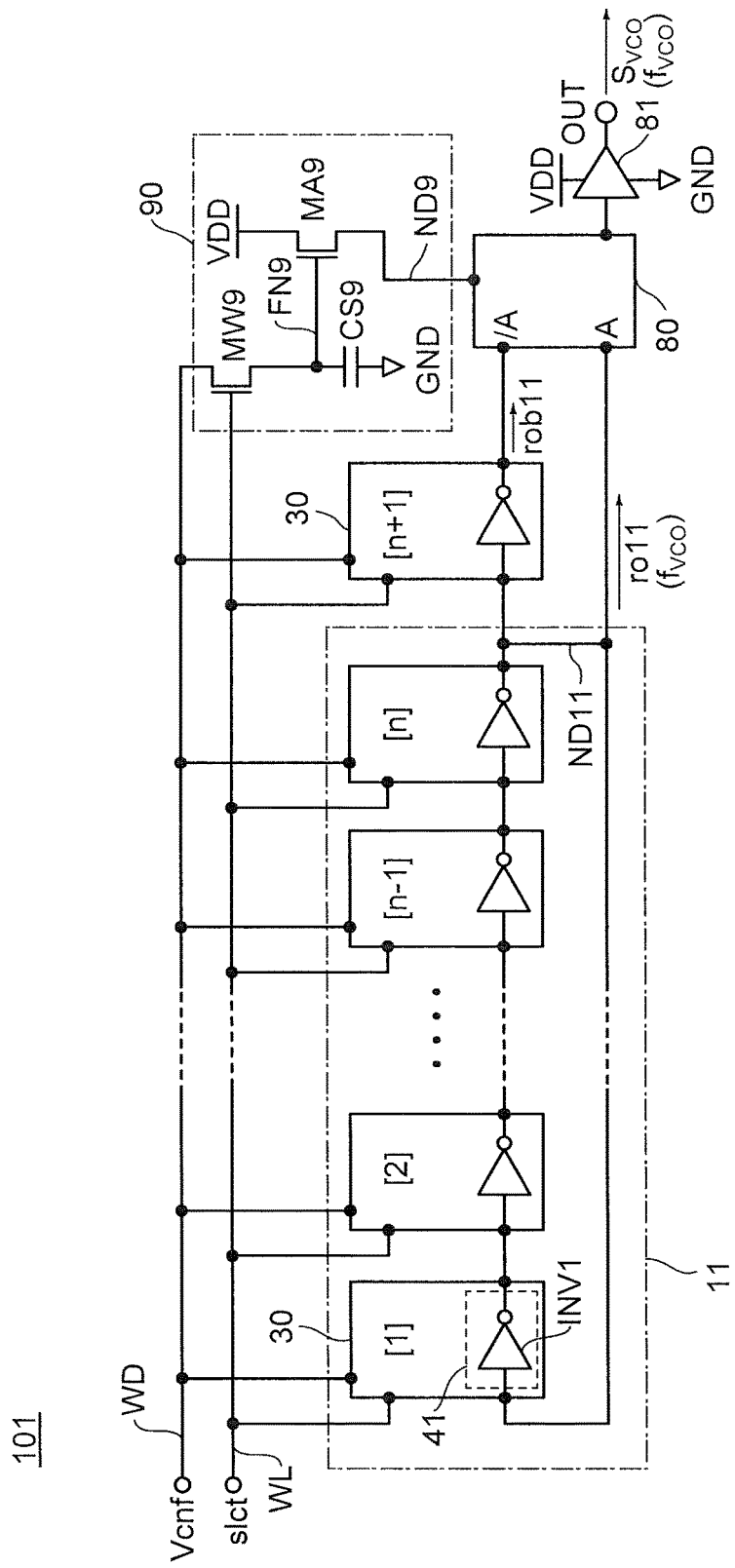
FIG. 1 is a block diagram showing a configuration example of a circuit.

Hereinafter, an embodiment and examples of the present invention will be described. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments and example.

In the drawings, the same components, components having similar functions, components formed of the same material, or components formed at the same time are denoted by the same reference numerals in some cases, and description thereof is not repeated in some cases.

When the same reference numerals are used for a plurality of elements and those elements need to be distinguished from each other, "_1", "_2", "[n]", "[m, n]", or the like may be added to the reference numerals. For example, in the case where a plurality of wirings WLW in a memory cell array are individually distinguished from one another, the wiring WLW in the second row is described using an address number (row number) of the memory cell array, as a wiring WLW[2] in some cases.

In this specification, for example, a high power supply potential VDD is abbreviated to a "potential VDD", a "VDD", or the like in some cases. The same applies to other components (e.g., a signal, a voltage, a potential, a circuit, an element, an electrode, and a wiring).

Embodiments and an example are described below. Any of the embodiments and the example can be combined as appropriate. In addition, in the case where some structure examples are given in one embodiment or example, any of the structure examples can be combined as appropriate.

(Embodiment 1)

An oscillator circuit is described as an example of a semiconductor device. The oscillator circuit is a device which has a function of generating an AC signal in which current or voltage changes.

<<Configuration Example 1 of Oscillator Circuit>>

FIG. 1 is a block diagram showing a configuration example of an oscillator circuit. A circuit 101 in FIG. 1 includes (n+1) circuits 30 (n is an odd number), a circuit 80, a buffer circuit 81, and a circuit 90. The (n+1) circuits 30 and the circuit 90 are each electrically connected to a wiring WD and a wiring WL. A potential Vcnf is input to the wiring WD, and a signal slct is input to the wiring WL. The potential Vcnf is an analog potential, and the oscillation frequency $f_{VCO}$ of an output signal $S_{VCO}$ of the circuit 101 can be changed by the potential Vcnf.

A VDD is a high power supply potential of the circuit 30 and a GND is a low power supply potential of the circuit 30. Note that in general, a potential (a voltage) is relative and is determined depending on the amount relative to a certain potential. Thus, "ground" and "GND" are each a potential lower than the VDD; for example, they may be a ground potential or 0 V, and are not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference. The circuit 101 is electrically connected to a power supply line that supplies the VDD and a power supply line that supplies the GND.

An output terminal of the circuit 30 is connected to an input terminal of the circuit 30 in a next stage. An output terminal of the circuit 30 in an n-th stage is electrically connected to an input terminal of the circuit 30 in a first stage and an input terminal of the circuit 30 in an (n+1)-th stage. The circuit 30 includes a circuit 41. The circuit 41 has functions of transmitting an input signal from an input terminal of the circuit 30 to an output terminal of the circuit 30 and inverting the potential level of the input signal. In a signal transmission path of the circuit 41, an inverter (NOT gate circuit) is provided.

Hereinafter, the circuit 30 in the first stage is referred to as a circuit 30[1] in some cases, and the same applies to the circuits 30 in other stages and other components.

A circuit 11 includes n circuits 30 that are electrically connected in a ring shape, and can operate as a ring oscillator circuit. A node ND 11 is an output node of the circuit 11.

The circuit 80 has a function of changing the potential level of an input signal of an input terminal A. The circuit 80 can be a level shift circuit, for example. A signal whose potential level is reverse to that of the input signal of the terminal A is input to a terminal/A. In the circuit 101, the circuit 80 can perform level shift operation in which respective amplitudes of the input signals of the input terminal A and the terminal/A are increased. Furthermore, in an example in FIG. 1, a signal that is obtained by level-shifting the input signal of the input terminal A is output from an output terminal of the circuit 80. The circuit 30[n+1] is provided so as to generate an inversion signal rob11 of a signal ro11.

The circuit 90 has a function of generating a power supply potential of the circuit 80.

The buffer circuit 81 has a function of amplifying an output current of the circuit 80. The buffer circuit 81 is provided as appropriate.

[Circuit 30]

Figure 2:
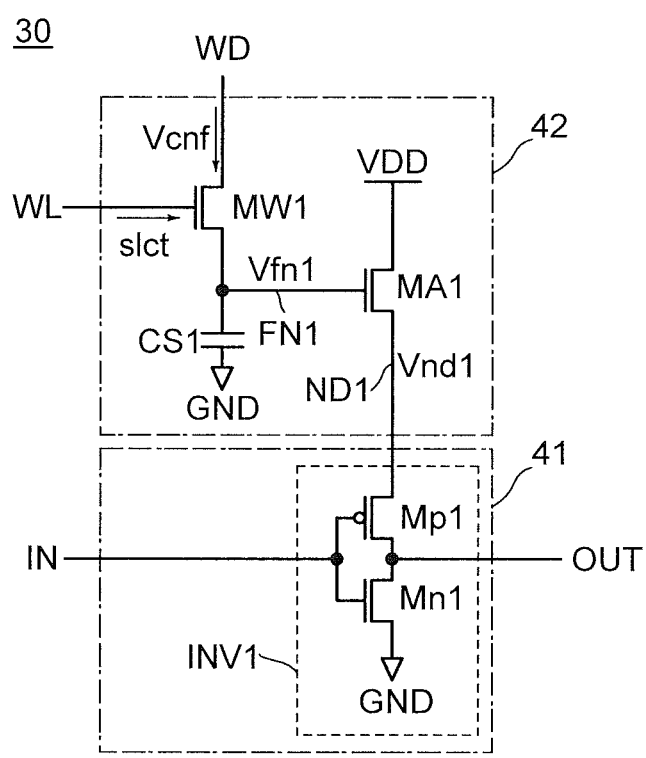
FIG. 2 is a circuit diagram showing a configuration example of a circuit.

FIG. 2 is a circuit diagram illustrating a configuration example of the circuit 30. The circuit 30 includes the circuit 41 and a circuit 42.

The circuit 41 includes an inverter INV1. Here, the INV1 is a CMOS inverter including a transistor Mp1 and a transistor Mn1. The INV1 can be formed only including n-channel transistors or p-channel transistors. A source of the transistor Mn1 can function as a node to which a low power supply potential is supplied. Here, the source of the transistor Mn1 is electrically connected to a power supply line to which a GND is supplied. A source of the transistor Mp1 can function as a node to which a high power supply potential is supplied. Here, the source of the transistor Mn1 is electrically connected to a node ND1 of the circuit 42. An output node of the INV1 is electrically connected to an input node of the INV1 of the circuit 30 in the next stage.

The circuit 42 has a function of controlling the high power supply potential of the INV1. The circuit 42 includes a transistor MW1, a transistor MA1 and a capacitor CS1. A VDD is input to a drain of the transistor MA1. The drain of the transistor MA1 is electrically connected to the source of the transistor Mp1. The source of the transistor MA1 is referred to as the node ND1. The node ND1 can function as an output node of the circuit 42. A potential Vnd1 of the node ND1 is supplied to the INV1 as a high power supply potential. A gate of the transistor MA1 is electrically connected to a node FN1. A gate voltage of the transistor MA1 can be changed by a potential Vfn1 of the node FN1, so that the potential Vnd1 can be changed by the potential Vfn1. As described below, the output potential Vnd1 of the circuit 42 can be changed by the potential Vcnf.

In the circuit 42, a circuit block including the transistor MW1, the capacitor CS1, and the node FN1 has a function of holding an analog potential corresponding to the potential Vcnf. The node FN1 is a data holding portion in which the analog potential can be held. The capacitor CS1 can function as a storage capacitor that holds the potential Vfn1 of the node FN1. The transistor MW1 can function as a writing transistor. A gate of the transistor MW1 is electrically connected to the wiring WL, and the conduction state thereof is controlled by the signal slct.

When the transistor MW1 is turned on, a potential corresponding to the potential Vcnf is written to the node FN1. That is, the potential Vfn1 is also an analog potential. Then, when the transistor MW1 is turned off, the node FN1 is electrically floating and the circuit 42 is in a state of holding the potential Vfn1. In order to suppress a change in the potential Vfn1, it is preferable that the transistor MW1 have an extremely low off-state current. In other words, it is preferable that the off-state resistance of the transistor MW1 be high.

Extremely low off-state current means that off-state current per micrometer of the channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm), more preferably lower than or equal to 10 yA/μm (y represents yocto and denotes a factor of $10^{-24}$).

In order to make the off-state current of the transistor extremely low, a channel of the transistor is formed in a semiconductor whose bandgap is wide, for example, a semiconductor whose band gap is greater than or equal to 3.0 eV. As an example of such a semiconductor, an oxide semiconductor containing a metal oxide can be given. A transistor including an oxide semiconductor in its channel (hereinafter also referred to as an OS transistor) has low leakage current due to thermal excitation and extremely low off-state current.

An oxide semiconductor of an OS transistor preferably contains at least one of indium (In) and zinc (Zn). Typical examples of the oxide semiconductor of the OS transistor include In—Ga—Zn oxide and In—Sn—Zn oxide. By reducing impurities serving as electron donors, such as moisture or hydrogen, and also reducing oxygen vacancies, an i-type (intrinsic) or a substantially i-type oxide semiconductor can be obtained. Here, such an oxide semiconductor is referred to as a highly purified oxide semiconductor. By forming the channel using a highly purified oxide semiconductor, the off-state current of the OS transistor that is normalized by channel width can be as low as several yoctoamperes per micrometer to several zeptoamperes per micrometer. Note that the oxide semiconductor and the OS transistor are described in detail in Embodiment 4.

Unless otherwise specified, the off-state current in this specification refers to a drain current of a transistor in the off state (also referred to as non-conduction state and cutoff state). Unless otherwise specified, the off state of an n-channel transistor means that a potential difference (Vgs) between its gate and source is lower than the threshold voltage (Vth), and the off state of a p-channel transistor means that Vgs is higher than Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, "the off-state current of a transistor is smaller than or equal to I" means "there is Vgs with which the off-state current of a transistor becomes smaller than or equal to I" in some cases. Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value for the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required of a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may mean that there is Vgs at which the off-state current of a transistor is lower than or equal to I at room temperature, 60° C., 85° C., 95° C., 125° C., a temperature at which the reliability required of a semiconductor device or the like including the transistor is ensured, or a temperature at which the semiconductor device or the like including the transistor is used (e.g., temperature in the range of 5° C. to 35° C.).

The off-state current of a transistor depends on a voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the reliability of a semiconductor device or the like including the transistor is ensured or at Vds at which the semiconductor device or the like including the transistor is used. The description "an off-state current of a transistor is lower than or equal to I" may mean that there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, at Vds at which the reliability of a semiconductor device or the like including the transistor is ensured, or at Vds at which in the semiconductor device or the like including the transistor is used.

In the above description of an off-state current, a drain may be replaced with a source. That is, the off-state current sometimes refers to a current that flows through a source of a transistor in the off state.

In this specification, the term "leakage current" sometimes expresses the same meaning as an off-state current.

In this specification, the off-state current sometimes refers to a current that flows between a source and a drain when a transistor is off, for example.

The threshold voltage of the transistor MA1 is denoted by $Vth_{A1}$. The VDD is input to the drain of the transistor MA1, and the source of the transistor MA1 corresponds to the output node ND1. Thus, the transistor MA1 can perform source follower operation in which the output potential Vnd1 (source potential) follows the input potential (Vfn1). When $VDD>(Vfn1-Vth_{A1})$, the maximum value of the potential Vnd1 is $(Vfn1-Vth_{A1})$. That is, the output potential Vnd1 in the circuit 42 can be controlled by the potential Vcnf. Thus, the delay time of the INV1 can be controlled by the potential Vnd1 of the node ND1. Furthermore, the amplitude of an output signal of the INV1 is changed by the potential Vnd1. As the Vnd1 is increased, the delay time of the INV1 is shortened; thus, the oscillation frequency $f_{VCO}$ of the output signal ro11 of the circuit 11 is increased, and the amplitude of the output signal ro11 is increased. The Vnd1 is controlled by the potential Vcnf that is input to the wiring WD. Therefore, the delay time and the amplitude of the output signal ro11 of the circuit 11 can be changed by the potential Vcnf.

When the potential of the input terminal of the INV1 is the GND, the transistor Mp1 is turned on and the potential Vnd1 of the node ND1 is decreased. Because the node FN1 and the node ND1 are capacitively coupled by the gate capacitance of the transistor MA1, the Vfn1 is decreased when the Vnd1 is decreased. To suppress the change in the Vfn1 due to the decrease in the Vnd1, the capacitance of the capacitor CS1 is desirably larger than the gate capacitance of the transistor MA1. When the Vnd1 is decreased, the potential between the gate and the source of the transistor MA1 is increased, and the transistor MA1 is turned on. Thus, the node ND1 is immediately charged by the VDD, leading to an increase in the Vnd1.

As described above, it is possible to change the oscillation frequency $f_{VCO}$ of the output signal ro11 of the circuit 11 in response to the change in the Vfn1; however, the amplitude of the output signal ro11 is also changed. Thus, in order to make the amplitude of the signal $S_{VCO}$ constant regardless of the Vfn1, it is effective to provide the circuit 80 at an output stage of the circuit 101.

The circuit 90 is provided so as to supply a potential that is at the same level as the potential Vnd1 of the node ND1 of the circuit 30[n] to the circuit 80. The circuit 90 includes a transistor MW9, a transistor MA9, a capacitor CS9, and a node FN9. The configuration and the operation of the circuit 90 are similar to those of the circuit 42; thus, the description of the circuit 42 is referred to.

Figure 3:
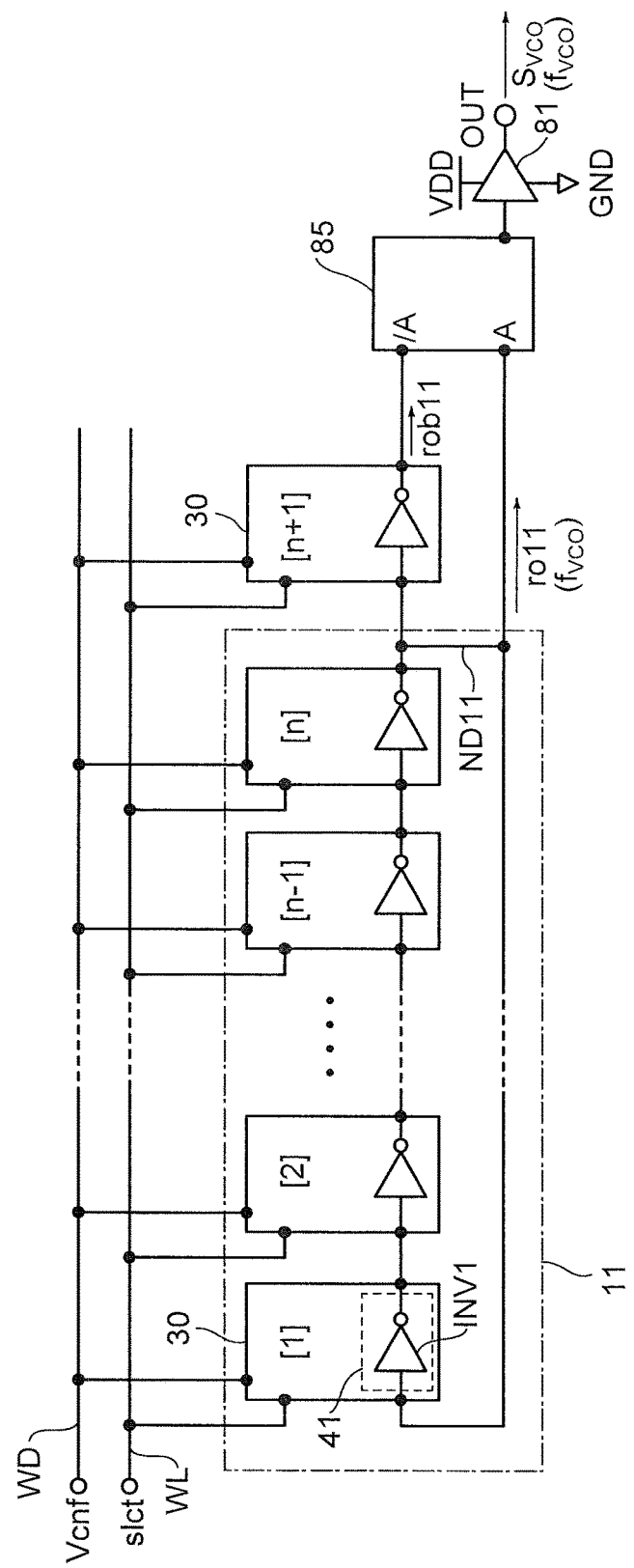
FIG. 3 is a block diagram showing a configuration example of a circuit.

The circuit 90 is not necessarily provided depending on the circuit configuration of the circuit 80. FIG. 3 shows a configuration example of such an oscillator circuit. A circuit 100 in FIG. 3 is a modification example of the circuit 101, and a circuit 85 is provided instead of the circuit 80 and the circuit 90. The circuit 85 has a function similar to that of the circuit 80. The circuit 85 can perform level shift operation in which the amplitudes of input signals of a terminal A and a terminal/A are increased. In the example in FIG. 3, a signal obtained by level-shifting the input signal of the input terminal A is output from an output terminal of the circuit 85. The circuit 85 is a circuit that can perform level shift operation even when a potential that is at the same level as the potential of the node ND1 of the circuit 30[n] is not supplied. Configuration examples of the circuit 80 and the circuit 85 are described in Embodiment 3.

<<Operation Example 1 of Oscillator Circuit>>

Figure 4:
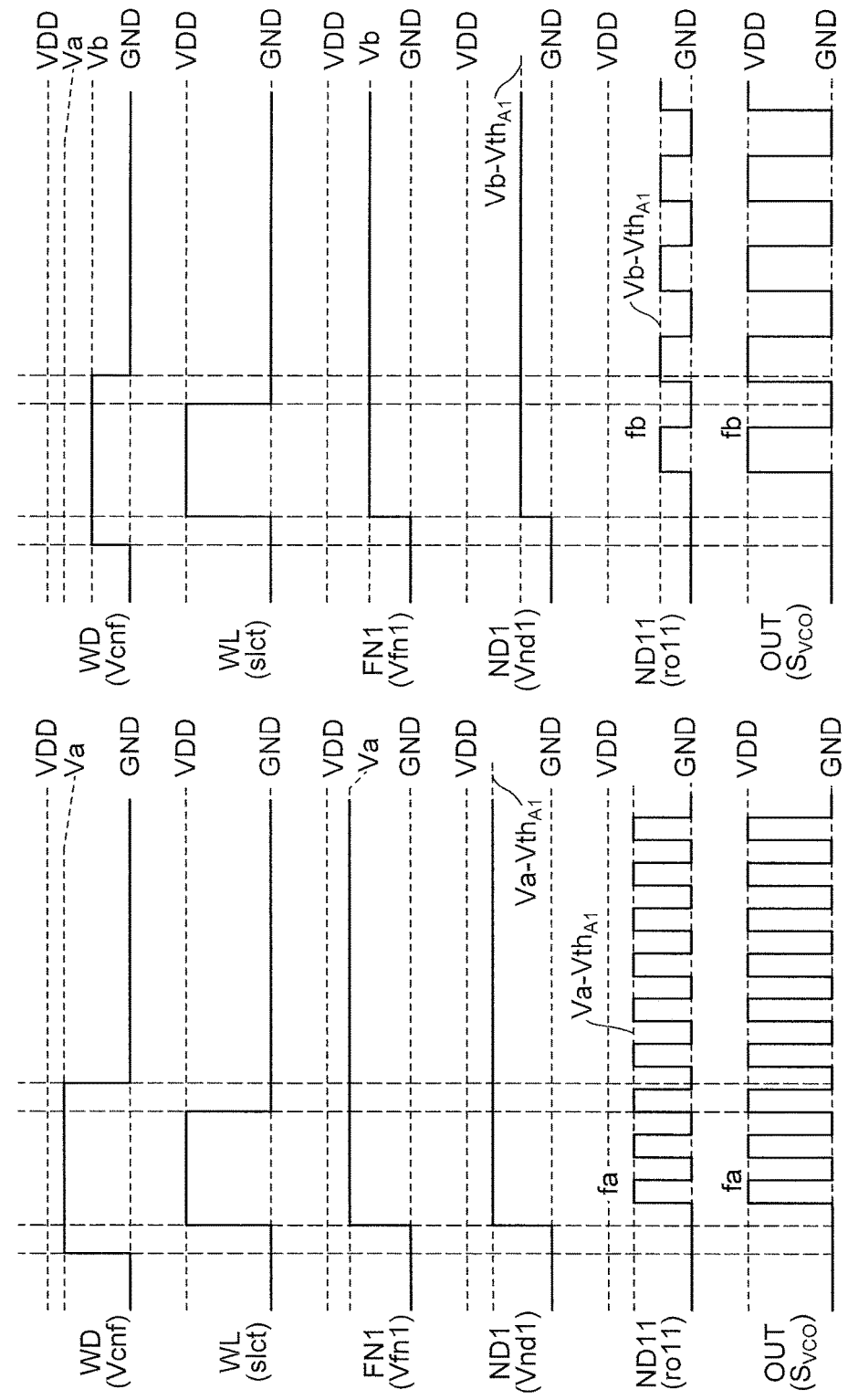
FIGS. 4A and 4B are timing charts showing operation examples of a circuit.

Operation examples of the circuit 101 shown in FIG. 1 are described. FIGS. 4A and 4B are timing charts showing the operation examples of the circuit 101. The potential Vcnf of the wiring WD is Va in FIG. 4A and Vb in FIG. 4B. Note that a relation of VDD>Va>Bb>GND is satisfied.

(Vcnf=Va)

As shown in FIG. 4A, in a period where the Vcnf is a GND, the signal $S_{VCO}$ does not oscillate. In order to make the signal $S_{VCO}$ oscillate, supply of Va to the wiring WD is started. In a period where the wiring WD is at the Va, the VDD is supplied to the wiring WL. In all the circuits 30, the transistor MW1 is turned on, the analog potential Va is written to the node FN1, and the potential Vnd1 of the node ND1 becomes (Va−Vth$_{A1}$). The potential of the wiring WL is set to the GND after setting it to the VDD in a certain period. In all the circuits 30, the analog potential Va is held by turning off the transistor MW1.

When the potential of the node FN1 is set to the Va, the circuit 101 starts to output the signal $S_{VCO}$ at an oscillation frequency of fa. Since the potential of the node ND1 is (Va−Vth$_{A1}$), the amplitude of the output signal ro11 of the circuit 11 becomes (Va−Vth$_{A1}$−GND). The circuit 80 performs level shift operation in which the high level potential of the signal ro11 is converted into the VDD. The circuit 101 oscillates at a frequency fa that is the same frequency as that of the signal ro11, and outputs the signal $S_{VCO}$ at an amplitude of (VDD−GND).

(Vcnf=Vb)

As shown in FIG. 4B, the operation of the circuit 101 is similar to that in FIG. 4A. Because Vcnf is Vb, the potential of the node ND1 is (Vb−Vth$_{A1}$). The signal ro11 oscillates at a frequency fb that is lower than the fa. The circuit 101 oscillates at the frequency of fb and outputs the signal $S_{VCO}$ at an amplitude of (VDD−GND).

As shown in FIGS. 4A and 4B in the circuit 101, the oscillation frequency $f_{VCO}$ of the signal $S_{VCO}$ can be controlled by the potential Vcnf, and the amplitude of the signal $S_{VCO}$ can be constant without being affected by the potential Vcnf. That is, the circuit 101 can oscillate at a stable amplitude and a desired frequency.

The circuit 42 has a function of storing analog data for setting the high power supply potential that is supplied to the inverter INV1. In other words, the circuit 42 has a function of storing analog data for setting the delay time of the INV1. Specifically, the analog data stored in the circuit 42 is the analog potential Vcnf input from the wiring WD. When a transistor with low off-state current is used as the transistor MW1, the circuit 42 can hold the potential Vfn1 of the node FN1 for a long period. The holding of the potential Vfn1 corresponding to the analog potential Vcnf in the circuit 42 means setting of the oscillation frequency $S_{VCO}$ of the circuit 101, which is tuning operation of the circuit 101. Accordingly, the circuit 42 can function as a nonvolatile memory in which data (analog data) of the Vfn1 is stored, so that writing operation of the analog potential Vcnf is not required every time the circuit 101 is started up and oscillation at a predetermined frequency is possible without delay.

For example, in the case of a PLL in which the circuit 101 is incorporated, after the circuit 101 is tuned so that the PLL oscillates at a desired frequency, the circuit 101 can output a signal at a predetermined frequency even when power of peripheral circuits other than the circuit 101 is turned off. Furthermore, when the PLL is restarted after the power of the whole PLL is shut off, the PLL can instantly output a signal which oscillates at a frequency similar to the frequency used before the power shutdown even without performing the tuning of the circuit 101. With the use of the circuit 101 in this manner, a PLL capable of quick restarting can be provided.

<<Configuration Examples 2 and 3 of Oscillator Circuit>>

Figure 5:
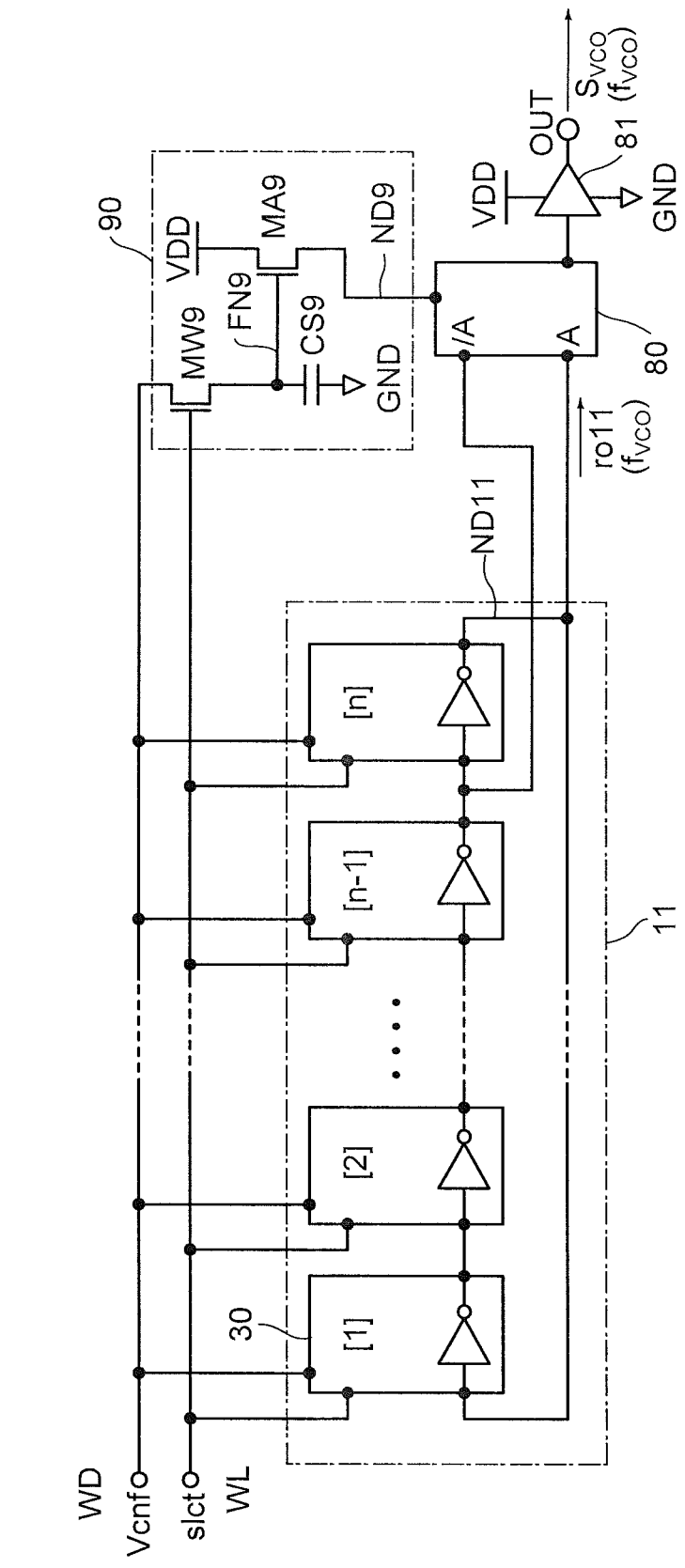
FIG. 5 is a block diagram showing a configuration example of a circuit.
Figure 6:
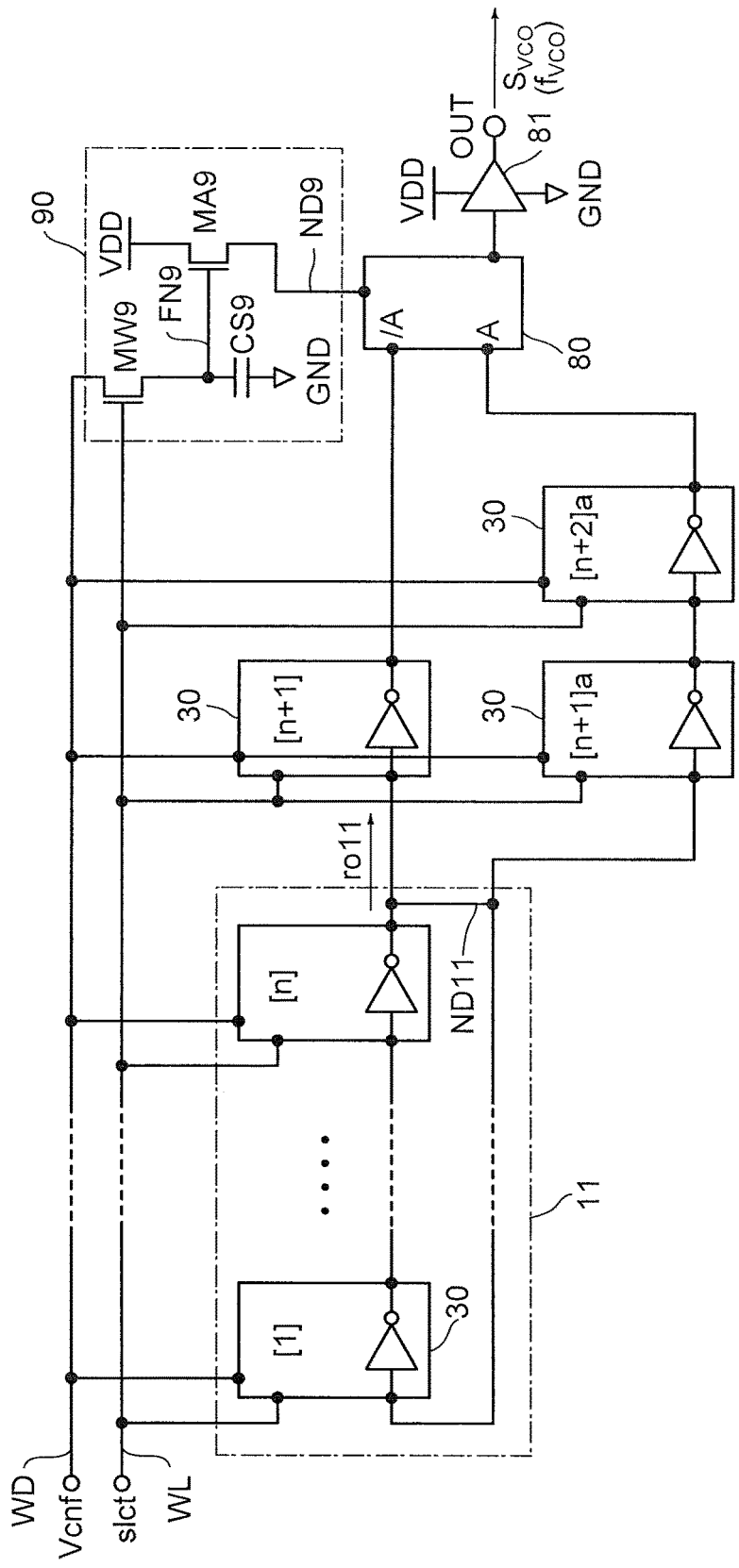
FIG. 6 is a block diagram showing a configuration example of a circuit.

FIG. 5 and FIG. 6 show modification examples of the circuit 101.

In the circuit 101 in FIG. 1, an output signal of the circuit 30[n+1] is input to the input terminal/A of the circuit 80. In contrast, the circuit 30[n+1] is not provided for a circuit 102 in FIG. 5. In the circuit 102, an output signal of a circuit 30[n−1] is input to the input terminal/A of the circuit 80.

The output signal of the circuit 30[n−1] is used for driving the circuit 30[n] and the circuit 80. An output signal of the circuit 30[n] is used for driving the circuit 30[1] and the circuit 80. Loads on output nodes of the circuit 30[n−1] and the circuit 30[n] can be equal to each other. A delay between the input signals of the terminal A and the terminal/A of the circuit 80 hardly occurs, so that performance of the circuit 80 is not lowered. This applies to the circuit 103 in FIG. 6.

In the circuit 103 in FIG. 6, a circuit 30 in the (n+1)a-th stage and a circuit 30 in the (n+2)a-th stage are added in an output path of the circuit 11. Accordingly, loads on output nodes of the circuit 30[n+1] and the circuit 30 [n+2)]a can be equal to each other. Thus, it hardly allows a delay to be caused between the input signals of the terminal A and the terminal/A of the circuit 80.

There is no particular limitation on the circuit 80 as long as the level shift operation of the signal ro11 that is oscillated in the circuit 11 is possible. For example, the output signal of the circuit 11 (the circuit 30[n]) or a signal obtained by delaying the output signal of the circuit 11 with the k-stage-circuits 30 (k is one or two) can be input to the input terminal A of the circuit 80. An output terminal of any one of the circuits 30 is electrically connected to the input terminal/A of the circuit 80 so that an inverted signal of the input signal of the input terminal A is input to the input terminal/A.

<<Configuration Example 4 of Oscillator Circuit>>

Figure 7A:
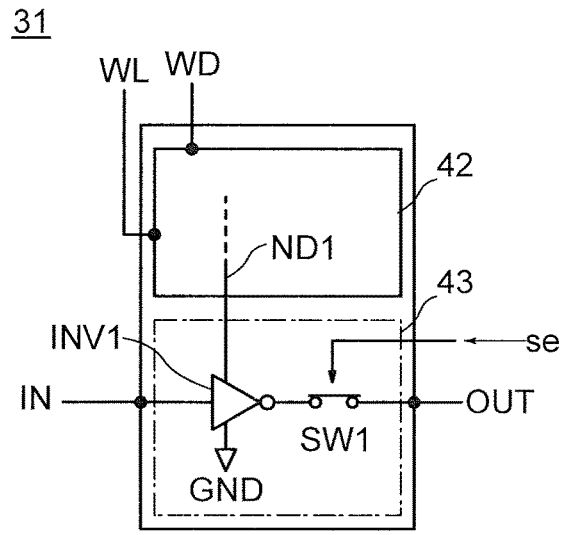
FIGS. 7A and 7B are a block diagram and a circuit diagram each showing a configuration example of a circuit.
Figure 7B:
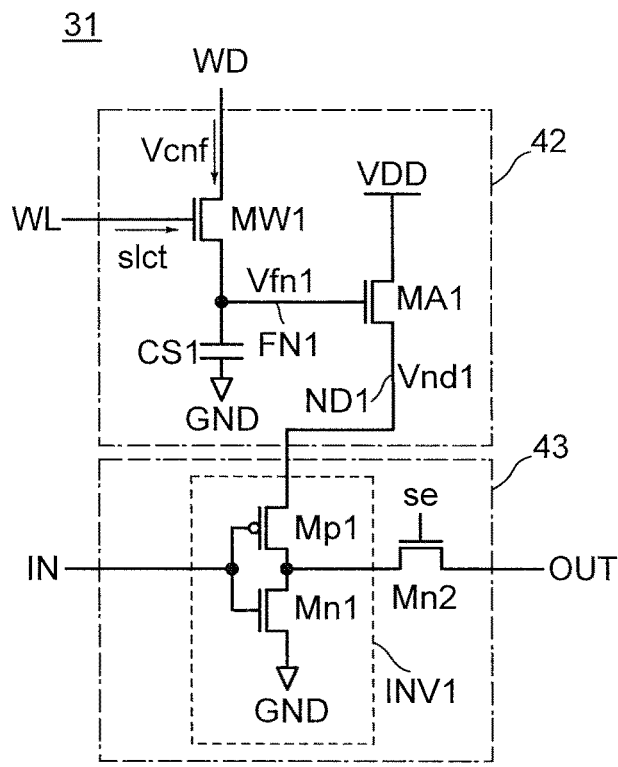

FIGS. 7A and 7B show a modification example of the circuit 30 in FIG. 2.

In a circuit 31 in FIG. 7A, a circuit 43 is provided instead of the circuit 41. In the circuit 43, a switch SW1 is connected to an output terminal of the INV1. The switch SW1 has a function of controlling the conduction state between output terminals of the INV1 and the circuit 43. A signal se is a signal for controlling operation of the switch SW1.

FIG. 7B illustrates an example of a specific circuit configuration of the circuit 43. FIG. 7B illustrates an example in which a transistor Mn2 is used as the switch SW1. The signal se is input to a gate of the transistor Mn2. Instead of the transistor Mn2, a p-channel transistor may be used as the switch SW1.

(Operation Example)

FIG. 9 illustrates an operation example of the circuit 101 in which the circuit 31 is used.

Also in FIG. 9, similarly to FIG. 4A, an example in which the potential Vcnf is set to Va is shown. The signal se is set to a low level in a period where writing operation of an analog potential into the circuit 31 is performed, so that the node ND11 does not oscillate. When the signal se is set to a high level, the circuit 11 functions as a ring oscillator circuit and starts oscillation. The signal $S_{VCO}$ at an oscillation frequency fa and an amplitude of (VDD−GND) is output from an output terminal OUT of the circuit 101. That is, in the circuit 101 including the circuit 31, the start of the oscillation can be controlled by the signal se. The circuits 100, 102, and 103 in each of which the circuit 31 is used can operate in a manner similar to that of the circuit 101.

<<Configuration Example 5 of Oscillator Circuit>>

Figure 8A:
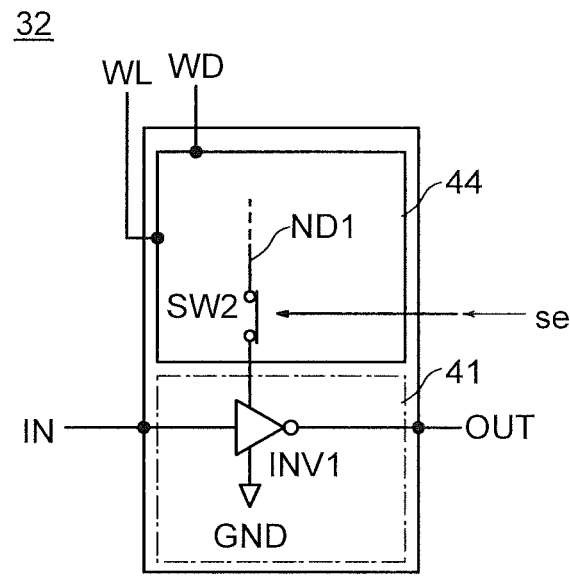
FIGS. 8A and 8B are a block diagram and a circuit diagram each showing a configuration example of a circuit.
Figure 8B:
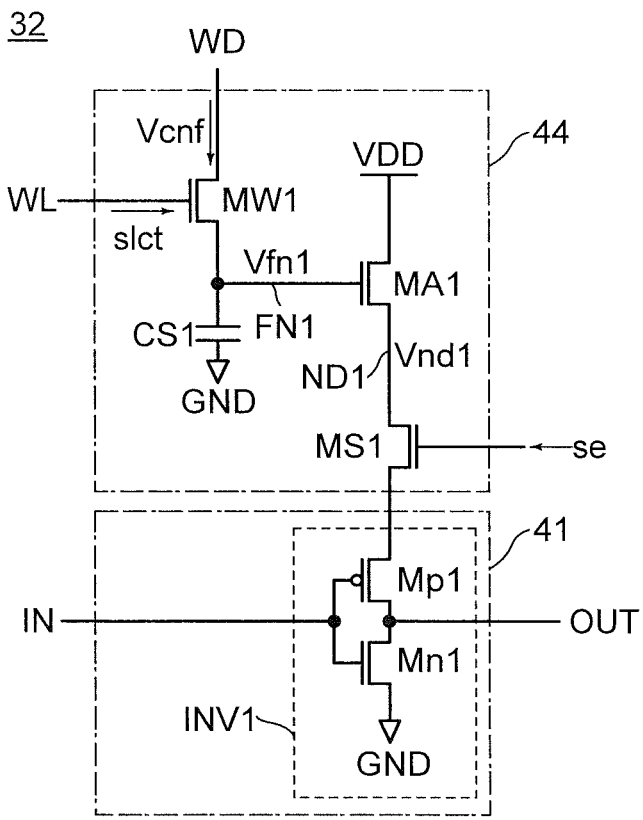

FIGS. 8A and 8B illustrate a configuration example of the circuit 30 (FIG. 2).

A circuit 32 in FIG. 8A is provided with a circuit 44 instead of the circuit 42. The circuit 44 is the one in which a switch SW2 is added to the circuit 42. The switch SW2 has a function of controlling the conduction state between the node ND1 and the input node of the high power supply potential of the INV1. The signal se is a signal for controlling the operation of the switch SW2.

FIG. 8B illustrates an example of a specific circuit configuration of the circuit 32. In FIG. 8B, a transistor MS1 is used as the switch SW2. Instead of the transistor MS1, a p-channel transistor may be used as the switch SW2. The circuit 44 in FIG. 8B has a circuit configuration similar to that of a three-transistor gain cell. In contrast, the circuit 42 that is used in the circuit and the circuit 31 has a circuit configuration similar to that of a two-transistor gain cell.

<Operation Example>

The circuit 101 in which the circuit 32 is used can operate in accordance with the timing chart in FIG. 9. The circuits 100, 102, and 103 in each of which the circuit 32 is used can also operate in a manner to that of the circuit 101. That is, in each of the circuits 100, 102, and 103 in which the circuit 32 is used, the oscillation operation can be stopped by the signal se regardless of the value of Vfn1 of the circuit 32.

<Another Configuration Example of Circuit 90>

Figure 10:
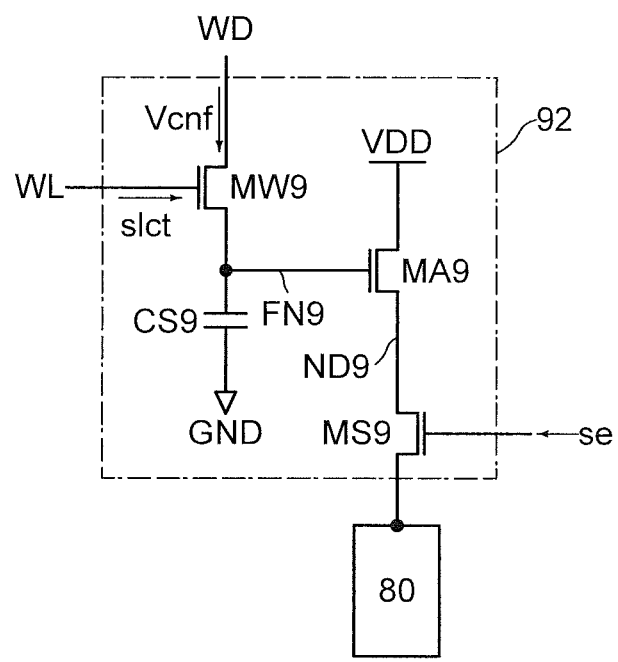
FIG. 10 is a circuit diagram showing a configuration example of a circuit.

In the oscillator circuit including the circuit 31 or the circuit 32 as described in the configuration example 4 or 5, a circuit 92 shown in FIG. 10 may be provided instead of the circuit 90. The circuit 92 is a circuit in which a transistor MS9 is added to the circuit 90. The transistor MS9 has a function of controlling the conduction state between the node ND9 and the input node of the circuit 80. The signal se is input to a gate of the transistor MS9. The supply of a potential from the circuit 92 to the circuit 80 can be stopped when the oscillation operation of the oscillator circuit is stopped by the signal se.

<<Configuration Example 6 of Oscillator Circuit>>

Figure 11:
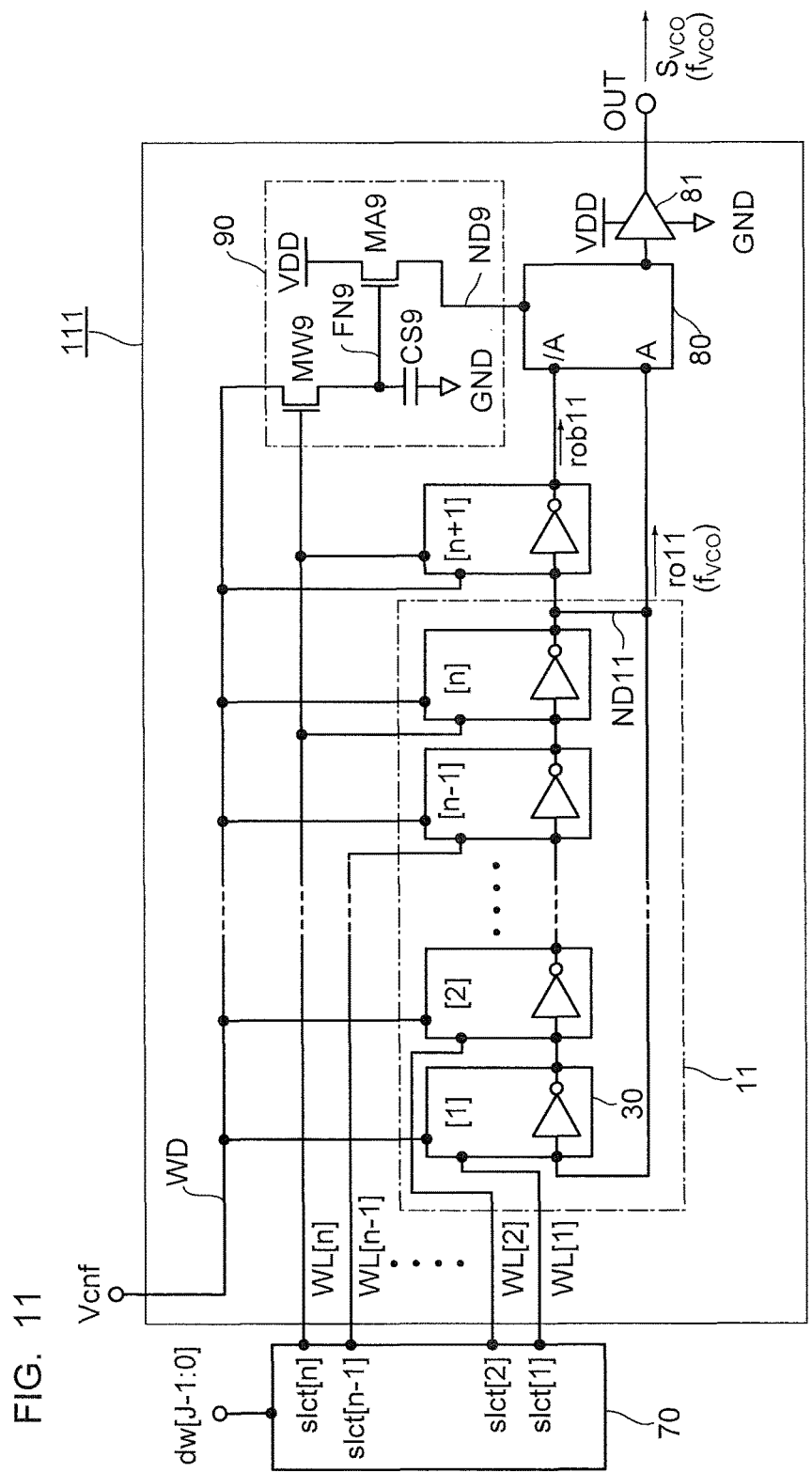
FIG. 11 is a block diagram showing a configuration example of a circuit.

FIG. 11 is a modification example of the circuit 101 (FIG. 1). In the circuit 101, a common signal slct is input to all the circuits 30; thus, timing of writing operation of the potential Vcnf is the same in all the circuits 30. In contrast, in a circuit 111 in FIG. 11, signals slct which are different from one another can be input to the n circuits 30 included in the circuit 11. In the circuit 111, n wirings WL are provided corresponding to the first- to n-th-stage circuits 30. The (n+1)-th stage circuit 30 and the circuit 90 are electrically connected to the wiring WL[n].

(Circuit 70)

The n wirings WL are electrically connected to a circuit 70. The circuit 70 has a function of generating n signals slct. The circuit 70 has a function of setting one of the signals slct[1] to slct[n] to a high level and the other signals to a low level. Such signals slct[1] to slct[n] are supplied to the circuit 111, so that one of the n circuits 30 can be in a writing state of the potential Vcnf and the others can be in a holding state of the potential Vfn1.

Figure 12:
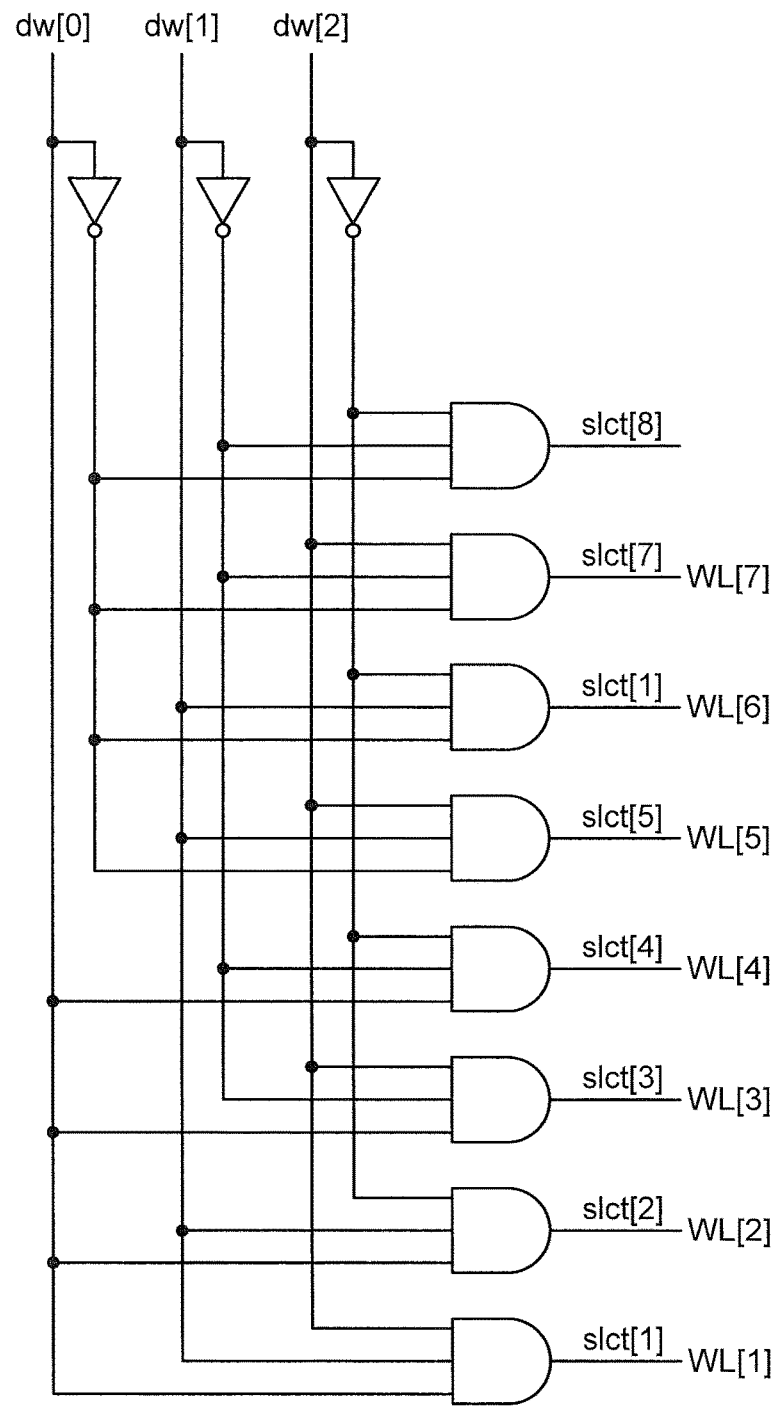
FIG. 12 is a circuit diagram showing a configuration example of a circuit.

The circuit 70 can be a decoder circuit for decoding a J-bit digital signal dw[J-1:0], for example. Note that J is an integer greater than or equal 2, which satisfies n<$2^j$. FIG. 12 illustrates a configuration example of a signal generation circuit that can be applied to the circuit 70. FIG. 12 illustrates a configuration example of the circuit 70 in the case where n=7 and J=3. The circuit 70 in FIG. 12 includes three inverters and eight AND circuits (AND gate circuits). To the circuit 70, 3-bit digital signal dw[2:0] is input. The circuit 70 decodes the signal dw[2:0] to generate eight signals slct[1] to slct[8]. The signals slct[1] to slct[7] are output to the wirings WL[1] to WL[7]. The signal slct[8] is a signal which is not used.

<Operation Example>

Figure 13:
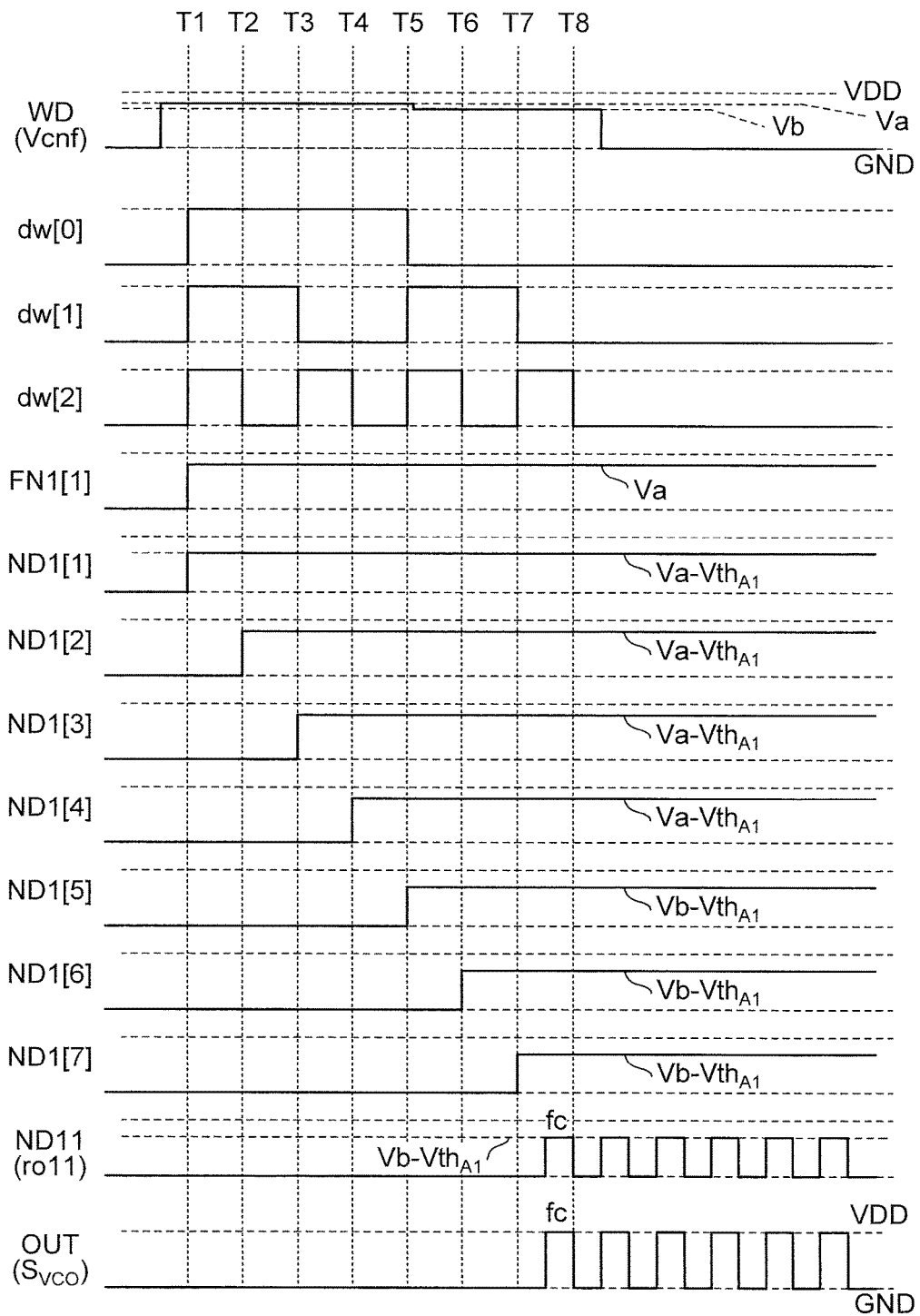
FIG. 13 is a timing chart showing an operation example of a circuit.

An operation example of the circuit 111 in which the circuit 70 shown in FIG. 12 is used is described. FIG. 13 is a timing chart illustrating the operation example of the circuit 111 when n=7 and J=3.

The waveform maximum potential and the waveform minimum potential in FIG. 13 are a VDD and a GND, respectively. Here, the $f_{VCO}$ is fa at the time when the potentials Vfn1 of all the nodes FN1 in the circuit 11 are Va, and the $f_{VCO}$ is fb at the time when the potentials Vfn1 of all the nodes FN1 are Vb. Note that relations of VDD>Va>Vb>GND and fa>fb are satisfied. FIG. 13 illustrates an example in which, by tuning operation, an analog potential Va is written to each of the nodes FN1 of the circuits 30[1] to 30[4] and an analog potential Vb is written to each of the nodes FN1 of the circuits 30[5] to 30[7] so that the circuit 111 oscillates at a frequency fc. Note that a relation of fa>fc>fb is satisfied.

As illustrated in FIG. 13, in a period during which the analog potential Va is supplied to the wiring WD, the wiring WL[1], the wiring WL[2], the wiring WL[3], and the wiring WL[4] are sequentially set at a high level. At time T1, a transistor MW1[1] is turned on. The potential Va is written to a node FN1[1] and the potential of a node ND1[1] becomes (Va−$Vth_{41}$). Similarly, at time T2, T3, and T4, the analog potential Va is written to each of nodes FN1[2], FN1[3], and FN1[4]. Each of the potentials of nodes ND1[2] to ND1[4] also becomes (Va−$Vth_{41}$).

In a period during which the analog potential Vb is supplied to the wiring WD, the wirings WL[5], WL[6], and WL[7] are sequentially set to a high level. At time T5, the potential levels of signals dw[0], dw[1], and dw[2] are changed. After that, the analog potential Vb is supplied to the wiring WD. The analog potential Vb is written to a node FN1 [5], and the potential of a node ND1[5] becomes (Vb−Vth$_{A1}$). Similarly, at time T6 and T7, Vb is written to each of a node FN1 [6] and a node FN1 [7]. Also at time T7, Vb is written to each of a node FN1 [8] and the node FN9. The potentials of nodes ND1[6] to ND1[8] each also becomes (Vb−Vth$_{A1}$).

After time T8, the nodes FN1[1] to FN1[8] and the node FN9 are electrically floating, and writing of the analog potential to all the circuits 30 and the circuit 90 is completed. At time T8, the circuit 111 starts to oscillate at the oscillation frequency fc. Since the potential of the node ND1 of the circuit 30[7] is (Vb−Vth$_{A1}$), the amplitude of the signal ro11 becomes (Vb−Vth$_{A1}$−GND). The signal ro11 is boosted by the circuit 80 and the signal S$_{VCO}$ at an amplitude of (VDD−GND) and the oscillation frequency fc is output from the circuit 111.

In the example of FIG. 11, in the circuit 11, potentials of the nodes FN1 of the n-stage circuits 30 can be individually set, so that the oscillation frequency f$_{VCO}$ of the circuit 111 can be minutely set. Thus, the circuit 111 has higher controllability than the circuit 101.

In the circuit 111, in the case where the circuit 31 (FIGS. 7A and 7B) is provided instead of the circuit 30, the transistor Mn2 is brought out of conduction by the signal se until writing of the analog potential to all the circuits 31 is completed, and then after the completion of the writing, the transistor Mn2 is turned on by the signal se. For example, in the operation example in FIG. 13, the transistor Mn2 is turned on by the signal se after time T8, so that the signal S$_{VCO}$ at an amplitude of (VDD−GND) and the oscillation frequency fc is output from the circuit 111. The same applies to the case where the circuit 32 (FIG. 8) is provided instead of the circuit 30.

FIG. 11 illustrates the configuration example in which the circuit 111 does not include the circuit 70; however, the scope of this configuration example also includes an oscillator circuit including a circuit that can generate the signal slct.

Note that FIG. 13 illustrates an operation example in which the circuit 70 can generate the signals slct whose number is greater than the number of the wirings WL; however, the number of the signals slct generated in the circuit 70 may be less than the number of the wirings WD. That is, n can be greater than $2^J$. For example, in the case where J=3 and n=11, the signal slct[1] is input to the wirings WL[1] to WL[3], the signal slct[2] is input to the wirings WL[4] and WL[5], and the signals slct[3] to slct[8] are input to the wirings WL[6] to WL[11]. Also in such a case, the oscillation frequency f$_{VCO}$ can be minutely adjusted compared to the case of using the circuit 101.

Although the wirings WL as many as the circuits 30 included in the circuit 11 are provided in the example in FIG. 11, the configuration example is not limited thereto. The number of the wirings WL can be greater than two and less than n. When n=11 and the number of the wirings WL is f$_{OUT}$, the circuits 30[1] to 30[3], the circuits 30[3] to 30[6], the circuit 30[7], and the circuit 30[8] can be electrically connected to the wiring WL[1], the wiring WL[2], the wiring WL[3], and the wiring WL[4], respectively.

(Circuit 71)

Figure 14:
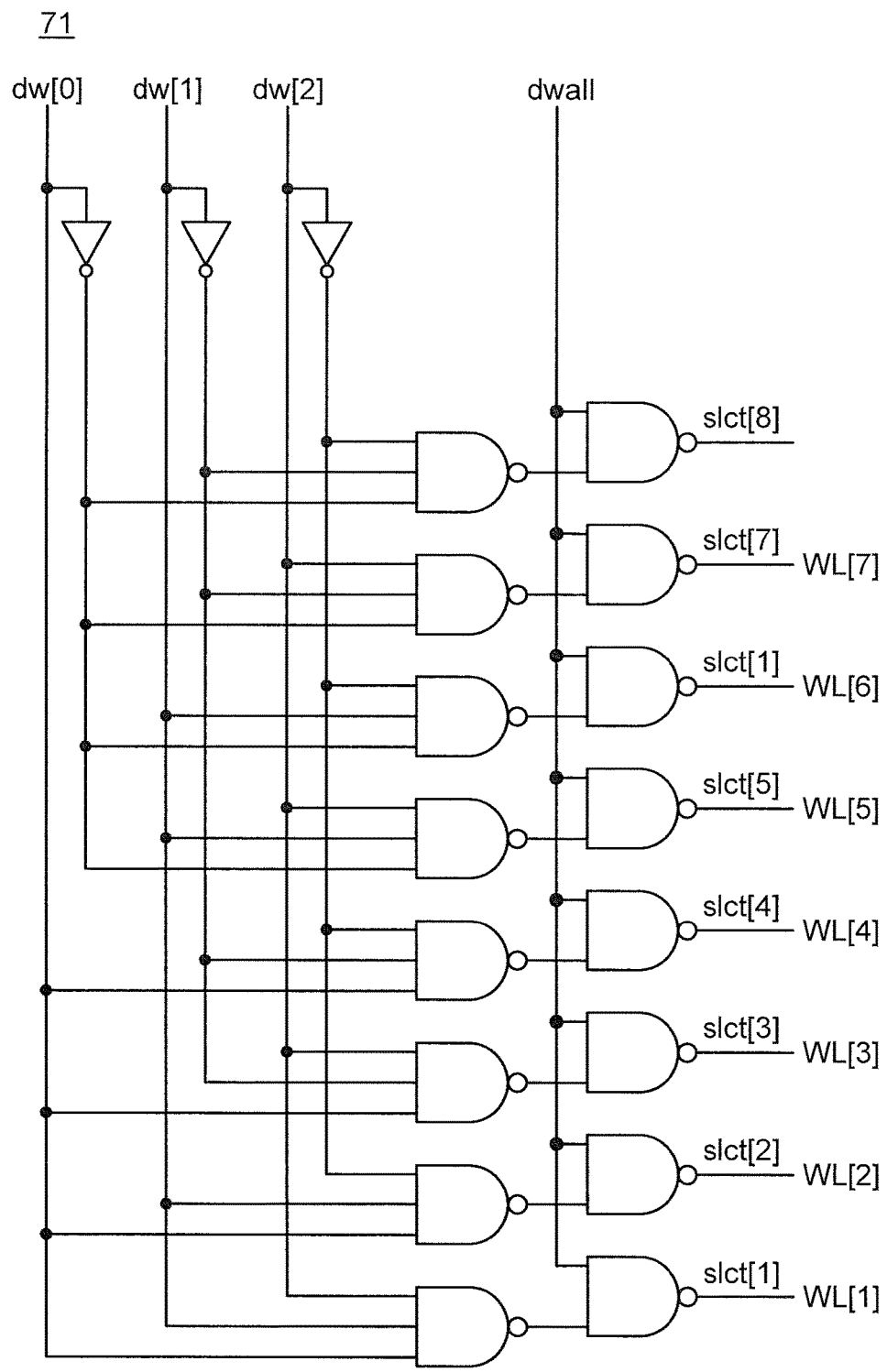
FIG. 14 is a circuit diagram showing a configuration example of a circuit.

A circuit 71 in FIG. 14 is a modification example of the circuit 70. The circuit 71 can also generate eight signals slct like the circuit 70. The circuit 71 includes three inverters, eight three-input NAND gate circuits, and eight two-input NAND gate circuits.

A three-bit digital signal dw[2:0] and a signal dwall are input to the circuit 71. The circuit 71 has a function of decoding the signal dw[2:0] to set any one of the signals slct[1] to slct[8] to a high level. The signal dwall has a function of setting the potential levels of the signals slct[1] to slct[8] to a high level regardless of the signal dw[2:0]. Specifically, when the signal dwall is a low level, the signals slct[1] to slct[8] become a high level regardless of the signal dw[2:0]. When the signal dwall is at a high level, any one of the signals slct[1] to slct[8] becomes a high level in accordance with the signal dw[2:0] and the others become a low level. With the use of the circuit 71, writing operation of the potential Vcnf to all the circuits 30 in the circuit 111 becomes possible at the same timing.

<<Configuration Example 7 of Oscillator Circuit>>

Figure 15:
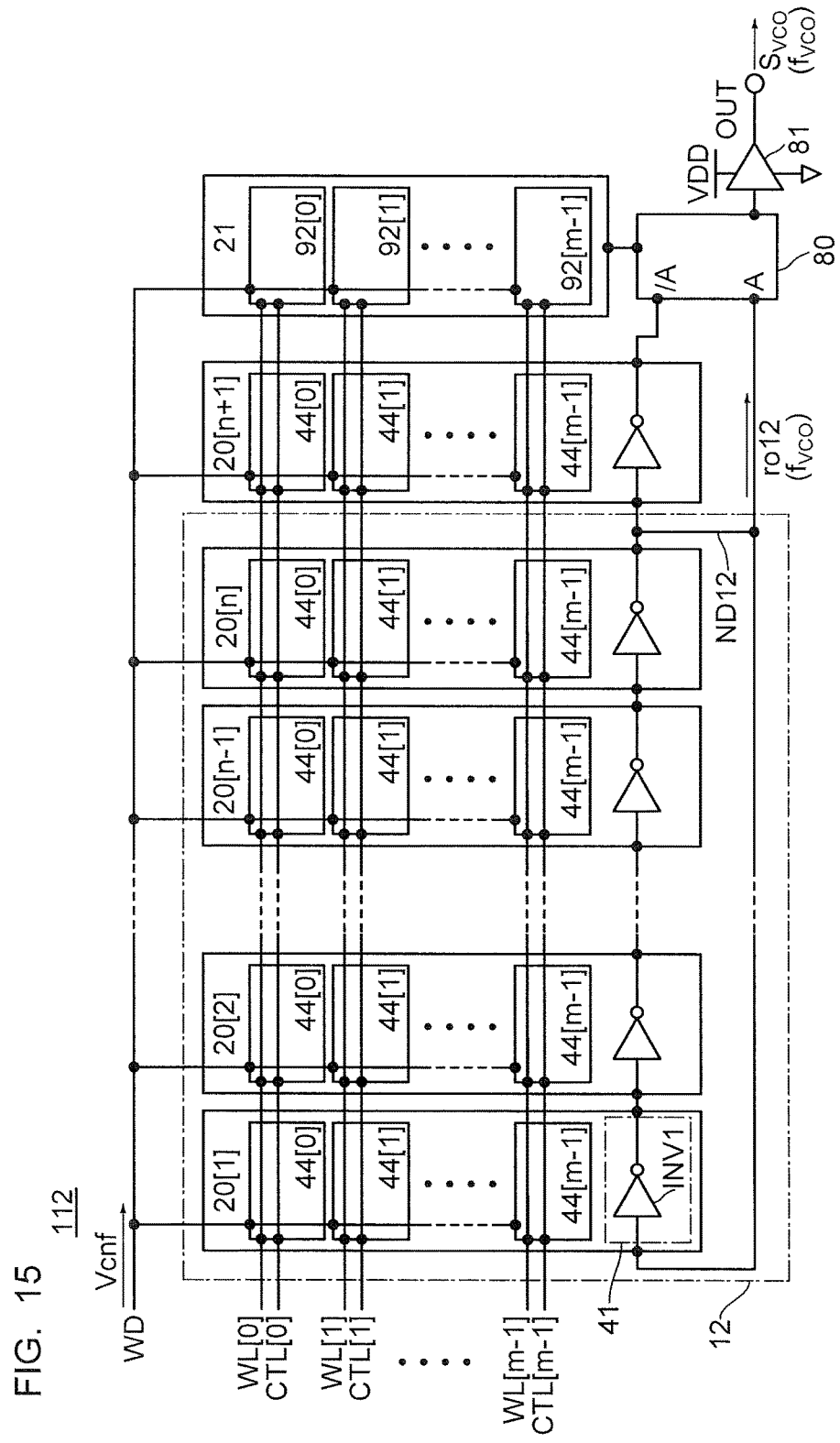
FIG. 15 is a block diagram showing a configuration example of a circuit.
Figure 16:
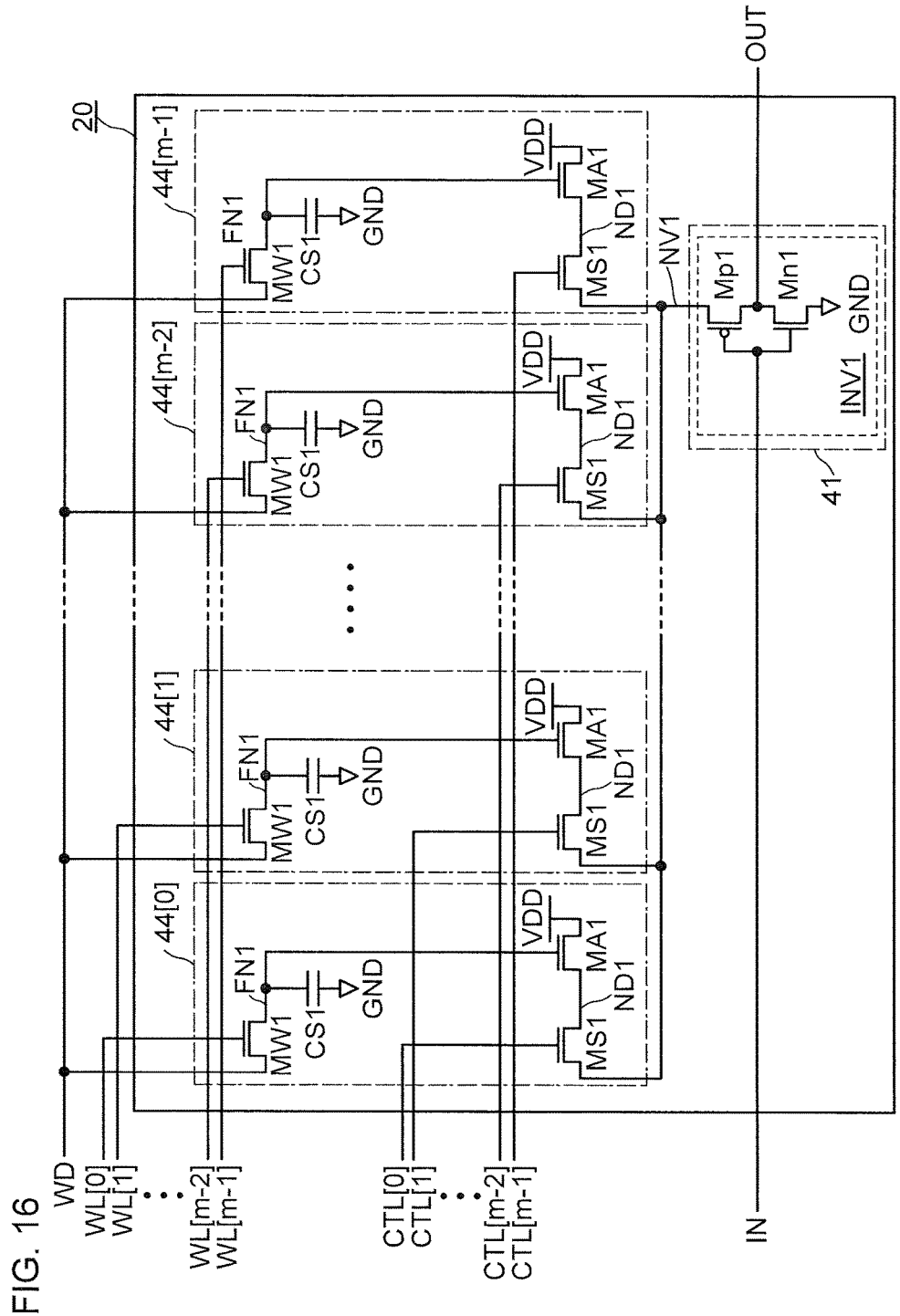
FIG. 16 is a block diagram showing a configuration example of a circuit.
Figure 17:
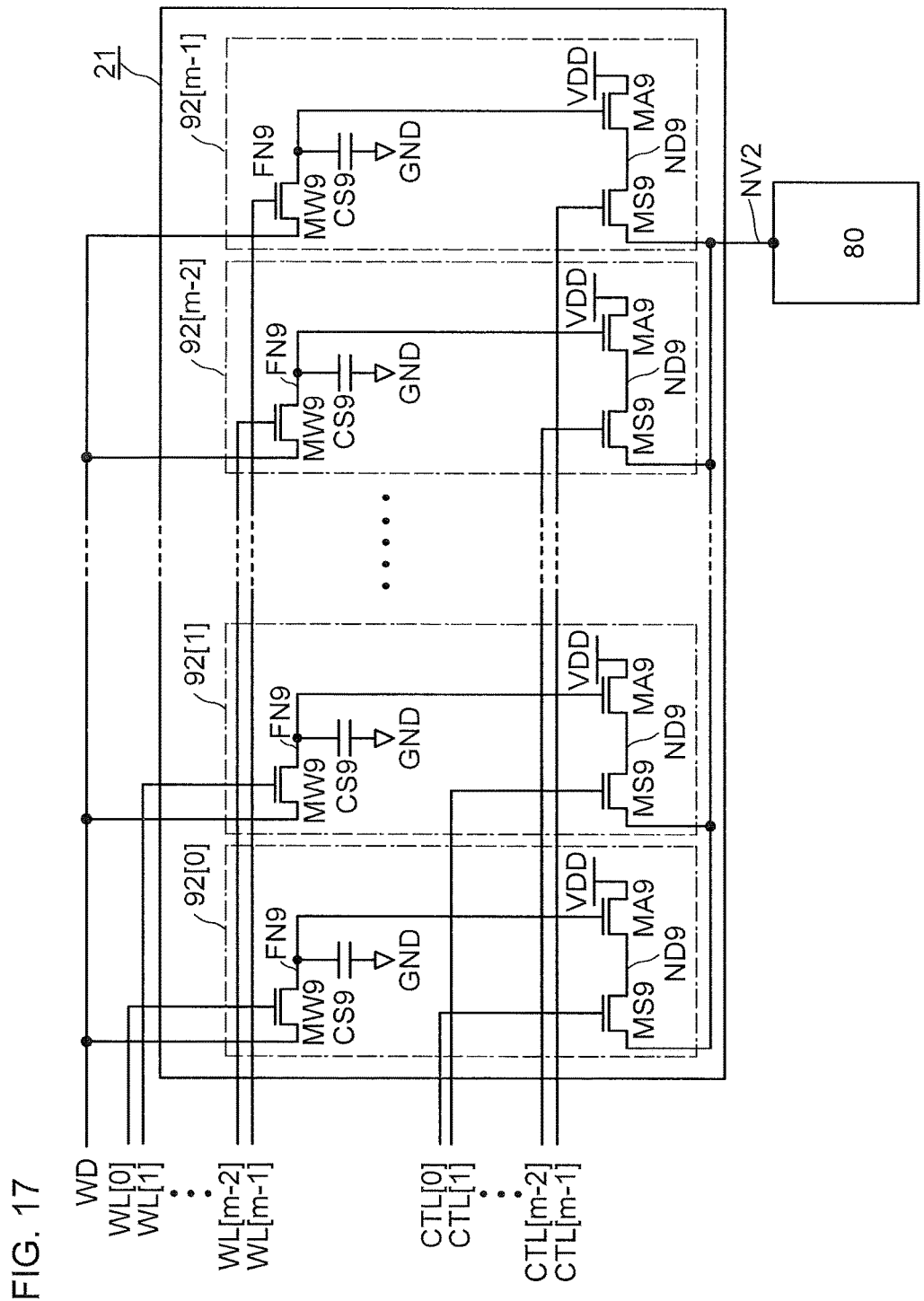
FIG. 17 is a block diagram showing a configuration example of a circuit.

FIG. 15 illustrates a configuration example of an oscillator circuit. A circuit 112 in FIG. 15 is a modification example of the oscillator circuit in which the circuit 32 (FIGS. 8A and 8B) described in Configuration Example 5 is used. The circuit 112 includes (n+1)-stage circuits 20, a circuit 21, the circuit 80, and the buffer circuit 81. The (n+1)-stage circuits 20 and the circuit 21 are each electrically connected to the wiring WD, in wirings WL, and in wirings CTL (m is an integer greater than or equal to 2). The circuit 20 and the circuit 21 correspond to the circuit 32 and the circuit 90, respectively. FIG. 16 shows a configuration example of the circuit 20. FIG. 17 shows a configuration example of the circuit 21.

<Circuit 20>

The circuit 20 includes the circuit 41 and m circuits 44. The circuit 41 includes the inverter INV1. Each of output nodes of first- to n-th-stage circuits 20 is electrically connected to an input node of the circuit 20 in the next stage. An output node ND12 of the circuit 20 in the n-th stage is electrically connected to an input node of the circuit 20 in the first stage. A circuit 12 includes the first- to n-th-stage circuits 20. That is, the circuit 12 includes n inverters INV1, and can function as a ring oscillator like the circuit 11 (in FIG. 1).

A plurality of circuits 44 is provided in each circuit 20, so that a plurality of configuration data for setting a high power supply potential that is to be supplied to the INV1 can be held. The configuration data is an analog potential Vcnf input from the wiring WD. In each circuit 20, any one of the plurality of configuration data is selected, so that the high power supply potential that is to be supplied to the INV1 can be changed and thus the delay time of the INV1 can be changed. The oscillation frequency f$_{VCO}$ of the output signal S$_{VCO}$ of the circuit 112 can be controlled. Thus, the circuit 112 can be referred to as a multi-context programmable oscillator circuit.

For the m circuits 44, in wirings WL and m wirings CTL are provided. As shown in FIG. 16, in a circuit 44[h] (h is an integer greater than or equal to 0 and less than or equal to (m−1)), a gate of a transistor MW1 is electrically connected to a wiring WL[h], and a gate of a wiring MS1 is electrically connected to a wiring CTL[h]. Each drain of the transistors MW1 in the m circuits 44 is electrically connected to the wiring WD. In the circuit 20, any one of the m transistors MS1 is turned on, so that the potential Vnd1 of the node ND1 of the corresponding circuit 44 can be supplied to the node NV1. The node NV1 is an input node of the high power supply potential of the node INV1.

<Circuit 21>

The circuit 21 includes m circuits 92. Similarly to the circuit 90, the circuit 21 has a function of generating power supply potential that is to be supplied to the circuit 80. The circuit 21 is provided in accordance with the circuit configuration of the circuit 80. The circuit 21 has a circuit configuration in which the circuit 41 is omitted from the circuit 20.

In the circuit 92[h] in FIG. 17, a gate of the transistor MW9 is electrically connected to the wiring WL[h] and a gate of the transistor MS9 is electrically connected to the wiring CTL[h]. Each drain of the transistors MW9 in the m circuits 92 is electrically connected to the wiring WD. Any one of the transistors MS9 in the m circuits 92 is turned on, so that the potential of the node ND9 of a corresponding circuit 92 can be supplied to the node NV2. The node NV2 is an input node of the high power supply potential of the circuit 80.

<Operation Example>

The circuit 112 can be referred to as a multi-context programmable oscillator circuit. A set of configuration data is referred to as a context. The input signals of wirings CTL[0] to CTL[m−1] can function as signals which can select the context. The context can be quickly switched in accordance with the input signals of the wirings CTL[0] to CTL[m−1].

Figure 18:
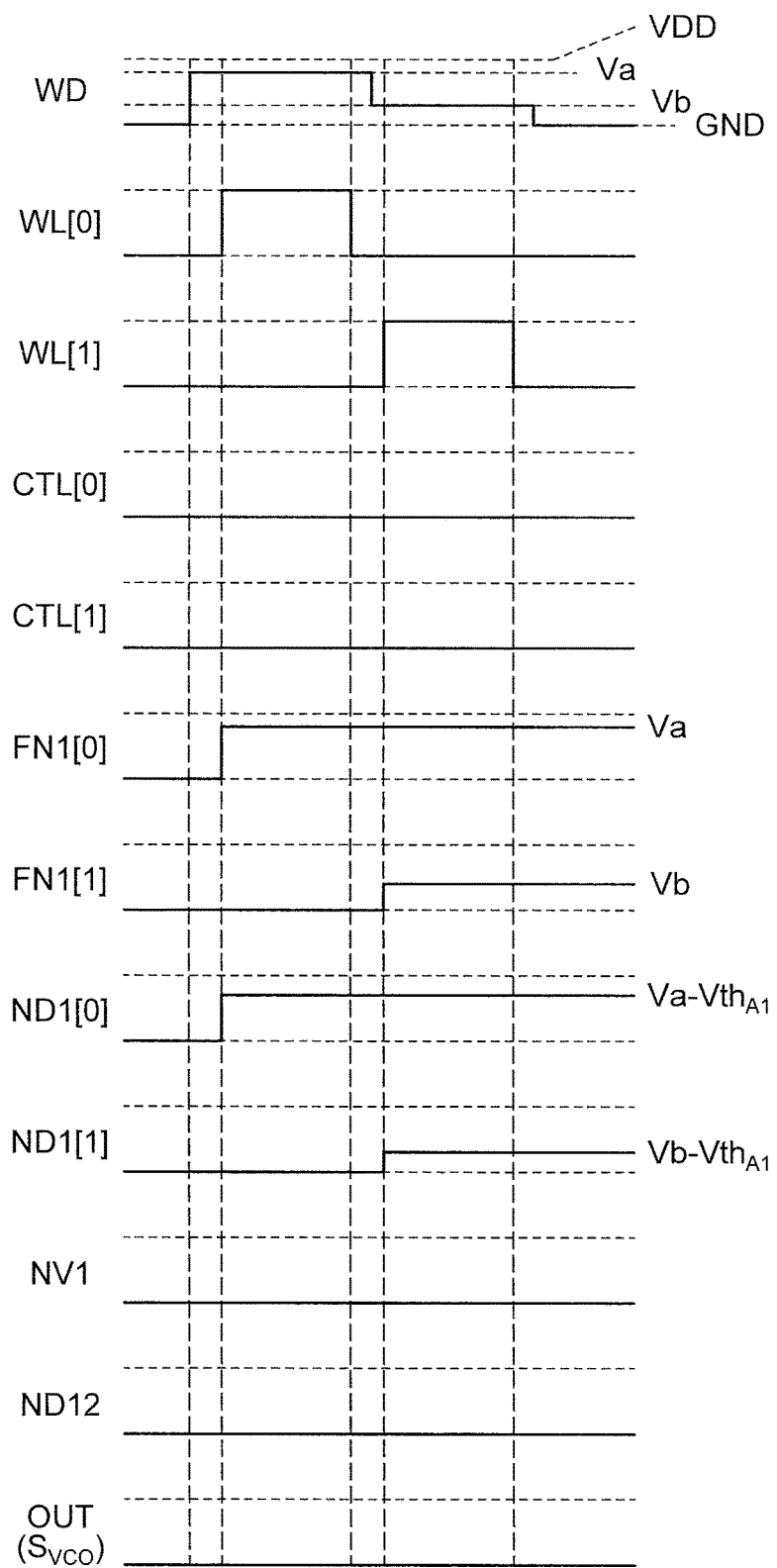
FIG. 18 is a timing chart showing an operation example of a circuit.

In the circuit 112, a set of m configuration data can be stored. Thus, after the set of m configuration data is stored in the circuit 112, the oscillation frequency $f_{VCO}$ can be changed by switching the context even in oscillation operation. An example of the operation of the circuit 112 is described with reference to FIG. 18. FIG. 18 and FIG. 19 are each a timing chart of the circuit 112 in the case where the number of contexts is two (m=2). FIG. 18 shows an example of writing operation of the configuration data, that is configuration operation. FIG. 19 is a timing chart continued from FIG. 18, which shows an example of the oscillation operation.

As in FIGS. 4A and 4B, VDD>VA>Vb. The threshold voltages of the transistors MA1 and MA9 are denoted by $Vth_{A1}$ and $Vth_{A9}$, respectively. In FIG. 18 and FIG. 19, the waveform maximum potential and the waveform minimum potential are a VDD and a GND, respectively.

(Configuration Operation) In the configuration operation, only the wiring WL[h] corresponding to a context[h] is set to a high level and the other wirings WL are set to a low level, whereby the analog potential of the wiring WD is written to the circuit 44[h] and the circuit 92[h] which correspond to the context[h]. In the configuration operation, the potentials of all the wirings CTL are maintained at a low level. In the circuit 20, the circuit 44 and the circuit 41 are in a non-conduction state, and the circuit 21 and the circuit 80 are also in a non-conduction state; thus, the potentials of the node NV1 and the node NV2 are at a low level.

First, configuration data with a context[0] is written. An analog potential Va is supplied to the wiring WD. The wiring WL[0] is set at a high level, so that the analog potential Va is written to the circuits 44[0] of the first- to the (n+1)-th-stage circuits 20. The potential of the node FN1 [0] of each circuit 44[0] is increased to Va. Then, the wiring WL[0] is set to a low level, so that the transistor MW1 of each circuit 44[0] is turned off and writing of the context[0] is completed. In each circuit 44[0], the potential of the node FN1[0] becomes Va and the potential of the node ND1[0] becomes $(Va-Vth_{A1})$. Furthermore, in the circuit 21, the potential of the node FN9[0] of the circuit 92[0] becomes $(Va-Vth_{A9})$.

Next, writing of configuration data with a context[1] is performed. An analog potential Vb is supplied to the wiring WD. The wiring WL[1] is set at a high level, so that Vb is written to the circuits 44[1] of the first- to the (n+1)-th-stage circuits 20. The wiring WL[1] is set to a low level, so that writing of configuration data is completed. In each circuit 44[1], the potential of the node FN1[1] becomes Vb and the potential of the node ND1[1] becomes $(Vb-Vth_{A1})$. Furthermore, in the circuit 21, the potential of the node FN9[1] of the circuit 92[1] becomes $(Vb-Vth_{A9})$.

Here, the oscillator frequency of the circuit 12 is set to fa or fb depending on the configuration data with the context[0] and the context[1].

(Oscillation Operation)

When the circuit 112 oscillates, only a wiring CTL[h] corresponding to a context[h] to be selected is set to a high level, and the other wirings are set to a low level. In the first- to (n+1)-th-stage circuits 20, a node FN1[h] of the circuit 44[h] and the node NV1 of the INV1 are brought into conduction. The delay time of INV1 in each circuit 20 is the length of time based on the configuration data of the context[h], and the circuit 112 can oscillate at a predetermined frequency. In the circuit 21, the node FN9[h] is in conduction with the node NV2.

In the example in FIG. 19, the wiring CTL[0] is selected, and the potential of the wiring CTL[0] is set to a high level. The potential of the node NV1 of each circuit 20 is substantially equal to the potential $(Va-Vth_{A1})$ of the node ND1[0]; thus, a signal ro12 at an oscillation frequency of fa and an amplitude of $(Va-Vth_{A1}-GND)$ is output from the output node ND12 of the circuit 12. The signal ro12 is amplified by the circuit 80. The signal $S_{VCO}$ at an oscillation frequency of fa and an amplitude of (VDD−GND) is output from an output terminal of the circuit 112.

When the wiring CTL[0] is set to a low level, the supply of the power supply potential to the INV1 of each circuit 21 is interrupted, and the circuit 112 does not oscillate.

A wiring CTL[1] is set to a high level to select the context [1]. The potential of the node NV1 of each circuit 20 is substantially equal to the potential $(Vb-Vth_{A1})$ of the node ND1[1]; thus, a signal ro12 at an oscillation frequency of fb and an amplitude of $(Vb-Vth_{A1}-GND)$ is output from the output node ND12 of the circuit 12. The signal ro12 is amplified by the circuit 80. The signal $S_{VCO}$ at an oscillation frequency fb and an amplitude of (VDD−GND) is output from the circuit 112.

It is possible to perform oscillation operation with only a wiring CTL corresponding to a certain context number setting to a high level and, at the same time, to rewrite configuration data of wirings CTL corresponding to other context numbers.

As described above, in the circuit 112, the oscillation frequency can be changed at a high speed even in the oscillation operation by changing contexts. Furthermore, extremely low off-state current of the transistor MW1 allows the circuit 44 to hold the configuration data for a long period even after the power supply is stopped. Thus, there is no need to perform the configuration operation every time the circuit 112 is restarted, and the circuit 112 can oscillates at a desired frequency immediately after it is restarted.

<<Configuration Example 8 of Oscillator Circuit>>

Figure 20A:
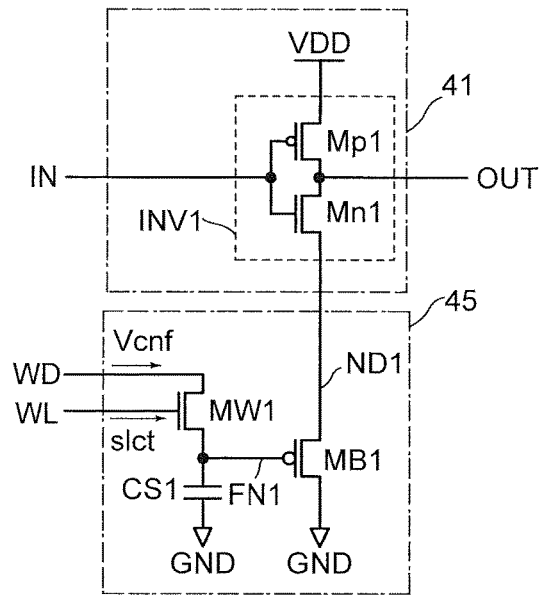
FIGS. 20A to 20C are circuit diagrams each showing a configuration example of a circuit.
Figure 20B:
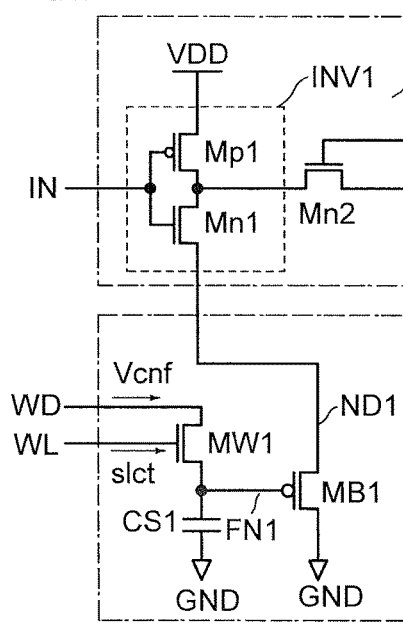
Figure 20C:
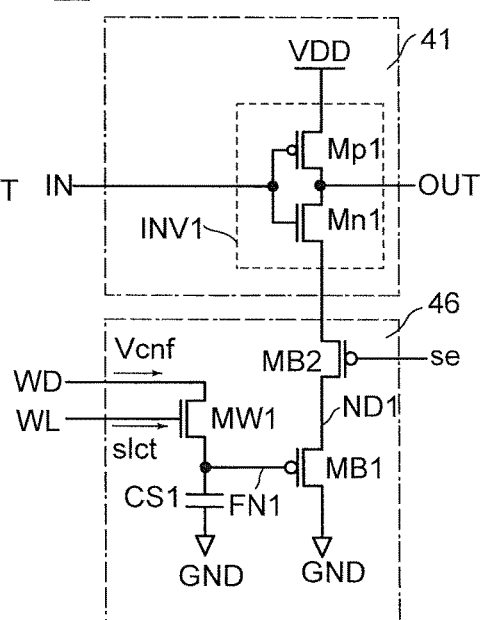

FIGS. 20A to 20C are modification examples of the circuits 30 to 32.

The circuit 30 (FIG. 2), the circuit 31 (FIGS. 7A and 7B), and the circuit 32 (FIGS. 8A and 8B) are each a basic circuit of a ring oscillator circuit. The circuits 30 to 32 each has a function of controlling the high power supply potential that is to be supplied to the INV1 by the potential held at the node FN1. The delay time of the INV1 can be changed by changing the high power supply potential, and the delay time of the INV1 can also be changed by changing the low power supply potential. The circuits 35 to 37 in FIGS. 20A to 20C each has a function of changing the low power supply potential by the potential held at the node FN1.

The circuit 35 in FIG. 20A is a modification example of the circuit 30. The circuit 35 includes a circuit 41 and a circuit 45. An output node ND1 of the circuit 45 is electrically connected to an input node of the low power supply potential of the INV1. The circuit 45 has a structure similar to that of the circuit 42 (FIG. 2). Here, a p-channel transistor MB1 is provided instead of the n-channel transistor MA1. Note that an n-channel transistor can be used as the transistor MB1. The operation of the circuit 45 is similar to that of the circuit 42; thus, description of the circuit 42 is referred to.

The circuit 36 shown in FIG. 20B is a modification example of the circuit 31. In the circuit 36, a circuit 45 is provided instead of the circuit 42. The circuit 37 shown in FIG. 20C is a modification example of the circuit 32. In the circuit 37, a circuit 46 is provided instead of the circuit 42.

The circuits 35 to 37 can be used in the circuit 100 (FIG. 3). When a ring oscillator circuit is formed using the circuits 35 to 37, as shown in FIG. 3, it is preferable that an output signal of the ring oscillator be boosted by the circuit 85 in which the circuit 90 is not necessary.

<<Configuration Example 9 of Oscillator Circuit>>

The basic circuit of the ring oscillator can have a circuit configuration in which both the high power supply potential and the low power supply potential of the inverter can be controlled.

For example, the ring oscillator circuit can be formed using a basic circuit in which the circuit 35 (FIG. 20A) is added to the circuit 30 (FIG. 2). In that case, a node ND1 of the circuit 35 and the input node of the low power supply potential of the INV1 can be electrically connected to each other. In a similar manner, the ring oscillator circuit can be formed using a basic circuit in which the circuit 35 is added to the circuit 31 (FIGS. 7A and 7B).

For example, the ring oscillator circuit can be formed using a basic circuit in which the input node of the low power supply potential of the INV1 of the circuit 32 (FIGS. 8A and 8B) is electrically connected to the circuit 37 (FIG. 20C).

(Embodiment 2)

<<Configuration Example of PLL>>

Figure 21:
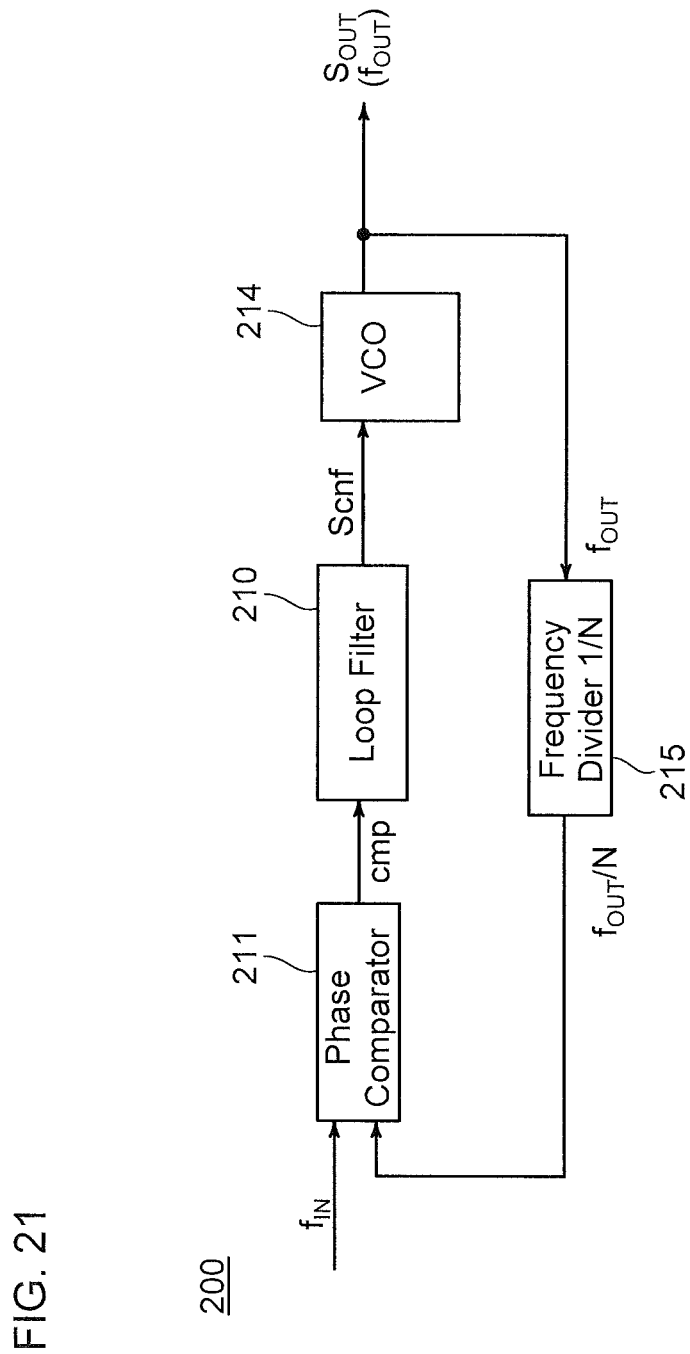
FIG. 21 is a block diagram showing a configuration example of a PLL.
Figure 22:
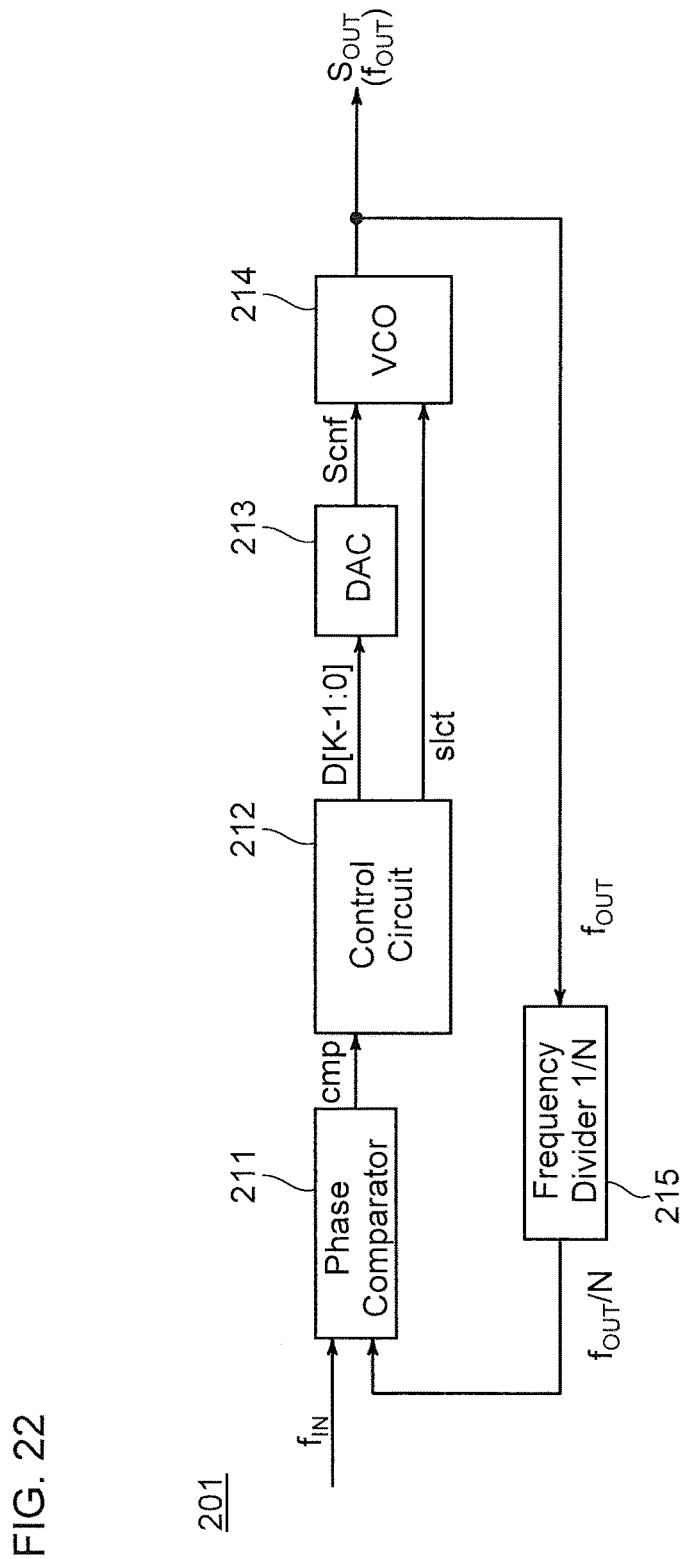
FIG. 22 is a block diagram showing a configuration example of a PLL.
Figure 23:
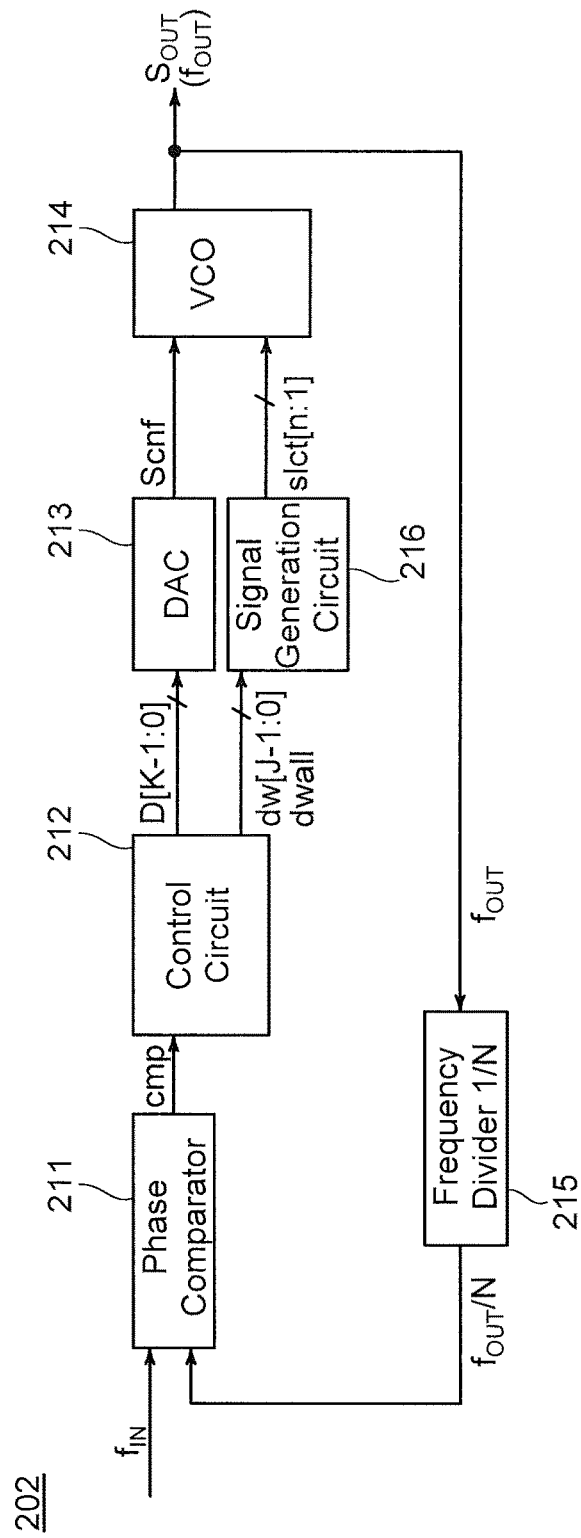
FIG. 23 is a block diagram showing a configuration example of a PLL.

A phase locked loop (PLL) will be described below. The oscillator circuit described above can be used as a voltage controlled oscillator circuit of the PLL. FIG. 21 to FIG. 23 each illustrate a configuration example of the PLL.

<Configuration Example 1>

A PLL 200 illustrated in FIG. 21 includes a loop filter 210, a phase comparator 211, a voltage-controlled oscillator (VCO) 214, and a frequency divider 215. The PLL 200 has a function of outputting a signal $S_{OUT}$ at an oscillation frequency $f_{OUT}$. The signal Sour is input to other circuits as a clock signal.

The phase comparator 211 has a function of detecting a phase difference between two input signals and outputting the detection result as a voltage signal cmp. In the example of FIG. 21, the phase comparator 211 has a function of outputting a phase difference between a signal at a frequency $f_{IN}$ and a signal at a frequency $f_{OUT}/N$ as a voltage signal cmp. The frequency divider 215 has a function of generating a signal whose frequency is 1/N times the frequency of an alternating-current signal that is input. In the example in FIG. 21, the frequency divider 215 output a signal at a frequency $f_{OUT}/N$.

The loop filter 210 has a function of generating a signal Scnf. In addition, the loop filter 210 has a function of removing a high-frequency component from an output signal of the phase comparator 211. An example of the loop filter 210 is a low-pass filter. The VCO 214 has a function of outputting a signal $S_{our}$ at a oscillation frequency $f_{OUT}$ corresponding to a voltage value of the signal Scnf. In the example in FIG. 21, an oscillator circuit such as the circuit 100, 101, 102, or 103 can be used as the VCO 214.

<Configuration Example 2>

A PLL 201 illustrated in FIG. 22 includes the phase comparator 211, a control circuit 212, a digital-to-analog converter (DAC) 213, the VCO 214, and the frequency divider 215.

In the example in FIG. 22, an oscillator circuit such as the circuit 100, 101, 102, or 103 can be used as the VCO 214. The DAC 213 has a function of generating an analog potential signal Scnf. The DAC 213 has a function of converting a K-bit digital signal D[K-1:0] which is input from the control circuit 212 into the signal Scnf. Note that K is an integer of 2 or more. The signal Scnf is input to a wiring WD of the VCO 214. The control circuit 212 can generate a signal D[K-1:0] and a signal slct in accordance with the output signal cmp of the phase comparator 211.

<Configuration Example 3>

A PLL 202 illustrated in FIG. 23 is a modification example of the PLL 201, in which a signal generation circuit 216 is added.

In the PLL 202, the circuit 111 (FIG. 11) can be used as the VCO 214. That is, an oscillator circuit with a plurality of wirings WL can be used as the VCO 214. When the circuit 31 (FIG. 7) or the circuit 32 (FIG. 8) is used as the basic circuit constituting the ring oscillator circuit of the VCO 214, the signal se can be generated by the control circuit 212. Furthermore, the circuit 112 (FIG. 15) can be used as the VCO 214. In that case, for example, a context selection signal is output from the control circuit 212 to the VCO 214.

The circuit 70 or the circuit 71 can be used as the signal generation circuit 216. When the circuit 70 is used as the signal generation circuit 216, the control circuit 212 outputs the signal dw[J-1:0]. When the circuit 71 is used as the signal generation circuit 216, the control circuit 212 outputs the signal dw[J-1:0] and the signal dwall to the signal generation circuit 216. The signal generation circuit 216 may be incorporated in the control circuit 212. Furthermore, a functional circuit including the control circuit 212 and the signal generation circuit 216 can be regarded as a control circuit.

<<Operation Example of PLL>>

Figure 24:
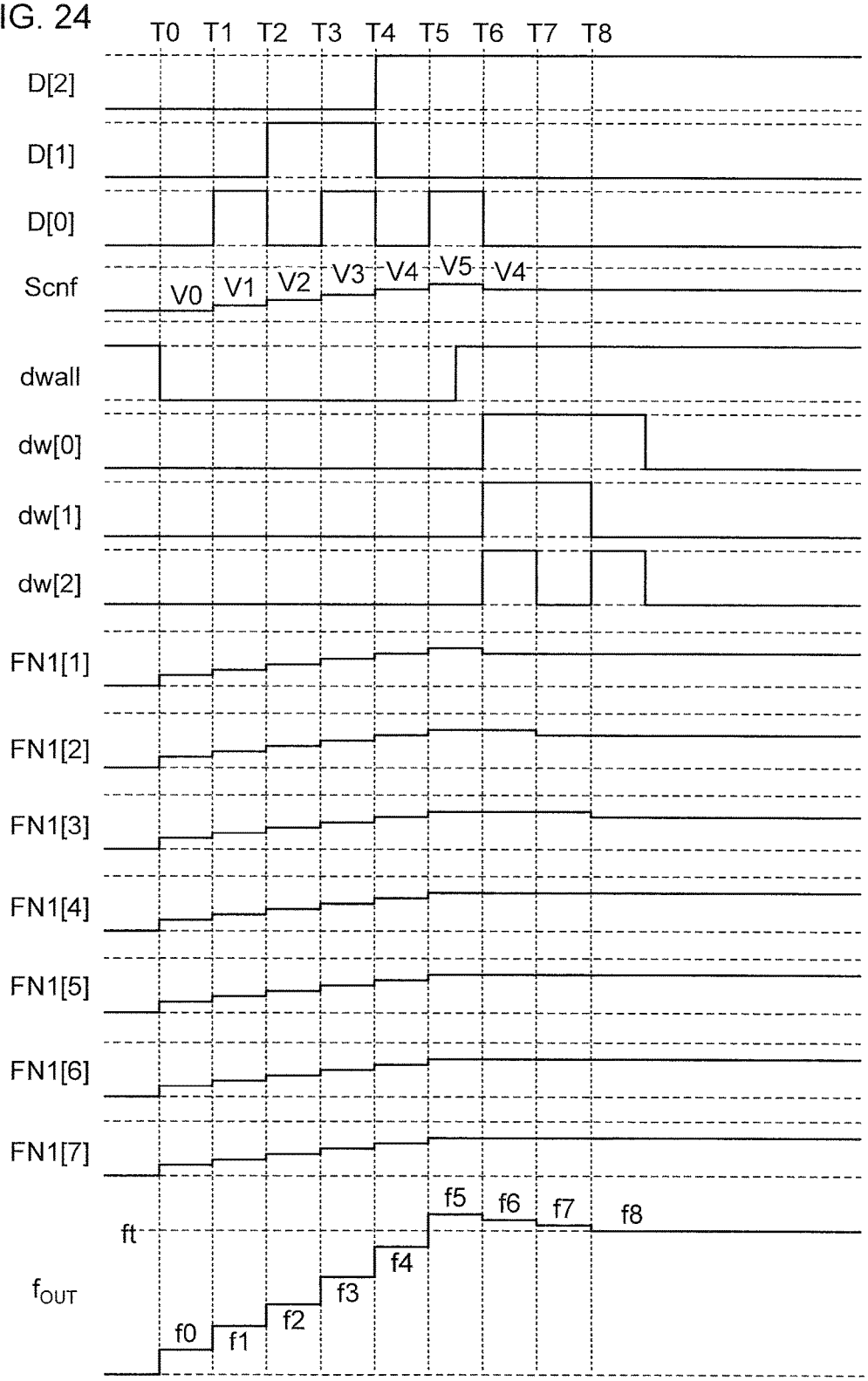
FIG. 24 is a timing chart showing an operation example of a PLL.
Figure 25:
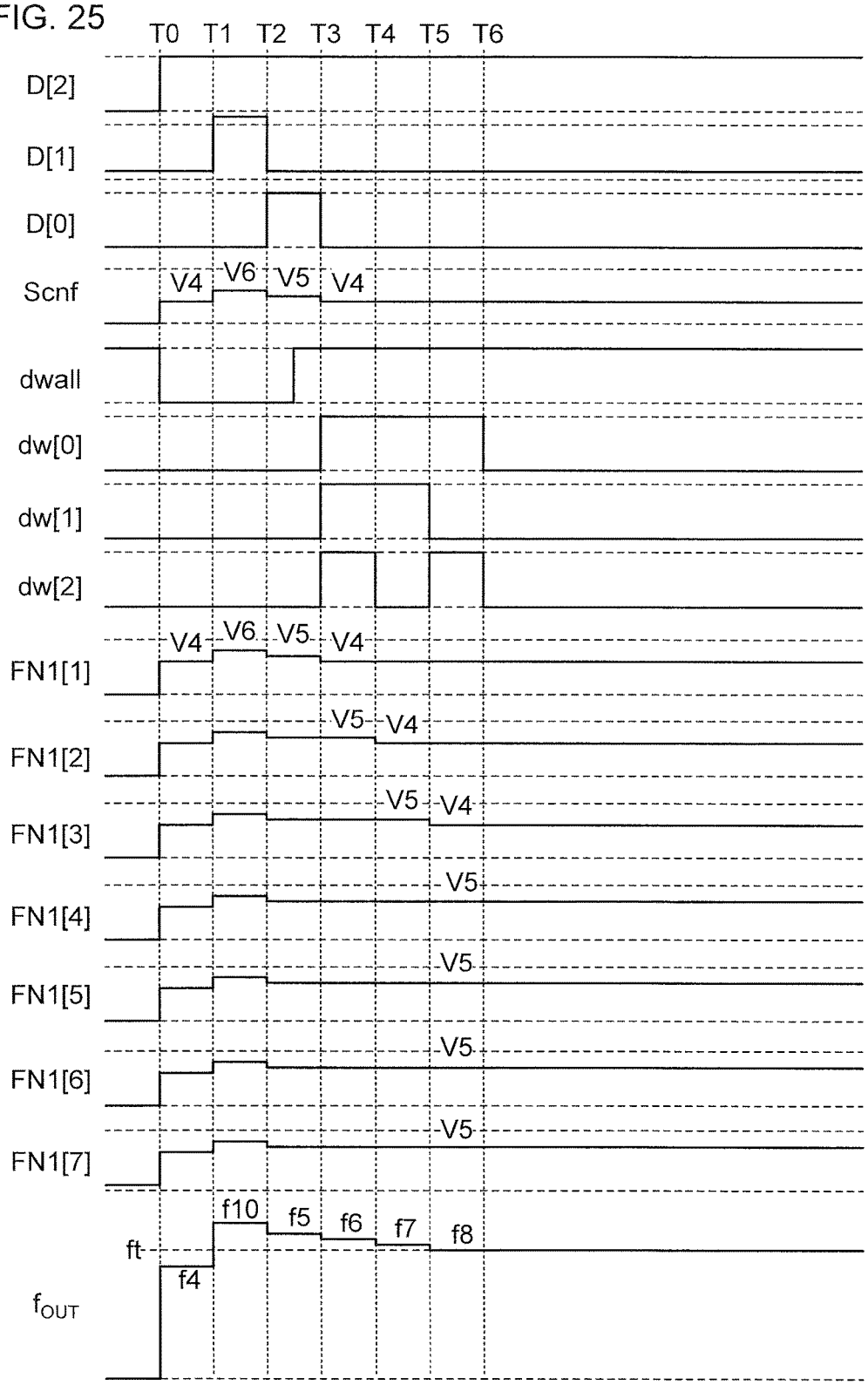
FIG. 25 is a timing chart showing an operation example of a PLL.

An operation example of the PLL 202 is described. FIG. 24 and FIG. 25 each illustrate an example of a timing chart of the PLL 202, in which an operation example of setting the oscillation frequency $f_{OUT}$ to $f_t$ is shown. Here, in the PLL 202, the circuit 71 is used as the signal generation circuit 216, the circuit 111 is used as the VCO 214, and n=7, K=3, and J=3 are satisfied. When an analog potential corresponding to a signal D[2:0] with a data value of greater than or equal to "100" and less than or equal to "101" is written to each of the circuits 30[1] to 30[7], the VCO 214 oscillates at a frequency $f_t$. In FIG. 24 and FIG. 25, the waveform maximum potential and the waveform minimum potential are a VDD and a GND, respectively. The potential of the node FN1[8] is the same as that of the node FN1[7]; thus, the node FN1[8] is omitted in FIG. 24 and FIG. 25.

<Operation Example 1>

An operation example of the PLL 202 is described with reference to FIG. 24.

Before time T0, the VCO 214 does not oscillate. The signals s1ct[1] to s1ct[7] are set to a low level because the potentials of the node FN[1] to FN[7] are a GND and the signal dwall is at a high level. A signal D[2:0] with a data value of "000" is output from the control circuit 121 to the DAC 213, and the DAC 213 outputs an analog potential V0.

The signal dwall is set to a low level at time T1, whereby the signal generation circuit 216 outputs high-level signals s1ct[1] to s1ct[7], and a potential V0 is written to circuits 30[1] to [8] of the VCO 214. The VCO 214 oscillates at a frequency f0. The phase comparator 211 detects a phase difference between a signal at a frequency $f_{IN}$ and a signal at a frequency f0/N and outputs a signal cmp based on the detected result.

The control circuit 212 determines whether f0 and $f_t$ are the same based on a voltage value of the signal cmp and determines the digital value of the signal D[2:0]. Since f0<ft, the control circuit 212 outputs a signal D[2:0] with a data value of "001" to the DAC 213. The DAC 213 outputs an analog potential V1. To the nodes FN1[1] to FN1 [7] of the VCO 214, V1 is written, and the VCO 214 oscillates at an oscillation frequency f1. The phase comparator 211 detects a phase difference between a signal at a frequency $f_{IN}$ and a signal at a frequency f1/N and generates a signal cmp based on the detected result and outputs it to the control circuit 212.

In the example in FIG. 24, the control circuit 212 determines a data value of the signal D[2:0] in accordance with the signal cmp. When the control circuit 212 determines that the oscillation frequency $f_{OUT}$ is lower than ft, the data value of the signal D[2:0] is increased by "1". Meanwhile, when the control circuit 212 determines that the oscillation frequency $f_{OUT}$ is higher than ft, the data value of the signal D[2:0] is decreased by "1".

Thus, at time T2, the control circuit 212 outputs a signal D[2:0] with a data value "010". A potential V2 is output from the DAC 213, and the potential of each of the nodes FN1[1] to FN1[7] is increased to the potential V2. The VCO oscillates at a frequency f2. At time T3, the control circuit 212 outputs a signal D[2:0] with a data value "011" and the DAC 213 outputs a potential V3 because f2<ft. The potential of the nodes FN[1] to FN[7] are increased to the V3, so that the VCO 214 oscillates at a frequency f3. At time T4, the control circuit 212 outputs a signal D[2:0] with a data value "100" and the DAC 213 outputs a potential V4 because f3<ft. The potentials of the nodes FN[1] to FN[7] are increased to V4, so that the VCO 214 oscillates at a frequency of f4.

At time T5, the control circuit 212 outputs a signal D[2:0] with a data value "101" because f4<ft. The DAC 213 outputs a potential V5, and the potential of the nodes FN[1] to FN[7] are increased to the V5, so that the VCO 214 oscillates at a frequency of f5. The control circuit 212 determines that the oscillation frequency f5 is higher than $f_t$ in accordance with the signal cmp.

In order to oscillate the VCO 214 at $f_t$, the potentials of the nodes FN1[1] to FN1[7] are set to be higher than V4 and lower than V5. In the circuit configuration in FIG. 23, a potential with such a level is not generated in the DAC 213. Thus, the control circuit 212 individually controls the potentials of the nodes FN1[1] to FN1[7] so that the VCO oscillates at $f_t$.

When the control circuit 212 determines that the frequency f5 is higher than the target value $f_t$ in accordance with the signal cmp, the dwall is set to a high level first. Because low-level signals slct[1] to slct[7] are output from the signal generation circuit 216, the nodes FN[1] to FN1 [8] are brought into a floating state. After time T6, the oscillation frequency $f_{OUT}$ is adjusted in the PLL 202.

At time T6, the control circuit 212 outputs a signal D[2:0] with a data value of "100" and a signal dw[2:0] with a data value of "111". The DAC 213 outputs V4. The signal generation circuit 216 outputs a high-level signal slct to the wiring WL[1], and outputs low-level signals slct [2] to slct[7] to the wirings [2] to [7], respectively. In the VCO 214, the potential of the node FN1[1] is decreased to the potential V4; thus, the oscillation frequency $f_{OUT}$ is decreased from f5 to f6.

That is, in the example of FIG. 24, the potentials of the nodes FN1 are changed from V5 to V4 in the seven-stage circuits 30 in the VCO 214 by one stage, so that the oscillation frequency $f_{OUT}$ is finely adjusted.

The control circuit 212 outputs a control signal for writing the potential V4 to the node FN1[2] of the circuit 30[2] at time T7 when determining that f6>$f_t$ in accordance with the signal cmp. When the potential of the node FN1 [2] is decreased to V4, $f_{OUT}$ is decreased to f7. The control circuit 212 outputs a control signal for writing the potential V4 to the node FN1[3] at time T8 when determining that f7<$f_t$ in accordance with the signal cmp. When the potential of the node FN1[3] is decreased to V4, $f_{OUT}$ is deceased to f8.

The VCO 214 oscillates at a frequency of f8. When determining that f8 is equal to $f_t$ in accordance with the signal cmp, the control circuit 212 performs control so that the tuning operation is stopped at time T8. Specifically, the control circuit 212 outputs a signal D[2:0] with a data value of "000", a high-level signal dwall, and a signal dw[2:0] with a data value of "000". At time T8, the nodes FN1 [1] to FN1 [8] are brought into an electrically floating state.

<Operation Example 2>

An operation example of the PLL 202 is described with reference to FIG. 25. FIG. 25 shows an example of tuning the oscillation frequency of the VCO 214 by so-called binary search.

At Time T0, the control circuit 212 outputs a signal D[2:0] with a data value of "100". Note that "100" is a value intermediate between "000" and "111". When the signal dwall becomes a low level, the potential V4 is written to each of the nodes FN1[1] to FN1[8] of the VCO 214; thus, the VCO 214 oscillates at a frequency f4.

When determining that f4 is lower than $f_t$ in accordance with the signal cmp, the control circuit 212 outputs a signal D[2:0] with a data value of "100" so as to increase the potential of the Scnf. Note that "110" is a value intermediate between "100" and "111". A potential V6 is output from the DAC 213, and V6 is written to each of the nodes FN1[1] to FN1[8]. The $f_{out}$ becomes f10.

The potential of the Scnf is decreased when the control circuit 212 determines that f10 is higher than $f_t$ in accordance with the signal cmp, so that the control circuit 212 outputs the signal D[2:0] with a data value of "101". Note that "101" is a value intermediate between "100" and "111". The potential V5 is output from the DAC 213, V5 is written to each of the nodes FN1 [1] to FN1 [8], and $f_{OUT}$ becomes f5. When determining that the frequency f5 is higher than the target value $f_t$ in accordance with the signal cmp, the control circuit 212 performs control so that the oscillation frequency is finely adjusted. This control operation is the same as that in FIG. 24, and the potential of the node FN1 is changed from V5 to V4 in the seven-stage circuits 30 in the VCO 214 by one stage.

At time T3, the potential of the node FN1[1] is decreased from V5 to V4, and $f_{OUT}$ becomes f6. At Time T4, the potential of the node FN1 [2] is decreased from V5 to V4, and $f_{OUT}$ becomes f7. At time T5, the potential of the node FN1[3] is decreased from V5 to V4, and $f_{OUT}$ becomes f8. When the control circuit 212 determines that f8 is equal to $f_t$ in accordance with the signal cmp, the nodes FN[1] to FN1 [8] are brought into an electrically floating state, and tuning operation is completed.

As described above, in the example in FIG. 25, $f_{OUT}$ is detected by binary search; thus, tuning of the $f_{OUT}$ can be performed at a higher speed than that in the example in FIG. 24.

In accordance with the timing charts in FIGS. 24 and 25, the PLL 201 can operate similarly to the PLL 202.

In the PLL 201 and the PLL 202, after the tuning for obtaining oscillation at a frequency $f_t$, the VCO 214 can oscillate at a frequency $f_t$ even the power to circuits other than the VCO 214 are shut off. Furthermore, when the PLL is restarted after the power of the whole PLL 201 and PLL 202 are shut off, the PLL 201 and the PLL 202 can oscillate at a frequency $f_t$ immediately after it is restarted. As described above, with the use of the circuit 101, a PLL capable of low power consumption and high-speed starting can be provided.

The PLL can be incorporated into various semiconductor devices as a circuit for generating a clock signal. Examples of such a semiconductor device are shown below.

<<Processing Unit>>

The PLL can be incorporated into a processing unit, for example, and can function as a clock generation circuit. Examples of the processing unit include a central processing unit (CPU), a graphics processing unit (GPU), a programmable logic device (PLD), a digital signal processor (DSP), a microcontroller unit (MCU), a custom LSI, and a wireless IC which can send and receive data wirelessly.

<Wireless IC>

Figure 26:
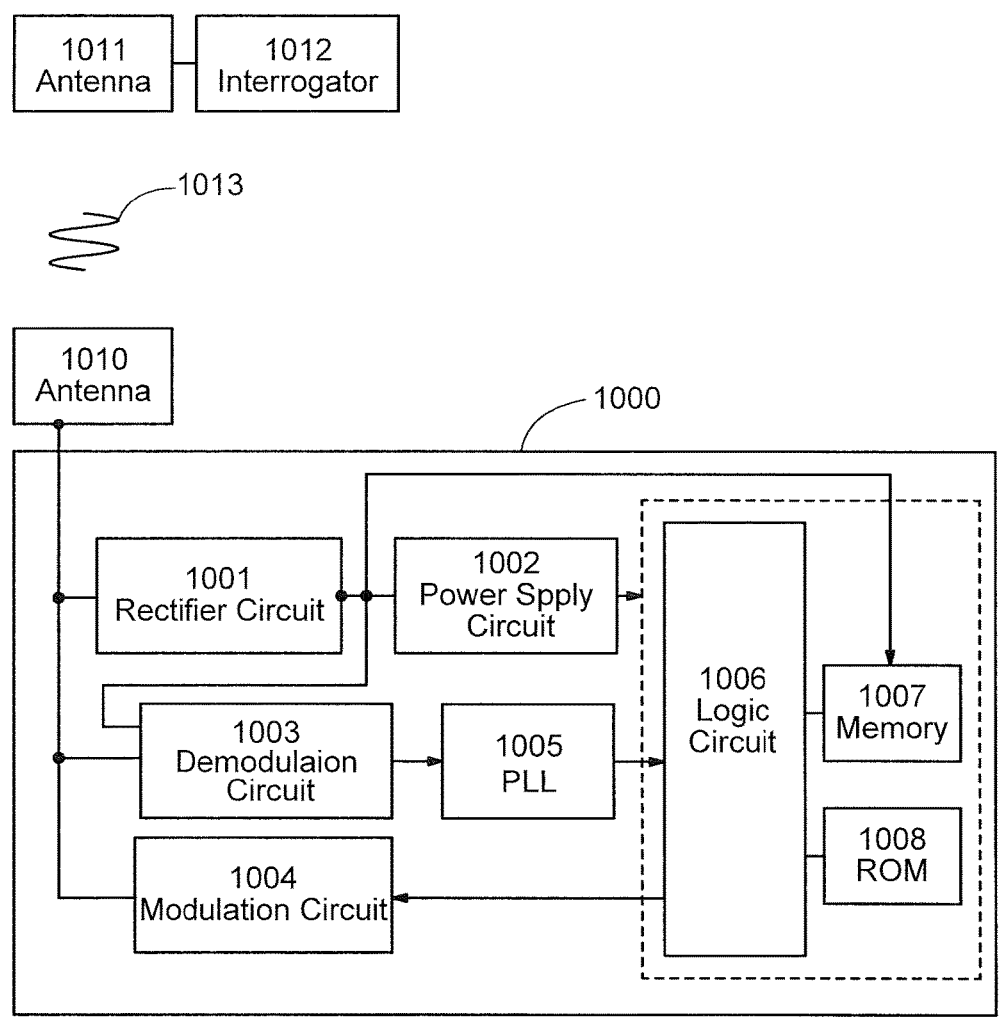
FIG. 26 is a block diagram showing a configuration example of a processing unit (wireless IC)

A carrier wave or a clock signal synchronized with a demodulated signal can be generated, for example, by incorporating the PLL in a wireless IC. FIG. 26 shows an example of a wireless IC. The wireless IC is referred to as a wireless chip, an RFIC, an RF chip, or the like in some cases.

A wireless IC 1000 illustrated in FIG. 26 includes a rectifier circuit 1001, a power supply circuit 1002, a demodulation circuit 1003, a modulation circuit 1004, a PLL 1005, a logic circuit 1006, a memory device 1007, and a read-only memory (ROM) 1008. Note that decision whether each of these circuits is provided or not can be made as appropriate as needed. The wireless IC 1000 is electrically connected to an antenna 1010. The PLL of this embodiment can be used as the PLL 1005. Instead of the PLL 1005, an oscillator circuit provided with the ring oscillator circuit described in Embodiment 1 can also be used.

The kind of the wireless IC 1000 of this embodiment is not specifically limited. In the example of FIG. 26, the wireless IC 1000 is a passive wireless IC; however, the wireless IC 1000 may be an active wireless IC with a built-in battery. A communication method of the wireless IC 1000, a structure of the antenna 101, and the like can be determined depending on a frequency band to be used.

The antenna 1010 exchanges a radio signal 1013 with the antenna 1011 which is connected to a communication device 1012. The antenna 1010 has performance corresponding to its communication zone. Note that as data transmission methods, the following methods can be given: an electromagnetic coupling method in which a pair of coils is provided so as to face each other and communicates with each other by mutual induction, an electromagnetic induction method in which communication is performed using an induction field, and a radio wave method in which communication is performed using a radio wave.

The rectifier circuit 1001 generates an input potential by rectification, for example, half-wave voltage doubler rectification of an input alternating signal generated by reception of a radio signal at the antenna 1010 and smoothing of the rectified signal with a capacitor element provided in a lower stage. Note that a limiter circuit may be provided on an input side or an output side of the rectifier circuit 1001. The limiter circuit controls electric power so that electric power which is higher than or equal to certain electric power is not input to a circuit in a later stage if the amplitude of the input alternating signal is high and an internal generation voltage is high.

The power supply circuit 1002 generates a stable power supply voltage from an input potential and supplies it to each circuit. Note that the power supply circuit 1002 may include a reset signal generation circuit. The reset signal generation circuit is a circuit which generates a reset signal of the logic circuit 1006 by utilizing rise of the stable power supply voltage.

Further, the demodulation circuit 1003 demodulates the input alternating signal by envelope detection and generates a demodulated signal. Further, the modulation circuit 1004 performs modulation in accordance with data to be output from the antenna 1010. The PLL 1005 is a circuit for generating a clock signal synchronized with the demodulated signal.

The logic circuit 1006 has a function of decoding the demodulated signal and performing processing based on the decoded result. The logic circuit 1006 includes, for example, a code recognition/judgment circuit, an encoding circuit 1009, and the like. The code recognition/judgement circuit analyzes a code of the demodulated signal based on a clock signal to obtain corresponding data. The logic circuit 1006 communicates data with the memory device 1007 in accordance with the analyzed code. The data output from the memory device 1007 is encoded in an encoding circuit. An encoded signal is output to the modulation circuit 1004.

The memory circuit 1007 holds an input data and includes a row decoder, a column decoder, a memory region, and the like. The ROM 1008 stores an identification number (ID) and the like and outputs data in accordance with the processing of the logic circuit 1006.

<Application Example of Wireless IC>

Figure 27A:
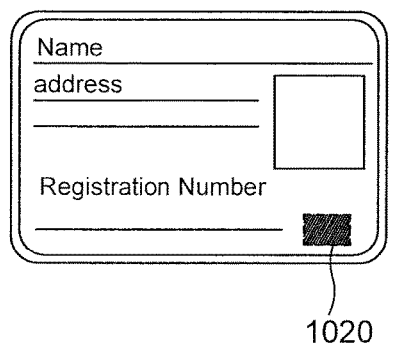
FIGS. 27A to 27F illustrate usage examples of RFID tags.
Figure 27B:
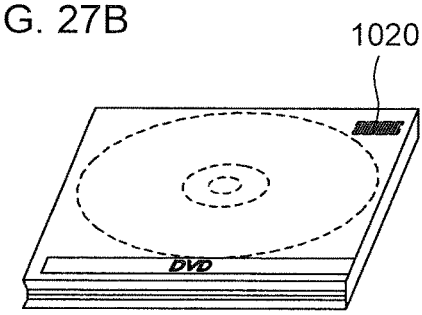
Figure 27C:
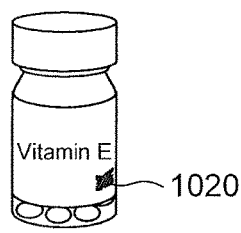
Figure 27D:
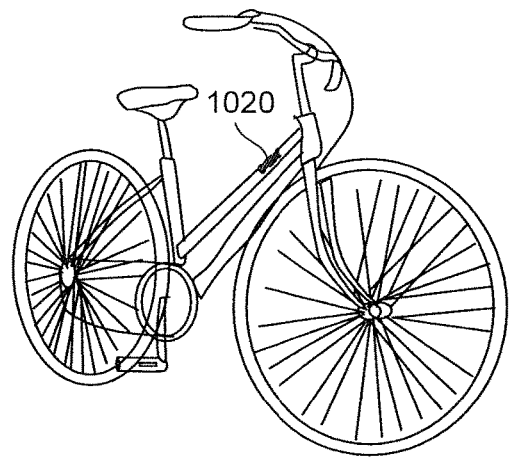
Figure 27E:
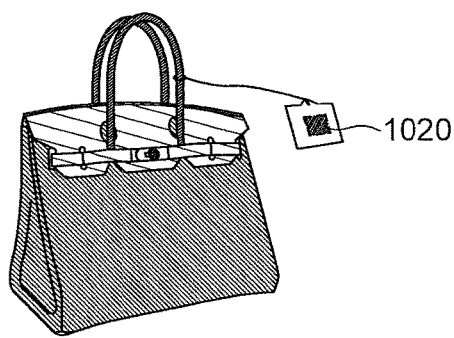
Figure 27F:
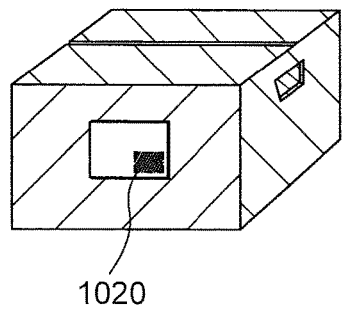

A wireless IC can be used as an RF tag for identifying an object. For example, an RF tag 1020 can be provided in objects such as bills, coins, securities, bearer bonds, documents (e.g., driver's licenses or resident's cards, see FIG. 27A), packaging containers (e.g., wrapping paper or bottles, see FIG. 27C), recording media (e.g., DVDs, blue-ray discs, CDs, USB memories, or SD cards, see FIG. 27B), vehicles (e.g., bicycles, baby cars, or wheel chairs, see FIG. 27D), personal belongings (e.g., bags or glasses, see FIG. 27E), foods, plants, animals, human bodies, clothing, household goods, medical supplies such as medicine and chemicals, and electronic devices (e.g., liquid crystal display devices, EL display devices, smartphones, cellular phones, clocks, or watches), or tags on objects (see FIGS. 27E and 27F).

A variety kinds of information can be obtained wirelessly by incorporating a sensor unit in the wireless IC. The wireless IC including a temperature sensor circuit and/or a humidity sensor circuit can be used for controlling temperature and/or humidity of the cultural properties, for example.

<PLD>

Figure 28:
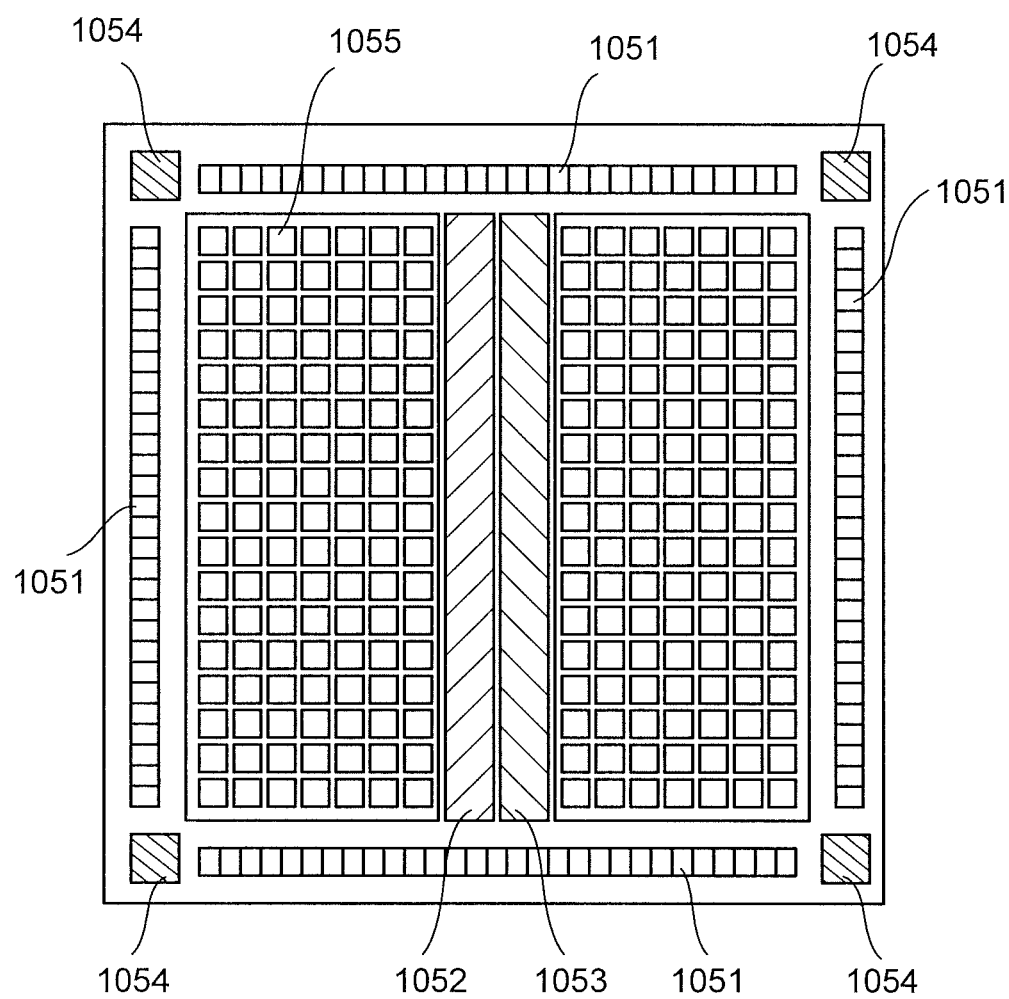
FIG. 28 is a schematic diagram showing a configuration example of a processing unit (PLD)

FIG. 28 illustrates an example of a programmable logic device (PLD). In FIG. 28, a PLD 1050 includes an input output (I/O) element 1051, a random access memory (RAM) 1052, a multiplier 1053, a PLL 1054, and a programmable logic element (PLE) 1055. The I/O element 1051 functions as an interface that controls input of a signal from a circuit outside the PLD 1050 or output of a signal to the circuit outside the PLD 1050. The PLL 1054 has a function of generating a clock signal. The RAM 1052 has a function of storing data used for logical operation. The multiplier 1053 corresponds to a logic circuit for multiplication. When the PLD 1050 includes a function of executing multiplication, the multiplier 1053 is not necessarily provided.

<MCU>

Figure 29:
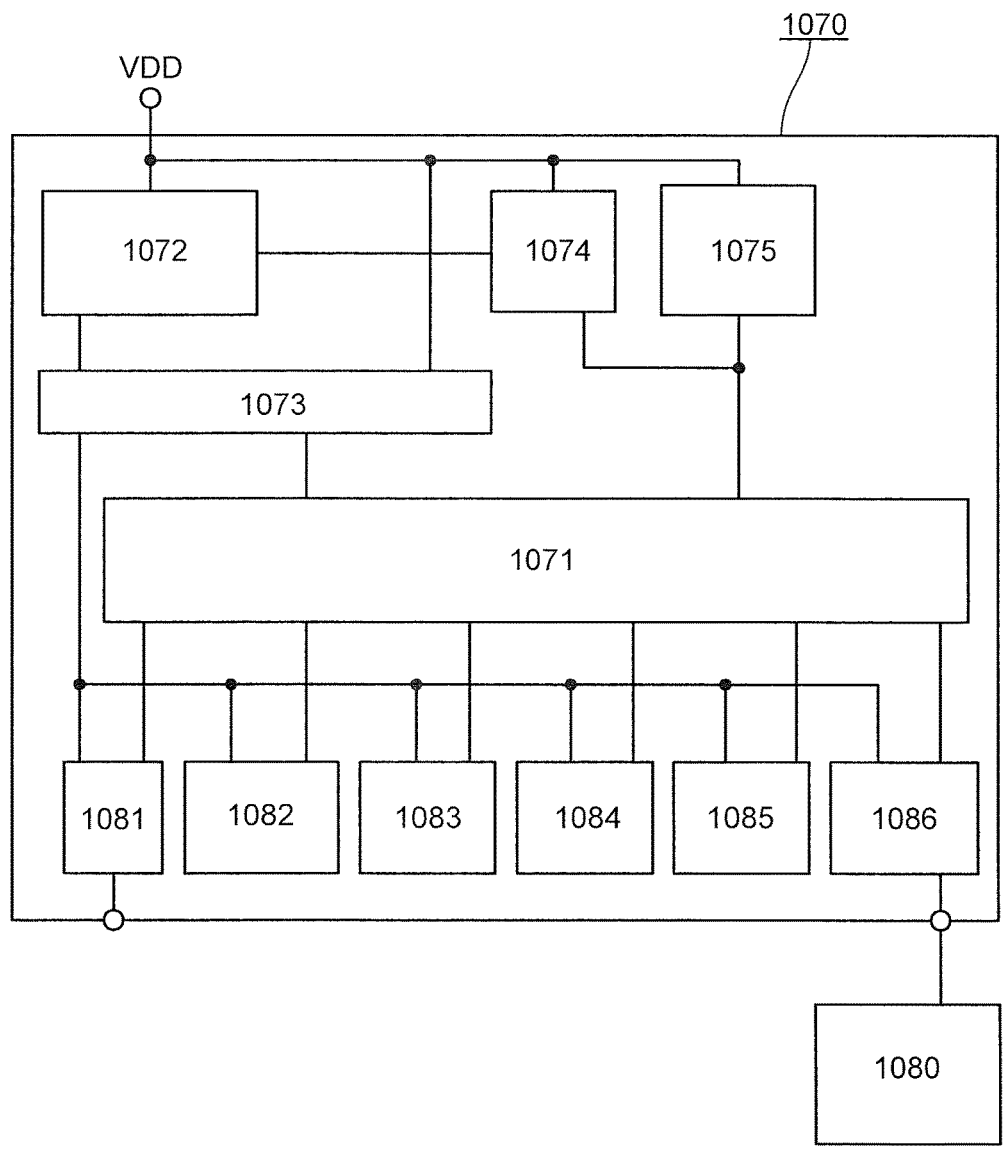
FIG. 29 is a block diagram showing a configuration example of a processing unit (MCU)

FIG. 29 shows an example of a microcontroller unit (MCU) 1070. The MCU 1070 includes a CPU core 1071, a power source management unit (PMU) 1072, a power gate 1073, a timer 1074, a PLL 1075, an analog digital converter (ADC) 1081, a watchdog timer 1082, a ROM 1083, a non-volatile memory device (also referred to as a non-volatile memory, NVM) 1084, a power supply circuit 1085, an interface (IF) element 1086, and the like.

The PLL 1075 generates a clock signal and outputs it to an internal circuit such as the CPU core 1071, the timer 1074, and the like. The CPU core 1071 and the timer 1074 can be processed using a clock signal. The PMU 1072 controls the power gate 1073 and controls the supply of the power supply potential VDD to the internal circuit of the MCU 1070. The supply of the VDD to the timer 1074 and the PLL 1075 without passing through the power gate 1073 is possible. The PMU 1072 controls the power gate 1073 so as to stop supply of power to the internal circuit that does not need to operate.

FIG. 29 shows an example in which the MCU 1070 controls the wireless module 1080 capable of wireless communication. A semiconductor device such as a sensor unit or the like is connected to the ADC 1081. The MCU 1070 is capable of processing a signal input to the ADC 1081 and performing control so that the wireless module 1080 transmits the processed result to the other wireless modules. Alternatively, the MCU 1070 is capable of processing a received signal of the wireless module 1080 and performing control so that the wireless module 1080 transmits the processed result to the other wireless module.

The power gate 1073 is turned on by the PMU 1072, whereby the CPU core 1071, the watchdog timer 1082, the ROM 1083, the power supply circuit 1085, and the interface (IF) element 1086 operate. Data that is arithmetically processed in the CPU core 1071 is output to the wireless module 1080 via the IF element 1086. The wireless module 1080 wirelessly transmits data. An output signal of the wireless module 1080 is input to the ADC 1081 via the IF element 1086. The ADC 1081 converts the input signal to a digital signal and outputs it to the CPU core 1071. The input signal is arithmetically processed by the CPU core 1071. The signal that is arithmetically processed is output to the wireless module 1080 via the IF element 1086. The wireless module 1080 wirelessly transmits the data. After the transmission, the PMU 1072 turns off the power gate 1073, and stops supply of power to the CPU core 1071 and the like. After the supply of power is stopped, the PMU 1072 controls the timer 1074, and starts time measurement. When the time measurement of the timer 1074 reaches a set value, the PMU 1072 restarts the supply of power to the CPU core 1071 and the like by turning on the power gate 1073 again.

<<Display Device>>

Figure 30:
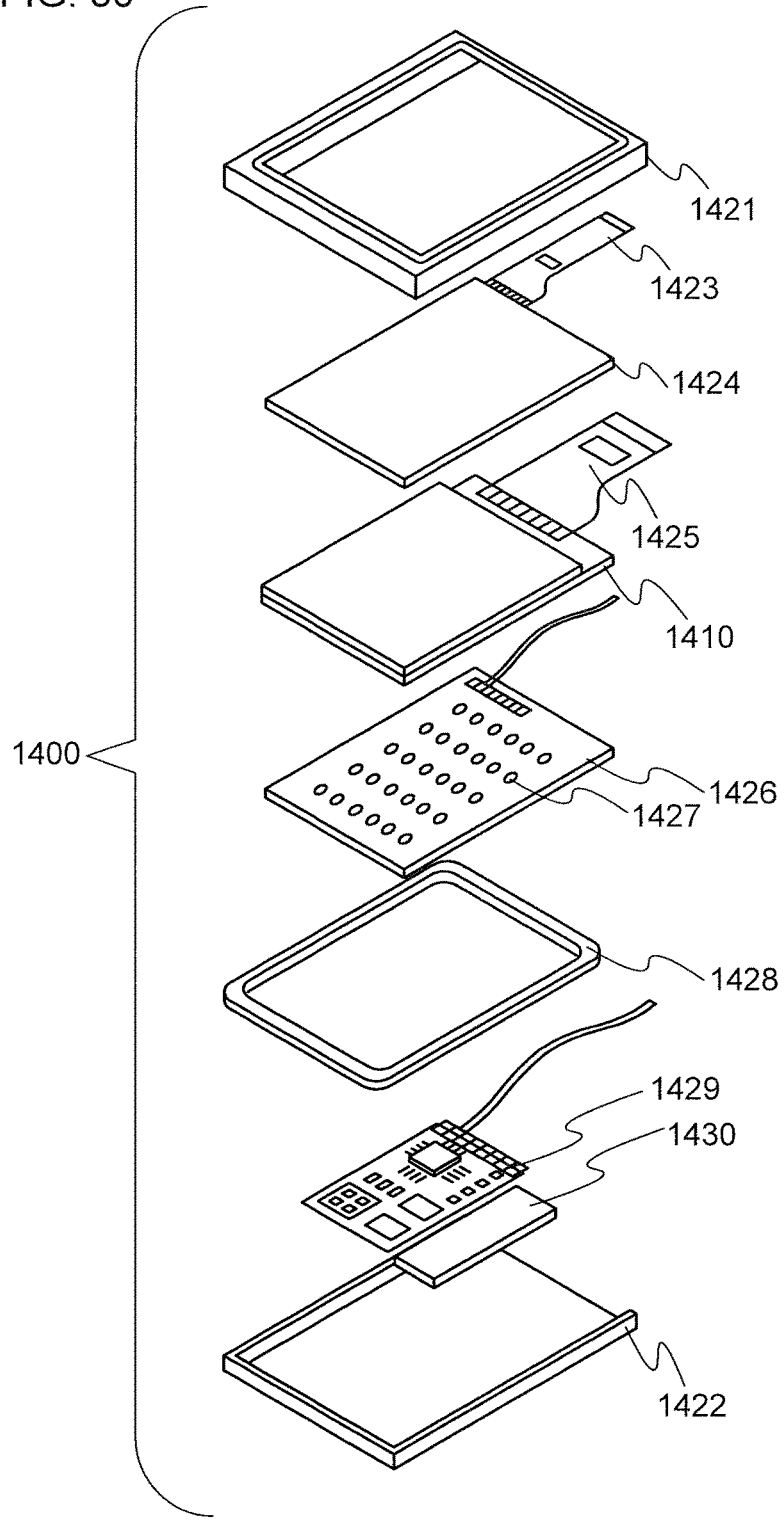
FIG. 30 is a perspective exploded view showing an example of a display device.

The PLL is incorporated so that a clock signal is supplied to a driver circuit of a display device. FIG. 30 shows an example of the display device. FIG. 30 is an exploded perspective view of the display device.

As shown in FIG. 30, in a display device 1400, a touch panel unit 1424 connected to an FPC 1423, a display panel 1410 connected to an FPC 1425, a backlight unit 1426, a frame 1428, a printed board 1429, and a battery 1430 are provided between an upper cover 1421 and a lower cover 1422. Note that the backlight unit 1426, the battery 1430, the touch panel unit 1424, and the like are not provided in some cases. For example, in the case where the display device 1400 is a reflective liquid crystal display device or an electroluminescent (EL) display device, the backlight unit 1426 is unnecessary. The display device 1400 may be additionally provided with a member such as a polarizing plate, a retardation plate, or a prism sheet.

The shapes and sizes of the upper cover 1421 and the lower cover 1422 can be changed as appropriate in accordance with the sizes of the touch panel unit 1424 and the display panel 1410.

The touch panel unit 1424 can be a resistive touch panel or a capacitive touch panel and may be formed so as to overlap with the display panel 1410. A counter substrate (sealing substrate) of the display panel 1410 can have a touch panel function. Alternatively, a photosensor may be provided in each pixel of the display panel 1410 to form an optical touch panel. An electrode for a touch sensor may be provided in each pixel of the display panel 1410 so that a capacitive touch panel is obtained.

The backlight unit 1426 includes a light source 1427. The light source 1427 may be provided at an end portion of the backlight unit 1426 and a light diffusing plate may be used.

The frame 1428 protects the display panel 1410 and functions as an electromagnetic shield for blocking electromagnetic waves generated by the operation of the printed board 1429. The frame 1428 may function as a radiator plate.

The printed board 1429 is provided with a power supply circuit and a signal processing circuit for outputting a video signal and a clock signal. The PLL is incorporated in the signal processing circuit. A clock signal generated in the PLL is supplied to the driver circuit of the display panel 1410, and the driver circuit of the touch panel unit. As a power source for supplying power to the power supply circuit, an external commercial power source or a power source using the battery 1430 provided separately may be used. The battery 1430 can be omitted in the case of using a commercial power source.

<<Imaging Device>>

The PLL can be incorporated in an imaging device. The PLL supplies a clock signal to a driver circuit for driving a pixel portion.

Figure 31A:
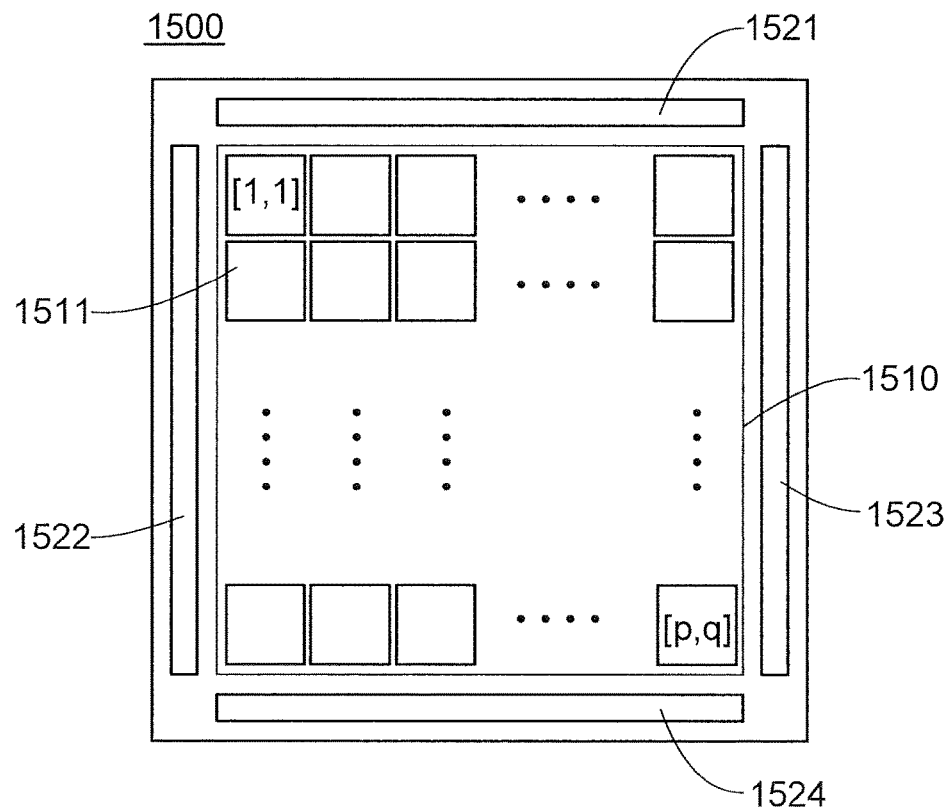
FIGS. 31A and 31B are a block diagram showing a configuration example of an imaging device and a block diagram showing a configuration example of a driving circuit.

An imaging device 1500 in FIG. 31A includes a pixel portion 1510, a driver circuit 1521, a driver circuit 1522, a driver circuit 1523, and a driver circuit 1524.

The pixel portion 1510 includes a plurality of pixels 1511 (imaging elements) arranged in matrix with p rows and q columns (p and q are each a natural number greater than or equal to 2). The driver circuits 1521 to 1524 are each electrically connected to the pixels 1511 and supply signals for driving the pixel portion 1510. The pixels 1511 include photoelectric conversion elements and pixel circuits. The pixel circuit generates an analog signal corresponding to the amount of light received by the photoelectric conversion element.

For example, the driver circuit 1522 or the driver circuit 1523 generates and outputs a selection signal for selecting a pixel 1511 from which a signal is read. Note that the driver circuit 1522 or the driver circuit 1523 is referred to as a row selection circuit or a vertical driver circuit in some cases. In the driver circuits 1521 to 1524, at least one of them may be omitted. For example, when one of the driver circuit 1521 and the driver circuit 1524 additionally has a function of the other of the driver circuit 1521 and the driver circuit 1524, the other of the first peripheral circuit 1521 and the fourth peripheral circuit 1524 may be omitted. For another example, when one of the driver circuit 1522 and the driver circuit 1523 additionally has a function of the other of the driver circuit 1522 and the driver circuit 1523, the other of the driver circuit 1522 and the driver circuit 1523 may be omitted. For another example, when one of the driver circuits 1521 to 1524 additionally has a function of the other of the driver circuits 1521 to 1524, the other of the driver circuits 1521 to 1524 may be omitted.

Figure 31B:
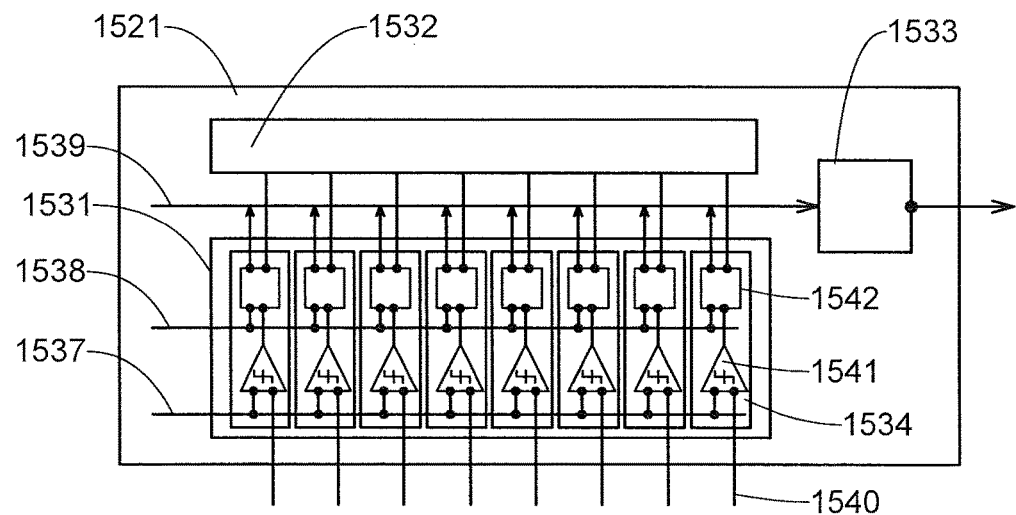

For example, the driver circuit 1521 or the driver circuit 1524 has a function of processing an analog signal output from the pixels 1511. For example, FIG. 31B shows a structure example of the driver circuit 1521. The driver circuit 1521 in FIG. 31B may include a signal processing circuit 1531, a column driver circuit 1532, an output circuit 1533, and the like.

The signal processing circuit 1531 includes a circuit 1534 provided for each column. The circuit 1534 can have a function of performing signal processing such as removal of noise and analog-digital conversion. The circuit 1534 shown in FIG. 31B has a function of analog-digital conversion. The signal processing circuit 1531 can function as a column-parallel (column type) analog-digital conversion device.

The circuit 1534 includes a comparator 1541 and a counter circuit 1542. The comparator 1541 has a function of comparing potentials of an analog signal input from a wiring 1540 that is provided in each column and a reference potential signal (e.g., a ramp wave signal) input from a wiring 1537. A clock signal is input to a wiring 1538 from the PLL. The counter circuit 1542 has a function of measuring the length of a period during which a first value is output by the comparison operation in the comparator 1541 and holding the measurement result as an N-bit digital value.

The column driver circuit 1532 is also referred to as a column selection circuit, a horizontal driver circuit, or the like. The column driver circuit 1532 generates a selection signal for selecting a column from which a signal is read. The column driver circuit 1532 can be formed using a shift register or the like. Columns are sequentially selected by the column driver circuit 1532, and a signal output from the circuit 1534 in the selected column is input to the output circuit 1533 via a wiring 1539. The wiring 1539 can function as a horizontal transfer line.

A signal input to the output circuit 1533 is processed in the output circuit 1533, and is output outside the imaging device 1500. The output circuit 1533 can be formed using a buffer circuit, for example. The output circuit 1533 may have a function of controlling the timing at which a signal is output outside the imaging device 1500.

<Electronic Device>

The variety of processing units and the semiconductor device such as a display device can be incorporated in various electronic devices. For example, the wireless chip shown in FIG. 26 is incorporated, so that an electronic device can have a wireless communication function. For example, the display device shown in FIG. 30 is incorporated, so that an electronic device can have an information display function. For example, the imaging device shown in FIG. 31A is incorporated, so that an electronic device can have an imaging function.

Electronic devices in a wide variety of fields such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy can be given as examples of the electronic device. Such an electronic device can be used for display devices, personal computers (PCs), or image reproducing devices provided with recording media (typically, devices which reproduce the content of recording media such as digital versatile discs (DVDs) and blue-ray discs and have displays for displaying the reproduced images). Other examples of the electronic device are mobile phones, game machines including portable game machines, portable data appliances, e-book readers, cameras (e.g., video cameras and digital still cameras), wearable display devices or terminals (e.g., head mounted display devices, goggle-type display devices, glasses-type display devices, armband display devices, bracelet-type display devices, and necklace-type display devices), navigation systems, audio reproducing devices (e.g., car audio systems and digital audio players), copiers, facsimiles, printers, multifunction printers, automated teller machines (ATM), vending machines, health-related devices (e.g., blood-pressure meters, blood sugar level measuring devices, pedometers, and weight meters). FIGS. 32A to 32H show examples of the electronic device.

Figure 32A:
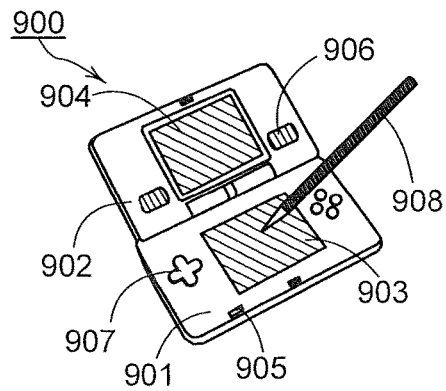
FIGS. 32A to 32H show structure examples of electronic devices.

A portable game machine 900 shown in FIG. 32A includes a housing 901, a housing 902, a display portion 903, a display portion 904, a microphone 905, a speaker 906, an operation key 907, and the like. The display portion 903 is provided with a touch screen as an input device, which can be handled with a stylus 908 or the like.

Figure 32B:
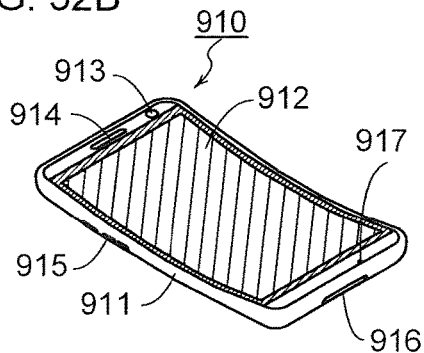

An information terminal 910 shown in FIG. 32B includes a housing 911, a display portion 912, a microphone 917, a speaker portion 914, a camera 913, an external connection portion 916, an operation button 915, and the like. A display panel that uses a flexible substrate and a touch screen are provided in the display portion 912. The information terminal 910 can be used as, for example, a smartphone, a mobile phone, a tablet information terminal, a tablet PC, or an e-book reader.

Figure 32C:
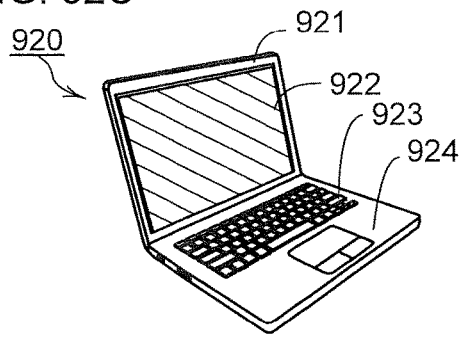

A notebook PC 920 shown in FIG. 32C includes a housing 921, a display portion 922, a keyboard 923, a pointing device 924, and the like.

Figure 32D:
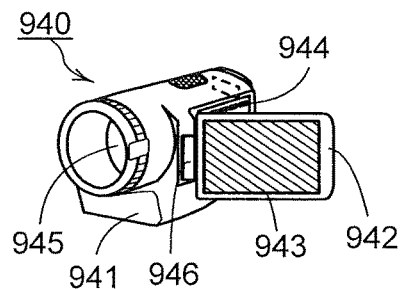

A video camera 940 shown in FIG. 32D includes a housing 941, a housing 942, a display portion 943, operation keys 944, a lens 945, a joint 946, and the like. The operation keys 944 and the lens 945 are provided in the housing 941, and the display portion 943 is provided in the housing 942. The housing 941 and the housing 942 are connected to each other with the joint 946, and an angle between the housing 941 and the housing 942 can be changed with the joint 946. The direction of an image on the display portion 943 may be changed and display and non-display of an image may be switched depending on the angle between the housings 941 and 942.

Figure 32E:
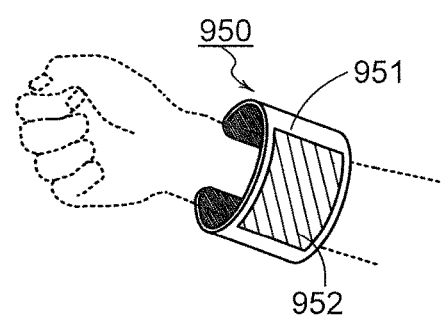

FIG. 32E illustrates an example of a bangle-type information terminal. An information terminal 950 includes a housing 951, a display portion 952, and the like. The display portion 952 is supported by the housing 951 having a curved surface. A display panel formed with a flexible substrate is provided in the display portion 952, whereby the information terminal 950 that is flexible and lightweight and has improved convenience can be provided.

Figure 32F:
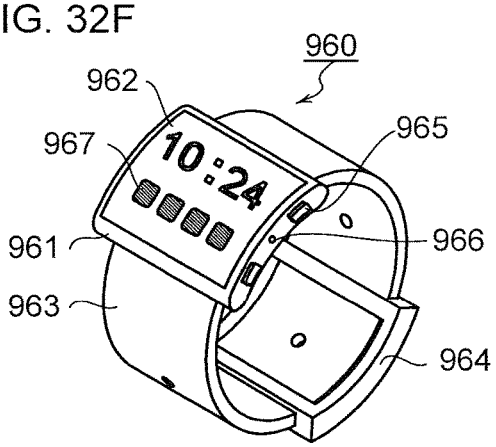

FIG. 32F illustrates an example of a watch-type information terminal. An information terminal 960 includes a housing 961, a display portion 962, a band 963, a buckle 964, an operation button 965, an input/output terminal 966, and the like. The information terminal 960 is capable of executing a variety of applications such as mobile phone calls, e-mailing, viewing and editing texts, music reproduction, Internet communication, and computer games.

The display surface of the display portion 962 is bent, and images can be displayed on the bent display surface. Further, the display portion 962 includes a touch sensor, and operation can be performed by touching the screen with a finger, a stylus, or the like. For example, by touching an icon 967 displayed on the display portion 962, an application can be started. With the operation button 965, a variety of functions such as time setting, power ON/OFF, ON/OFF of wireless communication, setting and cancellation of manner mode, and setting and cancellation of power saving mode can be performed. For example, the functions of the operation button 965 can be set by setting the operating system incorporated in the information terminal 960.

The information terminal 960 can employ near field communication that is a communication method based on an existing communication standard. In that case, for example, mutual communication between the information terminal 960 and a headset capable of wireless communication can be performed, and thus hands-free calling is possible. Moreover, the information terminal 960 includes the input/output terminal 966, and data can be directly transmitted to and received from another information terminal via a connector. Power charging through the input/output terminal 966 is possible. Note that the charging operation may be performed by wireless power feeding without using the input/output terminal 966.

Figure 32G:
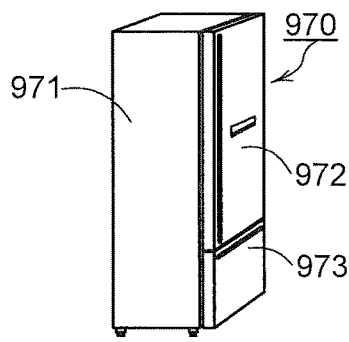

FIG. 32G illustrates an electric refrigerator-freezer as an example of a home electronic device. An electric refrigerator-freezer 970 includes a housing 971, a refrigerator door 972, a freezer door 973, and the like.

Figure 32H:
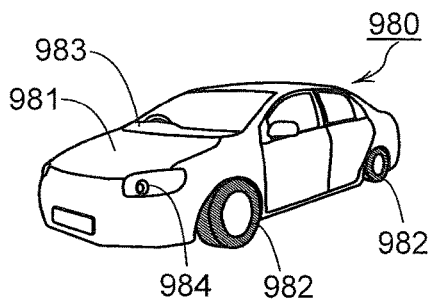

FIG. 32H illustrates a structure example of a motor vehicle. A motor vehicle 980 includes a car body 981, wheels 982, a dashboard 983, lights 984, and the like.

(Embodiment 3)

In this embodiment, a level shift circuit is described. The level shift circuit in this embodiment can be used as the circuit 80 or the circuit 85 in the oscillator circuit described in Embodiment 1. Note that the circuit configuration of the level shift circuit that can be used as the oscillator circuit in Embodiment 1 is not limited to that described in this embodiment.

<<Configuration Example 1 of Level Shift Circuit>>

Figure 33:
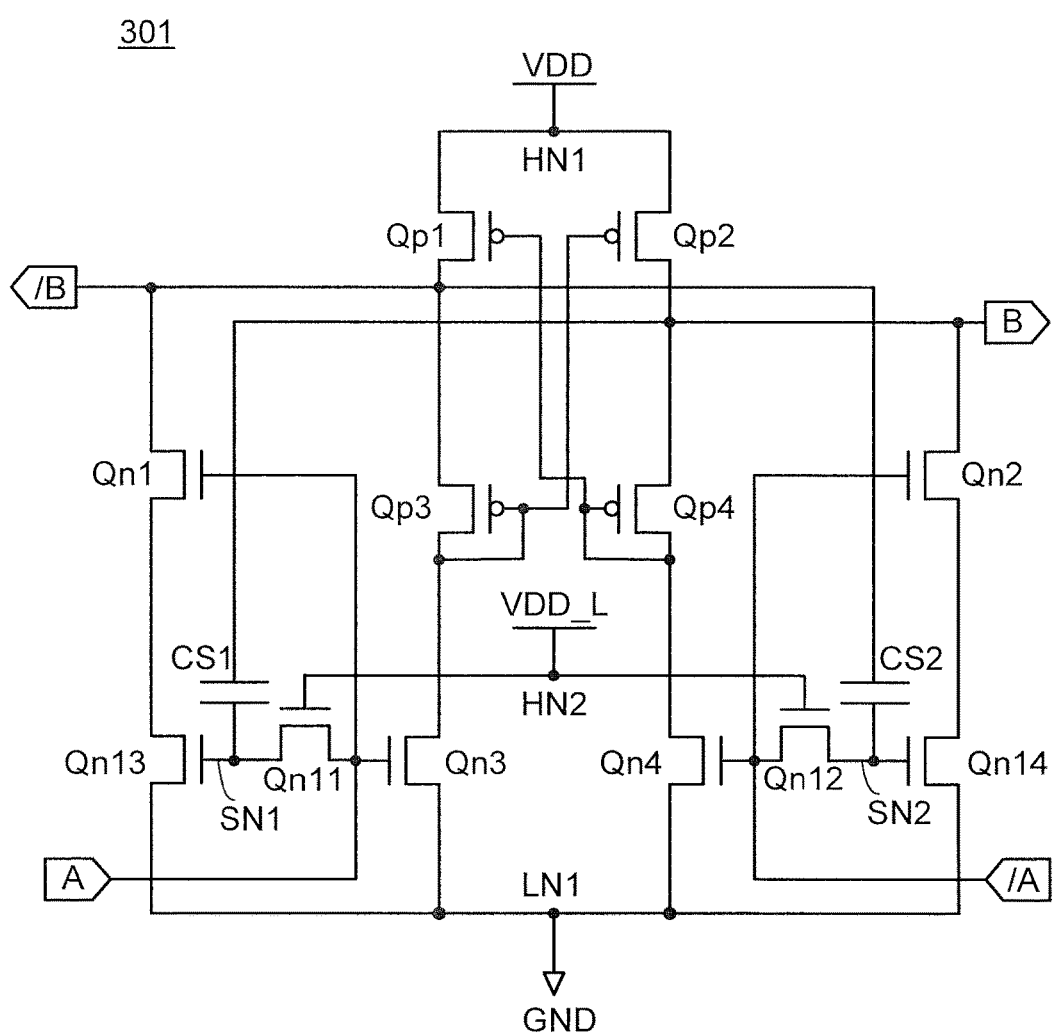
FIG. 33 is a circuit diagram showing a configuration example of a level shift circuit.

A level shift circuit 301 in FIG. 33 can be used as the circuit 80 (see FIG. 1).

In the level shift circuit 301, a node HN1, a node HN2, and a node LN1 are input nodes for power supply potentials. The node HN1 and the node HN2 are input nodes for high power supply potentials. A VDD is input to the node HN1 and a VDD_L is input to the node HN2. The VDD_L is lower than the VDD. The node A and the node/A are signal input nodes. To the node/A, a signal whose potential level is inverted from that of a signal input to the node A is input. A node B and a node/B are signal output nodes. From the node B, a signal obtained by level shifting the input signal of the node A is output, and from the node/B, a signal obtained by level shifting the input signal of the node/A is output.

When the level shift circuit 301 is used as the circuit 101 (FIG. 1), the node HN2 is electrically connected to the node ND9 of the circuit 90. The node A is electrically connected to the node ND11 of the circuit 11, the node/A is electrically connected to the circuit 30[n+1], and the node B is electrically connected to the input node of the buffer circuit 81.

Transistors Qn11 to Qn14 preferably have extremely low off-state. For examples, OS transistors are used as the transistors Qn11 to Qn14. There is no particular limitation on the other transistors (transistors Qn1 to Qn4 and transistors Qp1 to Qp4). For example, transistors (Si transistors) whose channels are formed using silicon can be used.

The transistor Qp3, which is a diode-connected transistor, has a function of limiting supply of the potential of the VDD through the transistor Qp1 so as not to raise the potential of the gate to the potential of the VDD, leading to easy supply of the potential of the GND to the node/B through the Qn3. The function of the Qp4, which is a diode-connected transistor, has the same function, and has a function of facilitating the supply of the potential of the GND to the node B through the transistor Qn4.

The transistor Qn1 has a function of being off more quickly than the transistor Qn13 to prevent flow-through current. Furthermore, the transistor Qn2 has a function of being off more quickly than the transistor Qn14 to prevent flow-through current.

The transistor Qn11 has a function of keeping the potential of the node SN1 at a potential higher than the VDD_L. This is because the transistor Qn11 is turned off when the potential of the node A is at a high level and the potential of SN1 is increased to a potential higher than the potential of the VDD_L by capacitive coupling. The transistor Qn12 functions in a similar manner and the transistor Qn12 also holds the potential of the node Sn2 higher than the potential of VDD_L.

When the transistors Qn13 and the transistor Qn14 are turned off, the node SN1 and the node SN2 are in an electrically floating state. The use of transistors with extremely low off-state current as the transistor Qn13 and the transistor Qn14 can suppress changes in the potentials of the node SN1 and the node SN2.

The node SN1 and the node B are capacitively coupled to each other via the capacitor CS1; therefore, the potential of the node SN1 can be increased by the potential of the node B. That is, the capacitor CS1 enables an increase in the on-state current of the transistor QN13. When on-state current needed for the transistor Qn13 can be obtained by an increase in the potential of the node SN1 with parasitic capacitance of the node SN1, the capacitor CS1 is not necessarily provided. The capacitor CS2 functions in a similar manner to that of the capacitor CS1 and has a function of increasing the potential of the node SN2.

In the level shift circuit 301, an n-channel Si transistor and an OS transistor are connected in series between an output node and a low potential input node of a signal, and a potential of a gate of the OS transistor is increased to a potential higher than a high level potential of the input signal by the capacitive coupling. Thus, on-state current of the OS transistor can be increased and level-shift operation can be performed at a high speed.

<Modification Example 1>

Figure 34:
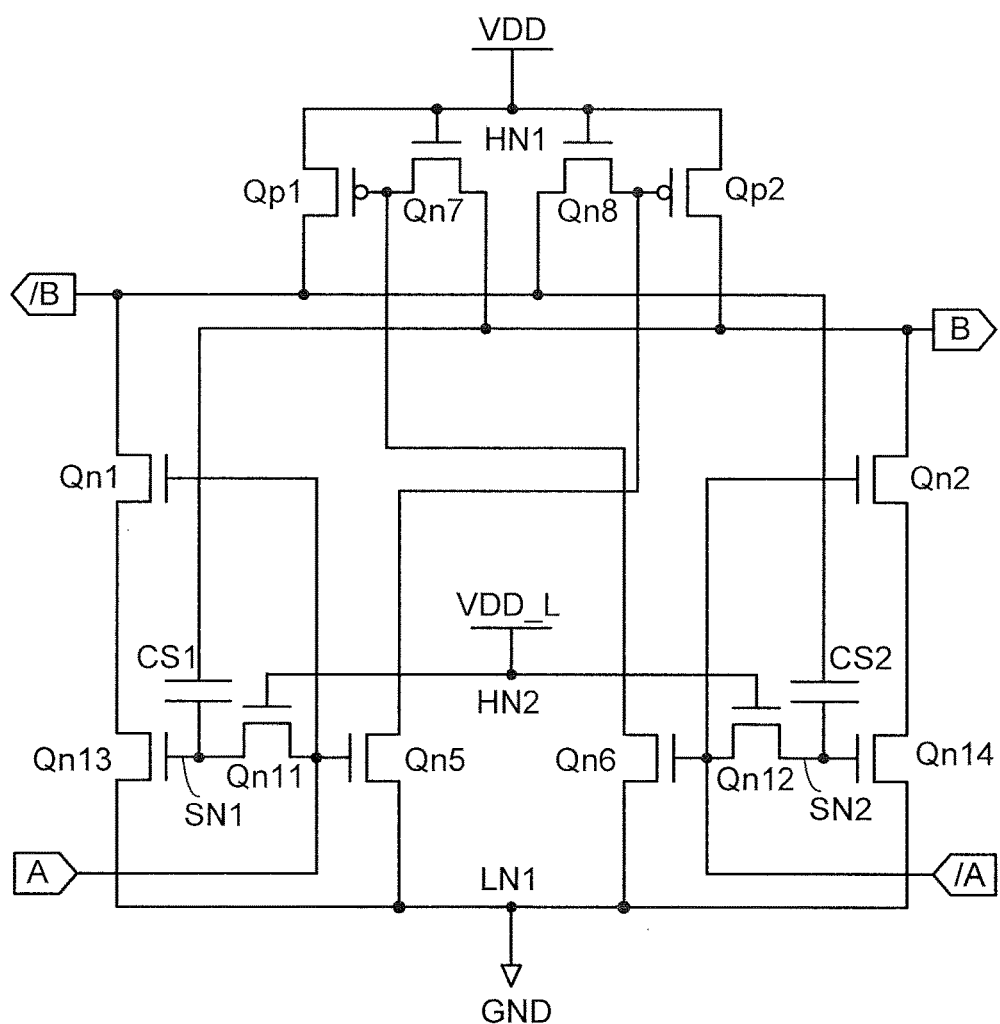
FIG. 34 is a circuit diagram showing a configuration example of a level shift circuit.

A level shift circuit 302 shown in FIG. 34 is a modification example of the level shift circuit 301. As shown in FIG. 34, transistors Qn5, Qn6, Qn7, and Qn8 are provided, and the transistors Qp3, Qp4, Qn3, and Qn4 are not provided.

The GND is supplied to a gate of the transistor Qp1 through the transistor Qn6 and the GND is supplied to the gate of the transistor Qp2 through the transistor Qn5, so that level-shift operation of the level shift circuit 302 can be performed at a high speed.

The transistor Qn7 and the transistor Qn8 can function as variable resistors. On-state resistance of each of the transistor Qn5 and the transistor Qn6 is changed by the potential difference between the node B and the node/B.

<Modification Example 2>

Figure 35:
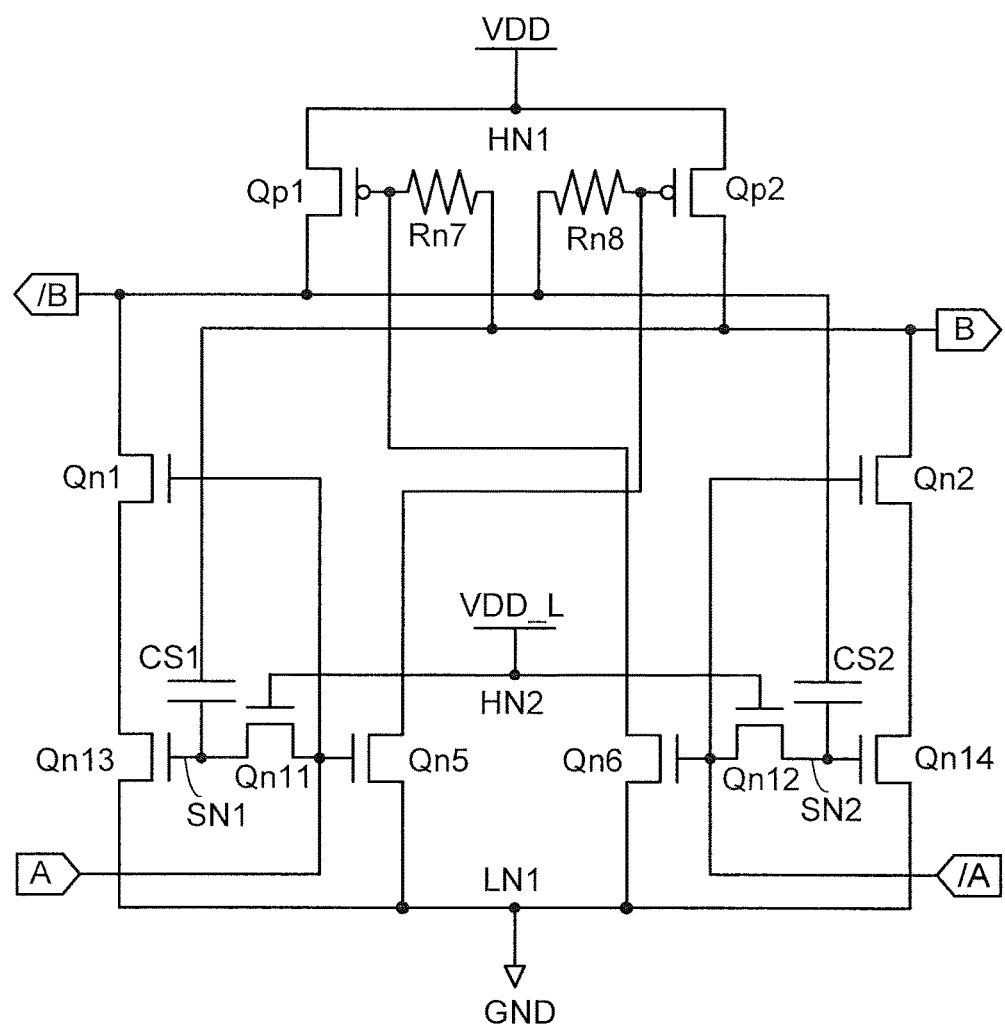
FIG. 35 is a circuit diagram showing a configuration example of a level shift circuit.

A level shift circuit 303 shown in FIG. 35 is a modification example of the level shift circuit 302. Resistors Rn7 and Rn8 are provided instead of the transistors Qn7 and Qn8.

<Modification Example 3>

Figure 36:
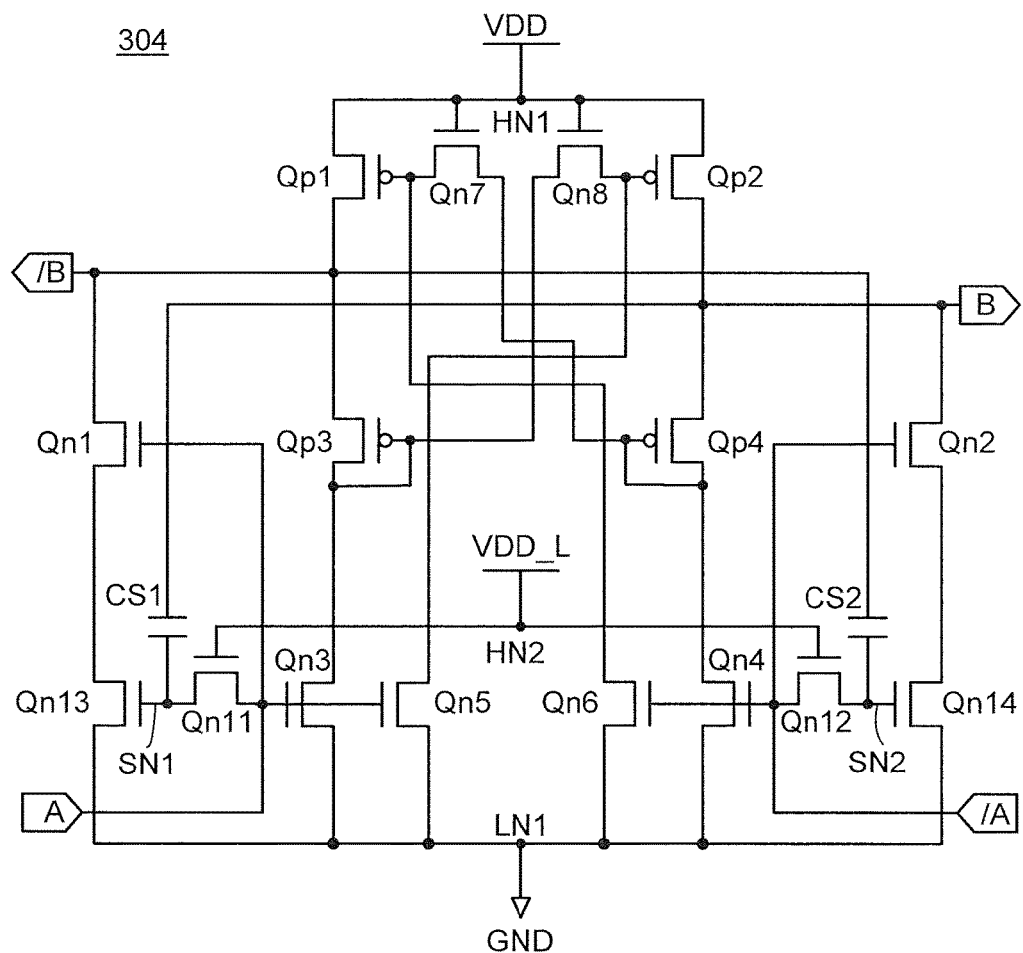
FIG. 36 is a circuit diagram showing a configuration example of a level shift circuit.

A level shift circuit 304 shown in FIG. 36 is a modification example of the level shift circuit 301. The level shift circuit 304 is the one in which the transistors Qn5 to Qn8 are added to the level shift circuit 301.

<<Configuration Example 2 of Level Shift Circuit>>

Figure 37A:
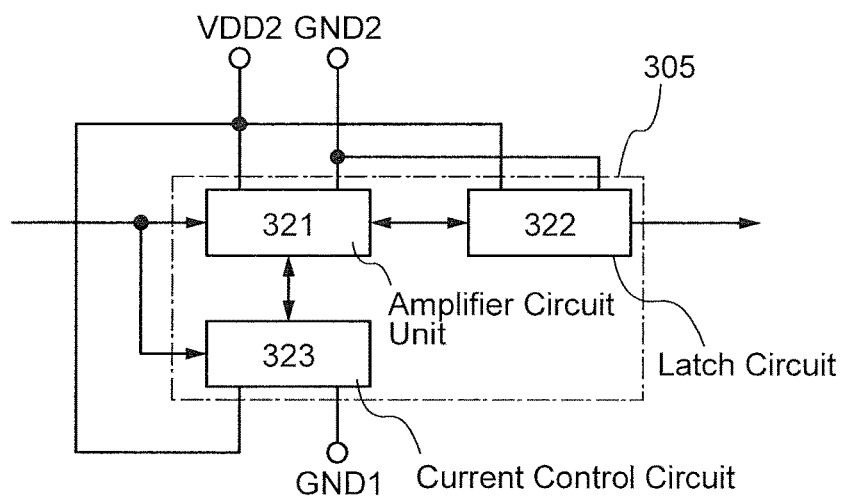
FIGS. 37A and 37B are block diagrams each showing a configuration example of a level shift circuit.

FIG. 37A shows an example of a level shift circuit. A level shift circuit 305 shown in FIG. 37A can be used as the circuit 85 in the circuit 100 (see FIG. 3)

FIG. 37A is a block diagram of the level shift circuit 305. The level shift circuit 305 includes an amplifier circuit unit 321, a latch circuit 322, and a current control circuit 323. In the amplifier circuit unit 321, the latch circuit 322, and the current control circuit 323, a high power supply potential is VDD2. In the amplifier circuit unit 321 and the latch circuit 322, a low power supply potential is GND2. In the current control circuit 323, a low power supply potential is GND1. Note that VDD2 is higher than VDD and a relation of GND2<GND1<VDD<VDD2 is satisfied.

Figure 38:
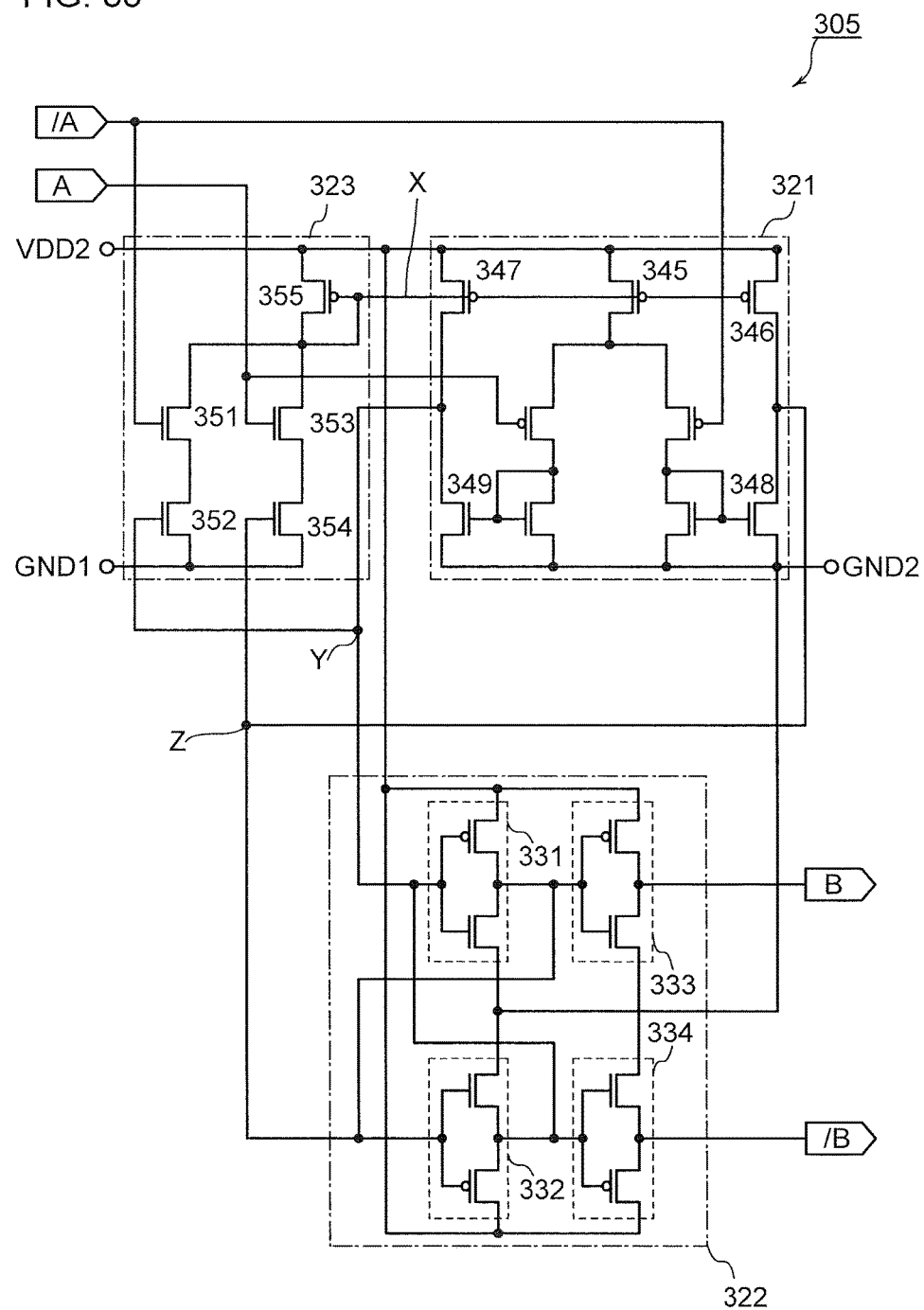
FIG. 38 is a circuit diagram showing a configuration example of a level shift circuit.

FIG. 38 shows an example of a circuit configuration of the level shift circuit 305. For example, when GND2 is −0.5 V, GND1 is 0 V, VDD is +0.2 V, and VDD2 is +2.5 V, a signal at an amplitude of 3 V can be output from the node B (and the node/B) if the amplitude of the input signal of the node A (and the node/A) is 0.2 V.

The potential of a node Y (or a node Z) corresponds to the potential of the node A and is output via the amplifier circuit unit 321 and the like. Thus, the potential of the node Y changes with respect to the change in the potential of the node A after a certain period (hereinafter this period is referred to as a transition period.)

For example, the case where the potential of the node A changes from VDD to GND1 is described. Here, the potential of the node Y changes from VDD2 to GND2. Further, the potential of the node/A changes from GND1 to VDD1 in the above-described transition period; thus, a period during which the potential of the terminal Y remains at VDD2 (or a potential close to VDD2) occurs after the node/A changes to VDD. That is, a period during which the transistors 351 and 352 are ON at the same time occurs. As a result, the potential of a node X is decreased.

Furthermore, the case where the potential of the node A changes from GND1 to VDD is described. Here, the potential of the terminal Z changes from VDD2 to GND2. The potential of the node A changes from GND1 to VDD1 in the transition period; thus, a period during which the potential of the node Z remains at VDD2 (or a potential close to VDD2) occurs after the node A changes to VDD. That is, a period during which the transistors 353 and 354 are ON at the same time occurs. As a result, the potential of the terminal X is decreased.

After the transition period, the holding period starts. The transistor 355 has a function of increasing the potential of the node X again in the holding period, after the potential of the node X decreases in the transition period.

In this manner, the potential of the node X decreases only when the potential of the node A changes (during a certain period after the change), and after a while, the potential of the node X increases and returns to the original state. The transistor 345 is turned on only when the potential of the node X decreases; thus, the amplifier circuit 321 operates only when the transistor 345 is on and does not operate in the other periods. Accordingly, current consumption can be suppressed.

How the potentials of the nodes Y and Z change with respect to the change in the potential of the node A (and the node/A) depends on the difference in the driving capability of the two inverters 331 and 332 in the latch circuit 322 and the transistors 346 to 349 of amplification stages of the amplifier circuit unit 321.

In other words, when the driving capability of the transistors 346 to 349 in the amplifier circuit unit 321 is higher than that of the transistors in the inverters 331 and 332, the potentials of the terminals Y and Z can correspond to those of the node A and the node/A, respectively. In contrast, when the driving capability of the transistors 346 to 349 is lower than that of the transistors in the inverters 331 and 332, the potentials of the terminals Y and Z cannot correspond to those of the node A and the node/A in some cases. Thus, to lower the driving capability, it is preferable to make the channel widths of the transistors in the inverters 331 and 332 shorter than those of the transistors 346 to 349.

Note that it is possible to increase the driving capability by making the channel widths of the transistors in the inverters 333 and 334 longer than those of the transistors in the inverters 333 and 334.

<Modification Example>

Figure 37B:
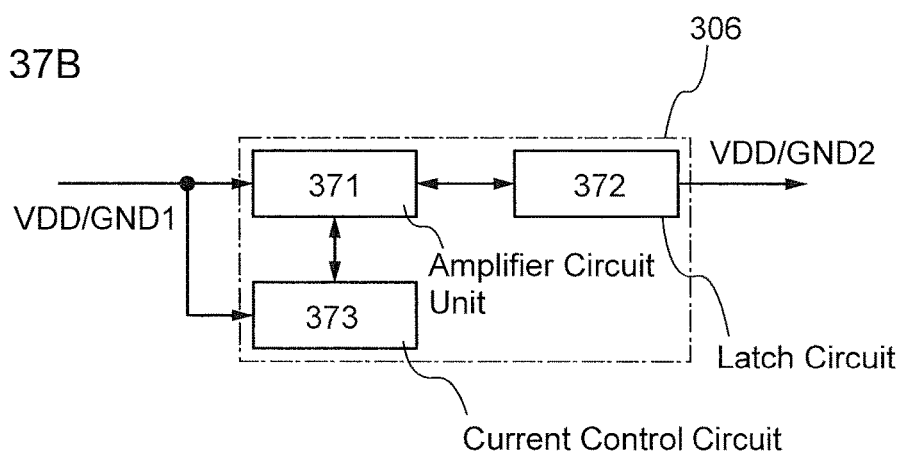

FIG. 37B shows a modification example of the level shift circuit 305. A level shift circuit 306 shown in FIG. 37B can be used as the circuit 85 in the circuit 100 (see FIG. 3). In the case of using the level shift circuit 306, a basic circuit of the ring oscillator circuit can be formed using the circuits 35 and 37 in FIGS. 20A and 20C.

The level shift circuit 306 includes an amplifier circuit unit 371, a latch circuit 372, and a current control circuit 373. In each of the amplifier circuit unit 371, the latch circuit 372, and the current control circuit 373, a high potential is VDD and a low potential is GND2. The amplitude of a signal input to the amplifier circuit unit 371 and the current control circuit 373 is lower than or equal to VDD−GND1. Note that a relation of GND□<GND1<VDD is satisfied. Furthermore, a difference between the GND2 and the GND1 may be larger than the threshold voltage of a transistor to be used. In addition, a relation of VDD−GND1<−GND1−GND2 is possible, for example.

Figure 39:
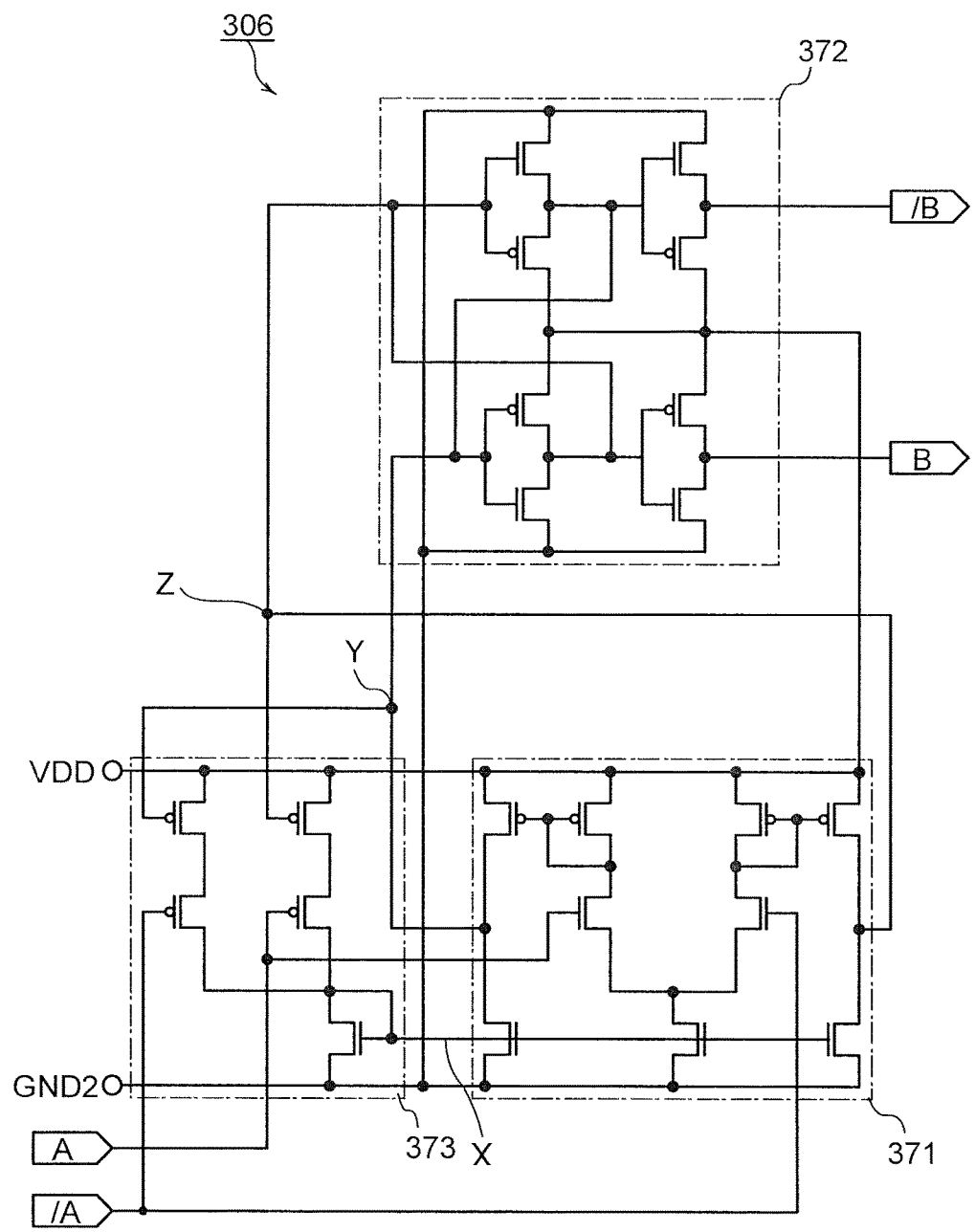
FIG. 39 is a circuit diagram showing a configuration example of a level shift circuit.

FIG. 39 shows an example of a circuit configuration of the level shift circuit 306. As shown in FIG. 39, the amplifier circuit unit 371 and the current control circuit 373 correspond to circuits in which the conductivity types of the transistors of the amplifier circuit unit 321 and the current control circuit 323 are exchanged, respectively. The latch circuit 372 has a circuit configuration similar to that of the latch circuit 322. Thus, the description of the level shift circuit 305 is referred to for the configuration and the like of the level shift circuit 306.

<<Configuration Example 3 of Level Shift Circuit>>

Figure 40:
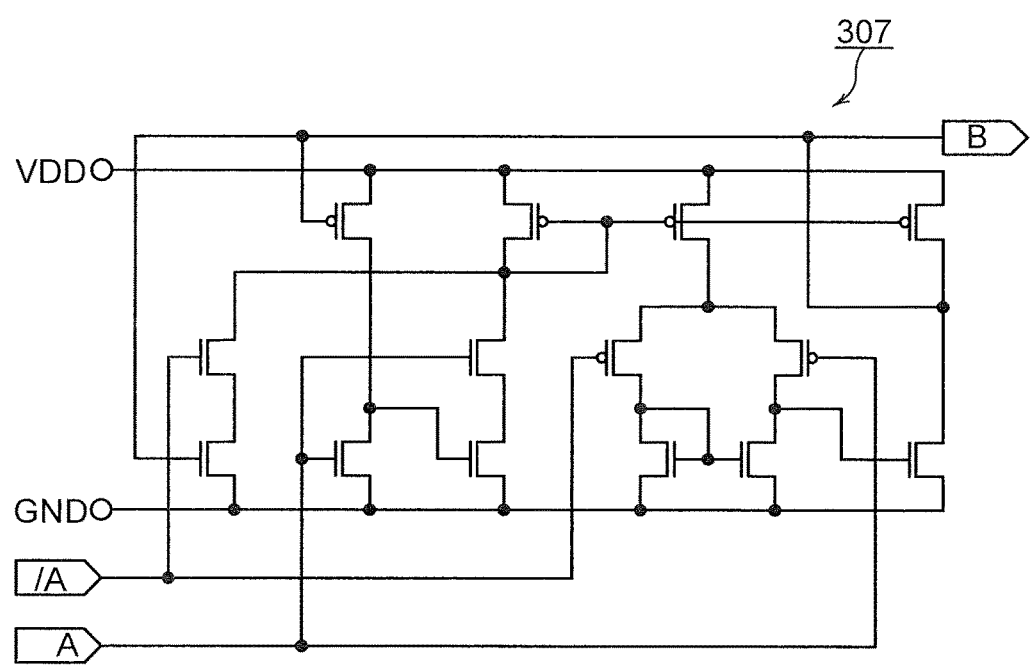
FIG. 40 is a circuit diagram showing a configuration example of a level shift circuit.

FIG. 40 shows an example of a level shift circuit. A circuit 307 in FIG. 40 can be used as the circuit 85 (see FIG. 3).

(Embodiment 4)

In this embodiment, an oxide semiconductor, an OS transistor, and the like are described.

<<Structure Example 1 of OS Transistor>>

Figure 41A:
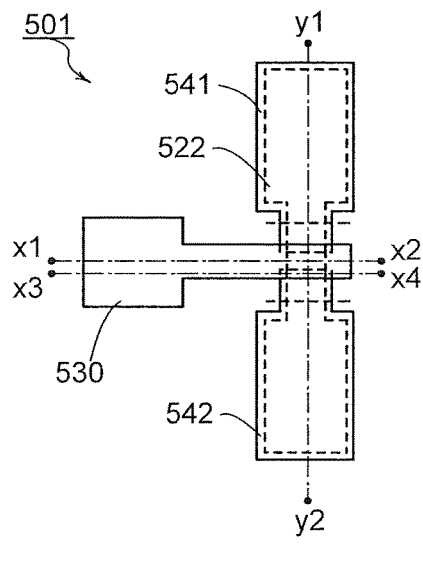
FIGS. 41A to 41D illustrate a structure example of an OS transistor.
Figure 41B:
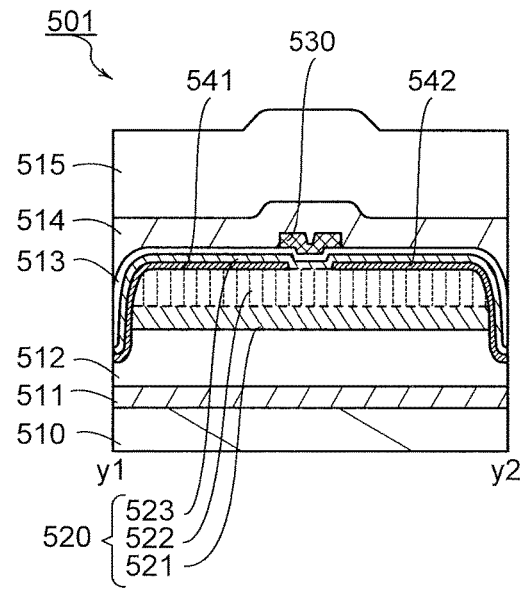
Figure 41C:
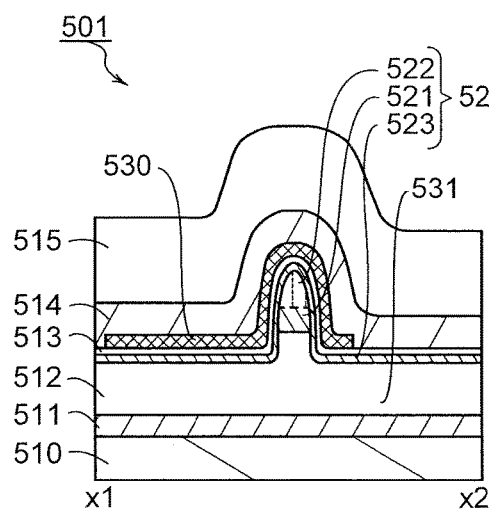
Figure 41D:
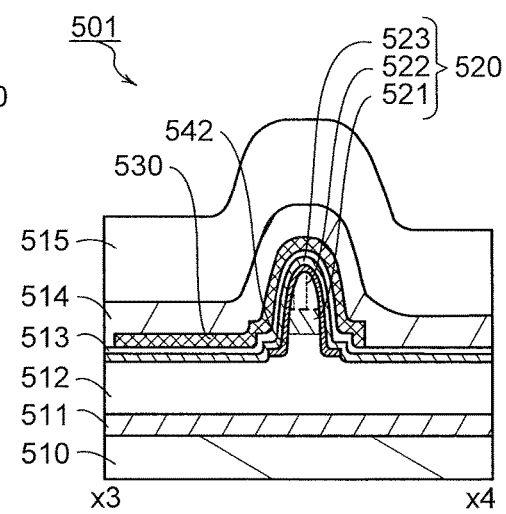

FIGS. 41A to 41D illustrate a structure example of an OS transistor. FIG. 41A is a top view illustrating a structure example of an OS transistor. FIG. 41B is a cross-sectional view taken along a line y1-y2, FIG. 41C is a cross-sectional view taken along a line x1-x2, and FIG. 41D is a cross-sectional view taken along a line x3-x4. Here, in some cases, the direction of the line y1-y2 is referred to as a channel length direction, and the direction of the line x1-x2 is referred to as a channel width direction. Accordingly, FIG. 41B illustrates a cross-sectional structure of the OS transistor in the channel length direction, and FIGS. 41C and 41D each illustrate a cross-sectional structure of the OS transistor in the channel width direction. Note that to clarify the device structure, FIG. 41A does not illustrate some components.

An OS transistor 501 is formed over an insulating surface, here, over an insulating layer 511. The insulating layer 511 is formed over a surface of a substrate 510. The OS transistor 501 is covered with an insulating layer 514 and an insulating layer 515. Note that the insulating layers 514 and 515 may be regarded as components of the OS transistor 501. The OS transistor 501 includes an insulating layer 512, an insulating layer 513, oxide semiconductor (OS) layers 521 to 523, a conductive layer 530, a conductive layer 541, and a conductive layer 542. Here, the OS layers 521, 522, and 523 are collectively referred to as an OS layer 520.

The insulating layer 513 includes a region functioning as a gate insulating layer. The conductive layer 530 functions as a gate electrode. A conductive layer 531 functions as a backgate electrode. A constant potential, the same potential or signal supplied to the conductive layer 530, or a potential or signal that is different from that supplied to the conductive layer 530 may be supplied to the conductive layer 531. The conductive layer 541 and the conductive layer 542 function as a source electrode and a drain electrode.

As illustrated in FIGS. 41B and 41C, the OS layer 520 includes a region where the OS layer 521, the OS layer 522, and the OS layer 523 are stacked in this order. The insulating layer 513 covers this stacked region. The conductive layer 531 overlaps with the stacked region with the insulating layer 513 positioned therebetween. The conductive layer 541 and the conductive layer 542 are provided over the stacked film formed of the OS layer 521 and the OS layer 523 and are in contact with a top surface of this stacked film and a side surface positioned in the channel length direction of the stacked film. In the example of FIGS. 41A to 41D, the conductive layers 541 and 542 are also in contact with the insulating layer 512. The OS layer 523 is formed to cover the OS layers 521 and 522 and the conductive layers 541 and 542. A bottom surface of the OS layer 523 is in contact with a top surface of the OS layer 522.

The conductive layer 530 is formed so as to surround, in the channel width direction, the region where the OS layers 521 to 523 are stacked in the OS layer 520 with the insulating layer 513 positioned therebetween (see FIG. 41C). Therefore, a gate electric field in the vertical direction and a gate electric field in the lateral direction are applied to this stacked region. In the OS transistor 501, "the gate electric field" refers to an electric field generated by voltage applied to the conductive layer 531 (gate electrode layer). Accordingly, the whole stacked region of the OS layers 521 to 523 can be electrically surrounded by the gate electric fields, so that a channel is formed in the whole OS layer 522 (bulk), in some cases. Thus, high on-state current characteristics of the OS transistor 501 can be achieved.

In this specification, a structure of a transistor in which a semiconductor is electrically surrounded by a gate electric field as in the above transistor is referred to as "a surrounded channel (s-channel) structure". The OS transistor 501 has the s-channel structure. With this s-channel structure, a large amount of current can flow between the source and the drain of the transistor, so that a high drain current in an on state (on-state current) can be achieved.

By employing the s-channel structure in the OS transistor 501, channel formation region controllability by a gate electric field applied to the side surface of the OS layer 522 becomes easy. In the structure where the conductive layer 530 reaches below the OS layer 522 and faces the side surface of the OS layer 521, higher controllability can be achieved, which is preferable. Consequently, the subthreshold swing (S value) of the OS transistor 501 can be made small, so that a short-channel effect can be reduced. Therefore, this is suitable for miniaturization.

When an OS transistor has a three-dimensional structure as in the OS transistor 501 illustrated in FIGS. 41A to 41D, the channel length can be less than 100 nm. By miniaturization of the OS transistor, circuit area can be made small. The channel length of the OS transistor is preferably less than 65 nm, further preferably less than or equal to 30 nm or less than or equal to nm.

A conductor functioning as a gate of the transistor is referred to as a gate electrode. A conductor functioning as a source of the transistor is referred to as a source electrode. A conductor functioning as a drain of the transistor is referred to as a drain electrode. A region functioning as a source of the transistor is referred to as a source region. A region functioning as a drain of the transistor is referred to as a drain region. In this specification, a gate electrode is referred to as a gate, a drain electrode or a drain region is referred to as a drain, and a source electrode or a source region is referred to as a source in some cases.

The channel length refers to, for example, a distance between a source and a drain in a region where a semiconductor (or a portion where a current flows in a semiconductor when a transistor is on) and a gate overlap each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

The components of the OS transistors 501 will be described below.

<Substrate>

The substrate 510 is not limited to a simple supporting substrate and may be a substrate where a device such as a transistor is formed. In that case, one of the conductive layers 530, 541, and 542 of the OS transistor 501 may be electrically connected to the device.

<Base Insulating Film>

The insulating layer 511 has a function of preventing impurity diffusion from the substrate 510. The insulating layer 512 preferably has a function of supplying oxygen to the OS layer 520. For this reason, the insulating layer 512 is preferably an insulating film containing oxygen, more preferably, an insulating film containing oxygen in which the oxygen content is higher than that in the stoichiometric composition. For example, a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. can be used. When the substrate 510 is a substrate where a device is formed as described above, the insulating layer 511 is preferably subjected to planarization treatment such as chemical mechanical polishing (CMP) so as to have a flat surface.

The insulating layers 511 and 512 can be formed using an insulating material of aluminum oxide, aluminum oxynitride, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, silicon nitride, silicon nitride oxide, aluminum nitride oxide, or the like, or a mixed material of these materials. In this specification, oxynitride refers to a material which includes more oxygen than nitrogen, and nitride oxide refers to a substance which includes more nitrogen than oxygen.

<Gate Electrode>

The conductive layer 530 is preferably formed using a metal selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), iridium (Ir), strontium (Sr), and platinum (Pt); an alloy of any of these metals; or a compound containing any of these metals as its main component.

The conductive layer 530 may have a single-layer structure or a layered structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The conductive layer 530 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a layered structure formed using the above light-transmitting conductive material and the above metal element.

<Gate Insulating Layer>

The insulating layer 513 is formed using an insulating film having a single-layer structure or a layered structure. The insulating layer 513 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 513 may be a stack including any of the above materials. The insulating layer 513 may contain lanthanum (La), nitrogen, zirconium (Zr), or the like as an impurity. The insulating layer 511 can be formed in a manner similar to that of the insulating layer 513. The insulating layer 513 contains oxygen, nitrogen, silicon, hafnium, or the like, for example. Specifically, the insulating layer 513 preferably contains hafnium oxide, and silicon oxide or silicon oxynitride.

Hafnium oxide has a higher dielectric constant than silicon oxide and silicon oxynitride. Therefore, the insulating layer 513 using hafnium oxide can have larger thickness than the insulating layer 513 using silicon oxide, so that leakage current due to tunnel current can be reduced. That is, a transistor with low off-state current can be provided. Moreover, hafnium oxide with a crystal structure has a higher dielectric constant than hafnium oxide with an amorphous structure. Therefore, it is preferable to use hafnium oxide with a crystal structure in order to provide a transistor with low off-state current. Examples of the crystal structure include a monoclinic crystal structure and a cubic crystal structure. Note that one embodiment of the present invention is not limited to the above examples.

<Source Electrode, Drain Electrode, Backgate Electrode>

The conductive layers 541 and 542 can be formed in a manner similar to that of the conductive layer 530. A Cu—Mn alloy film is preferably used for the conductive layers 541 and 542 because of its low electrical resistance, because it forms manganese oxide at the interface with an oxide semiconductor film when formed in contact with the oxide semiconductor film, and because manganese oxide can prevent Cu diffusion. Furthermore, the conductive layer 531 (see FIG. 42C) can be formed in a manner similar to that of the conductive layer 530.

<Protective Insulating Film>

The insulating layer 514 preferably has a function of blocking oxygen, hydrogen, water, an alkali metal, an alkaline earth metal, and the like. The insulating layer 514 can prevent outward diffusion of oxygen from the OS layer 520 and entry of hydrogen, water, or the like into the OS layer 520 from the outside. The insulating layer 514 can be a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be used.

An aluminum oxide film is preferably used as the insulating layer 514 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the OS layer 520, preventing release of oxygen, which is the main component of the OS layer 520, from the oxide semiconductor, and preventing unnecessary release of oxygen from the insulating layer 512. In addition, oxygen contained in the aluminum oxide film can be diffused into the oxide semiconductor.

<Interlayer Insulating Film>

The insulating layer 515 is preferably formed over the insulating layer 514. The insulating layer 515 can be formed using an insulating film with a single-layer structure or a layered structure. The insulating layer can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

<Oxide Semiconductor Layer>

As the semiconductor material of the OS layers 521 to 523, typically, an In—Ga oxide, an In—Zn oxide, or an In-M-Zn oxide (M is Ga, Y, Sn, Zr, La, Ce, Nd, or the like) is used. The element M is an element having a high bonding energy with oxygen, for example. Typically, the element M is an element whose bonding energy with oxygen is higher than that of indium. Alternatively, the element M is an element that can increase the energy gap of the oxide semiconductor. In addition, the OS layers 521 to 523 are not limited to the oxide layers containing indium. The OS layers 521 to 523 can be formed using a Zn—Sn oxide layer, a Ga—Sn oxide layer, or a Zn—Mg oxide layer, for example. The OS layer 522 is preferably formed using an In-M-Zn oxide. The OS layers 521 and 523 can be formed using a Ga oxide.

The OS layer 522 is not limited to the oxide semiconductor containing indium. The OS layer 522 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the OS layer 522, an oxide with a wide energy gap may be used. The energy gap of the OS layer 522 is, for example, 2.5 eV or larger and 4.2 eV or smaller, preferably 2.8 eV or larger and 3.8 eV or smaller, more preferably 3 eV or larger and 3.5 eV or smaller.

The OS layer 522 is preferably a CAAC-OS film which will be described later. When the oxide semiconductor contains Zn, the oxide semiconductor is easily to be crystallized, for example. Thus, the OS layer 522 preferably contains Zn.

When an interface level is formed at the interface between the OS layer 522 and the OS layer 521, a channel region is formed also in the vicinity of the interface, which causes a change in the threshold voltage of the OS transistor 501. It is preferable that the OS layer 521 contains at least one of the metal elements contained in the OS layer 522. Accordingly, an interface level is unlikely to be formed at the interface between the OS layer 522 and the OS layer 523, and variations in the electrical characteristics of the OS transistor 501, such as the threshold voltage can be reduced.

The OS layer 523 preferably contains at least one of the metal elements contained in the OS layer 522 because interface scattering is unlikely to occur at the interface between the OS layer 522 and the OS layer 523, and carrier transfer is not inhibited. Thus, the field-effect mobility of the OS transistor 501 can be increased.

The OS layers 521, 522, and 523 preferably include at least Indium. In the case of using an In-M-Zn oxide as the OS layer 521, when a summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the OS layer 522, when summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the OS layer 523, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the OS layer 523 may be an oxide that is the same type as that of the OS layer 521. Note that the OS layer 521 and/or the OS layer 523 do/does not necessarily contain indium in some cases. For example, the OS layer 521 and/or the OS layer 523 can be formed using a gallium oxide film.

It is preferable that the OS layer 522 have the highest carrier mobility among the OS layers 521 to 523. Accordingly, a channel can be formed in the OS layer 522 that is apart from the insulating layer 511.

In an oxide containing In such as an In-M-Zn oxide, carrier mobility can be increase by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, whereby carrier mobility can be increased.

When an oxide semiconductor film is deposited by a sputtering method, because of heating of a substrate surface (the surface on which the CAAC-OS is deposited), space heating, or the like, the composition of the film is sometimes different from that of a target as a source or the like. For example, in the case of using a target of an In—Ga—Zn oxide, since zinc oxide sublimates more easily than indium oxide, gallium oxide, or the like, the source and the In—Ga—Zn oxide are likely to have different compositions. Specifically, the content of Zn is smaller than that of the source in the In—Ga—Zn oxide. Thus, the source is preferably selected taking into account the change in composition. Note that a difference between the compositions of the source and the film is also affected by a pressure or a gas used for the deposition as well as a temperature.

In the case where the OS layer 522 is an In-M-Zn oxide formed by a sputtering method, it is preferable that the atomic ratio of metal elements of a target used for depositing the In-M-Zn oxide be In:M:Zn=1:1:1, 3:1:2, or 4:2:4.1. For example, the atomic ratio of metal elements contained in a semiconductor film deposited using a target of In:M:Zn=4:2:4.1 is approximately In:M:Zn=4:2:3.

In the case where each of the OS layers 521 and 523 is an In-M-Zn oxide formed by a sputtering method, it is preferable that the atomic ratio of metal elements of a target used for depositing the In-M-Zn oxide be In:M:Zn=1:3:2 or 1:3:4.

<Energy Band Structure>

Figure 47A:
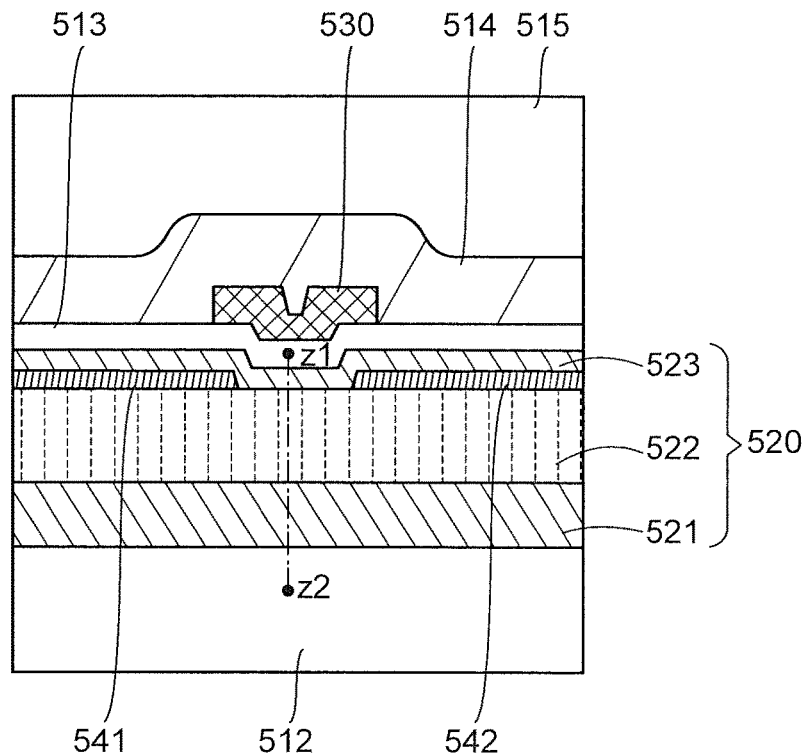
FIG. 47A is an enlarged view of a portion in FIG. 41B
Figure 47B:
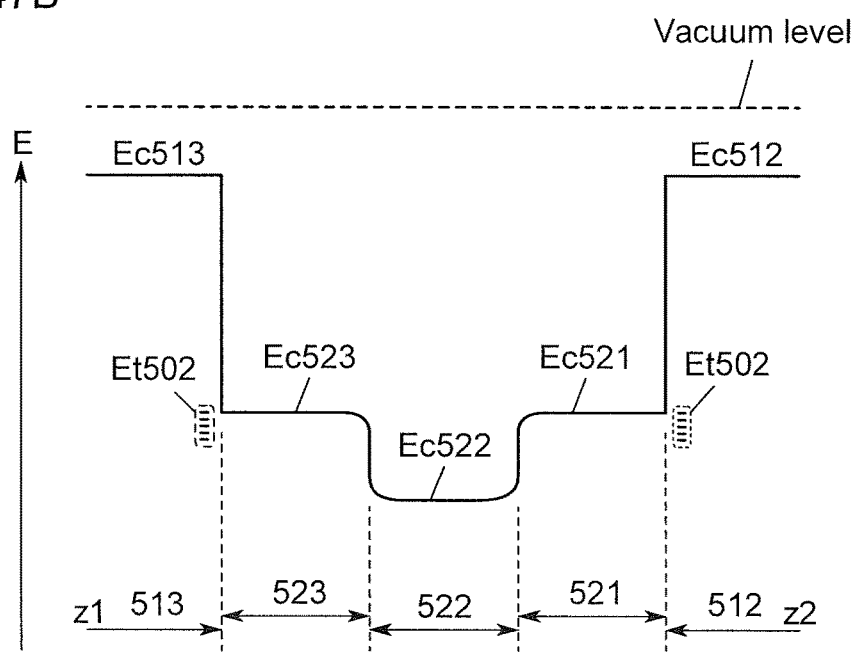
FIG. 47B is an energy band diagram of an OS transistor.

Next, the function and effect of the OS layer 520 in which the OS layers 521, 522, and 523 are stacked are described using an energy band diagram in FIG. 47B. FIG. 47A is an enlarged view of a channel region of the OS transistor 501 in FIG. 41B. FIG. 47B shows an energy band diagram of a portion taken along dotted line z1-z2 (the channel formation region of the OS transistor 501) in FIG. 47A. The OS transistor 501 is described below as an example, but the same applies to the OS transistors 502 to 506.

In FIG. 47B, Ec512, Ec521, Ec522, Ec523, and Ec513 indicate the energy at the bottom of the conduction band of the insulating layer 512, the OS layer 521, the OS layer 522, the OS layer 523, and the insulating layer 513, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Since the insulating layer 512 and the insulating layer 513 are insulators, Ec512 and Ec513 are closer to the vacuum level than Ec521, Ec522, and Ec523 (i.e., the insulating layer 512 and the insulating layer 513 have a smaller electron affinity than the OS layers 521, 522, and 523).

The OS layer 522 is an oxide layer which has a larger electron affinity than the OS layers 521 and 523. For example, as the OS layer 522, an oxide having higher electron affinity than those of the OS layer 521 and the OS layer 523 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

When voltage is applied to the gate (the conductive layer 530) of the transistor, a channel is formed in the OS layer 522 having the highest electron affinity among the OS layers 521, 522, and 523.

An indium gallium oxide has small electron affinity and a high oxygen-blocking property. Therefore, the OS layer 523 preferably contains an indium gallium oxide. The gallium atomic ratio [Ga/(In+Ga)] is, for example, higher than or equal to 70%, preferably higher than or equal to 80%, more preferably higher than or equal to 90%.

Ec521 is closer to the vacuum level than Ec522. Specifically, Ec521 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Ec523 is closer to the vacuum level than Ec522. Specifically, Ec523 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

In some cases, there is a mixed region of the OS layer 521 and the OS layer 522 between the OS layer 521 and OS layer 522. Furthermore, in some cases, there is a mixed region of the OS layer 523 and the OS layer 522 between the OS layer 523 and OS layer 522. Because the mixed region has a low interface state density, a stack of the OS layers 521 to 523 (the OS layer 520) has a band structure where energy at each interface and in the vicinity of the interface is changed continuously (continuous junction).

Electrons transfer mainly through the OS layer 522 in the OS layer 520 having such an energy band structure. Therefore, even if an interface state exists at the interface between the OS layer 521 and the insulating layer 512 or the interface between the OS layer 523 and the insulating layer 513, electron movement in the OS layer 520 is less likely to be inhibited and the on-state current of the transistor can be increased.

Although trap states Et 502 due to impurities or defects might be formed in the vicinity of the interface between the OS layer 521 and the insulating layer 512 and the interface between the OS layer 523 and the insulating layer 513 as illustrated in FIG. 47B, the OS layer 522 can be separated from the trap states Et 502 owing to the existence of the OS layers 521 and 523. In the transistor 501, in the channel width direction, the top surface and side surfaces of the OS layer 522 are in contact with the OS layer 523, and the bottom surface of the OS layer 522 is in contact with the OS layer 521 (see FIG. 41C). Surrounding the OS layer 522 by the OS layers 521 and 523 in this manner can further reduce the influence of the trap states Et 502.

However, when the energy difference between Ec522 and Ec521 or Ec523 is small, an electron in the OS layer 522 might reach the trap state by passing over the energy difference. Since the electron is trapped in the trap level, negative fixed electric charge is caused at the interface with the insulating film; thus, the threshold voltage of the transistor is shifted in a positive direction. Therefore, each of the energy gaps between Ec521 and Ec522 and between Ec522 and Ec523 is preferably 0.1 eV or more, or further preferably 0.15 eV or more, in which case a change in the threshold voltage of the OS transistor 501 can be reduced and the OS transistor 501 can have favorable electrical characteristics.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in the channel formation region is large. The electron movement is also inhibited, for example, in the case where the density of defect states is high in a region where a channel is formed.

To increase the on-state current of the OS transistor 501, for example, root mean square (RMS) roughness with a measurement area of 1 μm×1 μm of a top surface or a bottom surface of the OS layer 522 (a formation surface; here, the OS layer 521) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P–V can be measured using a scanning probe microscope SPA-500 manufactured by SII Nano Technology Inc.

For example, in the case where the OS layer 522 contains oxygen vacancies (also denoted by $V_O$), donor levels are formed by entry of hydrogen into sites of oxygen vacancies in some cases. A state in which hydrogen enters sites of oxygen vacancies are denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the OS layer 522, the on-state current of the transistor can be increased in some cases. For example, the hydrogen concentration at a certain depth in the OS layer 522 or in a certain region of the OS layer 522, which is measured by secondary ion mass spectrometry (SIMS), is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$.

To decrease oxygen vacancies in the OS layer 522, for example, there is a method in which excess oxygen in the insulating film 512 is moved to the OS layer 522 through the OS layer 521. In this case, the OS layer 521 is preferably a layer having an oxygen-transmitting property (a layer through which oxygen passes or is transmitted).

In the case where the OS transistor 501 has an s-channel structure, a channel is formed in the whole of the OS layer 522. Therefore, as the OS layer 522 has a larger thickness, a channel region becomes larger. In other words, the thicker the OS layer 522 is, the larger the on-state current of the transistor is. For example, the OS layer 522 has a region with a thickness of greater than or equal to 20 nm, greater than or equal to 40 nm, greater than or equal to 60 nm, or greater than or equal to 100 nm. Note that the OS layer 522 has a region with a thickness of, for example, less than or equal to 300 nm, preferably less than or equal to 200 nm, more preferably less than or equal to 150 nm because the productivity of the semiconductor device might be decreased.

Moreover, the thickness of the OS layer 523 is preferably as small as possible to increase the on-state current of the transistor. The thickness of the OS layer 523 is less than 10 nm, preferably less than or equal to 5 nm, or further preferably less than or equal to 3 nm, for example. Meanwhile, the OS layer 523 has a function of blocking entry of elements other than oxygen (such as hydrogen and silicon) included in the adjacent insulator into the OS layer 522. For example, the OS layer 523 has a region with a thickness of greater than or equal to 0.3 nm, preferably greater than or equal to 1 nm, more preferably greater than or equal to 2 nm. The OS layer 523 preferably has an oxygen blocking property to suppress outward diffusion of oxygen released from the insulating film 512 and the like.

To improve reliability, preferably, the thickness of the OS layer 521 is large and the thickness of the OS layer 523 is small. For example, the OS layer 521 has a region with a thickness of, for example, greater than or equal to 10 nm, preferably greater than or equal to 20 nm, more preferably greater than or equal to 40 nm, still more preferably greater than or equal to 60 nm. When the thickness of the OS layer 521 is made large, a distance from an interface between the adjacent insulator and the OS layer 521 to the OS layer 522 in which a channel is formed can be large. Since the productivity of the semiconductor device might be decreased, the OS layer 521 has a region with a thickness of, for example, less than or equal to 200 nm, preferably less than or equal to 120 nm, more preferably less than or equal to 80 nm.

In order that an OS transistor in which a channel is formed in an oxide semiconductor have stable electrical characteristics, it is effective to make the oxide semiconductor intrinsic or substantially intrinsic by reducing the concentration of impurities in the oxide semiconductor.

The term "substantially intrinsic" refers to a state where an oxide semiconductor has a carrier density lower than $1\times10^{17}$/cm$^3$, preferably lower than $1\times10^{15}$/cm$^3$, more preferably lower than $1\times10^{13}$/cm$^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the OS layers 521, 522, and 523 and at interfaces between the OS layers.

In order to make the oxide semiconductor intrinsic or substantially intrinsic, for example, the concentration of silicon at a certain depth of the oxide semiconductor or in a region of the oxide semiconductor, which is measured by SIMS, is lower than $1\times10^{19}$ atoms/cm$^3$, preferably lower than $5\times10^{18}$ atoms/cm$^3$, more preferably lower than $1\times10^{18}$ atoms/cm$^3$. The concentration of hydrogen at a certain depth of the oxide semiconductor or in a region of the oxide semiconductor is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen at a certain depth of the oxide semiconductor or in a region of the oxide semiconductor is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In addition, in the case where the oxide semiconductor includes a crystal, high concentration of silicon or carbon might reduce the crystallinity of the oxide semiconductor. In order not to reduce the crystallinity of the oxide semiconductor, for example, the concentration of silicon at a certain depth of the oxide semiconductor or in a region of the oxide semiconductor is lower than $1\times10^{19}$ atoms/cm$^3$, preferably lower than $5\times10^{18}$ atoms/cm$^3$, more preferably lower than $1\times10^{18}$ atoms/cm$^3$. Furthermore, the concentration of carbon at a certain depth of the oxide semiconductor or in a region of the oxide semiconductor is lower than $1\times10^{19}$ atoms/cm$^3$, preferably lower than $5\times10^{18}$ atoms/cm$^3$, more preferably lower than $1\times10^{18}$ atoms/cm$^3$, for example.

A transistor in which the above highly purified oxide semiconductor is used for a channel formation region exhibits extremely low off-state current. When voltage between a source and a drain is set at about 0.1 V, 5 V, or 10 V, for example, the off-state current standardized on the channel width of the transistor can be as low as several yoctoamperes per micrometer to several zeptoamperes per micrometer.

FIGS. 41A to 41D show examples in which the OS layer 520 has a three-layer structure; however, the present invention is not limited thereto. For example, the OS layer 520 may have a two-layer structure without the OS layer 521 or the OS layer 523. Alternatively, the OS layer 520 may have a four-layer structure in which any one of the oxide semiconductors described as the OS layers 521, 522 and 523 is provided below or over the OS layer 521 or below or over the OS layer 523. Alternatively, the OS layer 520 may have an n-layer structure (n is an integer of 5 or more) in which any one of the oxide semiconductors (e.g., the OS layers 521 to 523) is provided at two or more of the following positions: between arbitrary layers in the OS layer 520, over the OS layer 520, and below the OS layer 520.

<<Structure Example 2 of OS Transistor>>

Figure 42A:
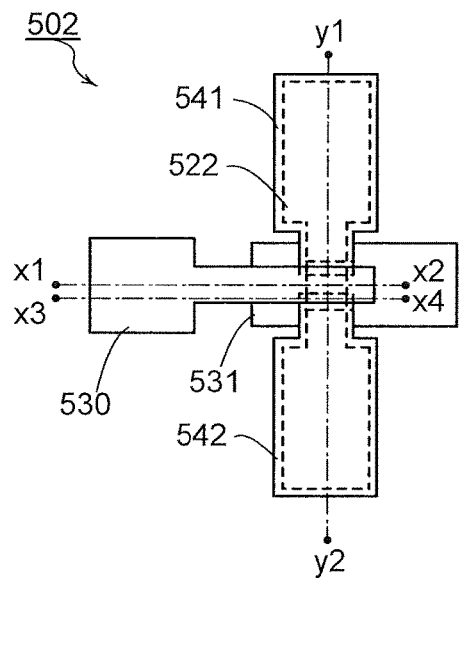
FIGS. 42A to 42D illustrate a structure example of an OS transistor.
Figure 42B:
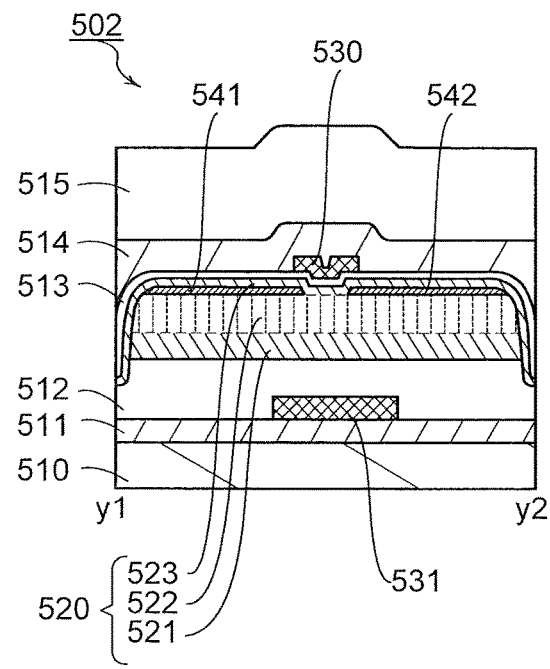
Figure 42C:
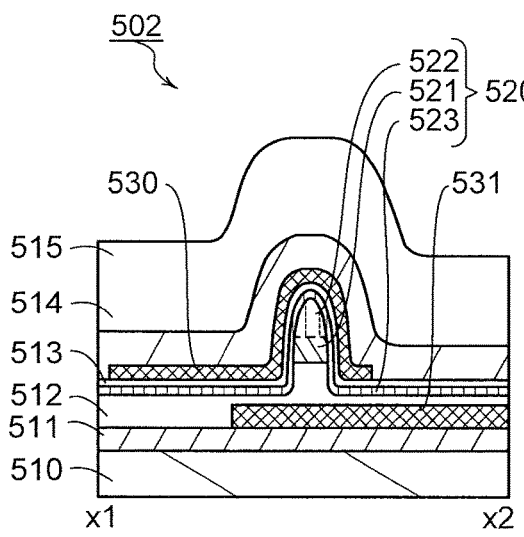
Figure 42D:
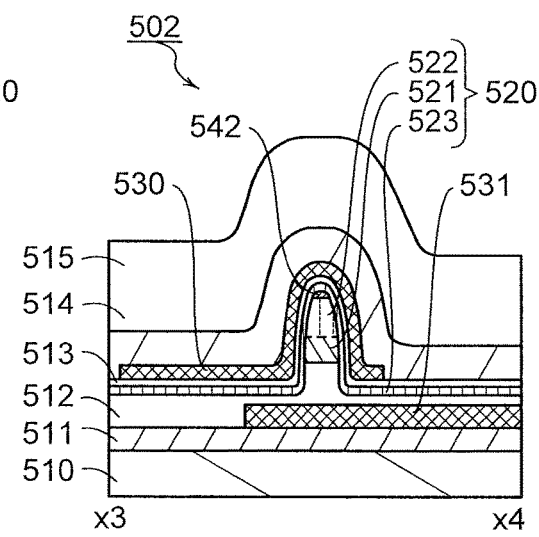
Figure 43A:
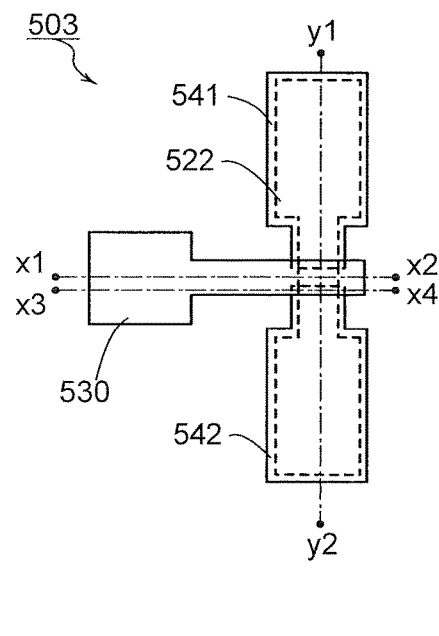
FIGS. 43A to 43D illustrate a structure example of an OS transistor.
Figure 43B:
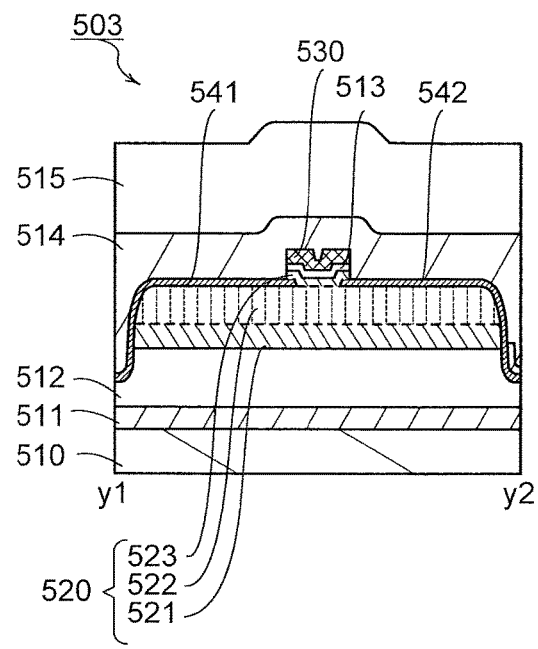
Figure 43C:
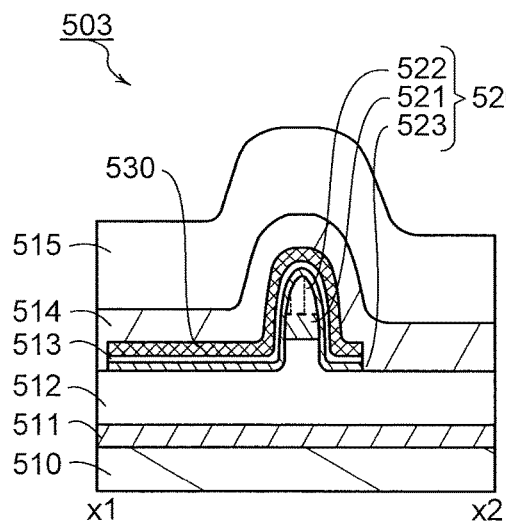
Figure 43D:
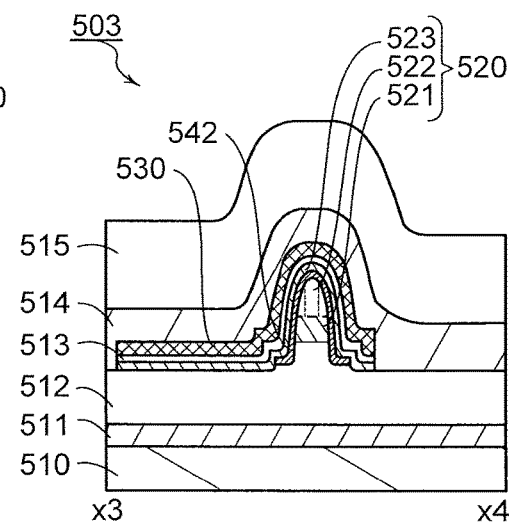
Figure 44A:
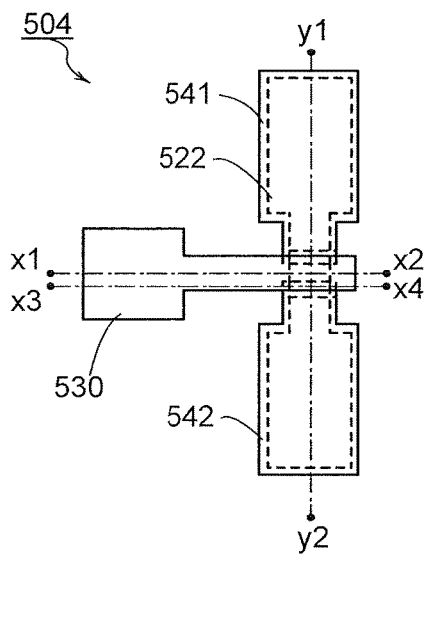
FIGS. 44A to 44D illustrate a structure example of an OS transistor.
Figure 44B:
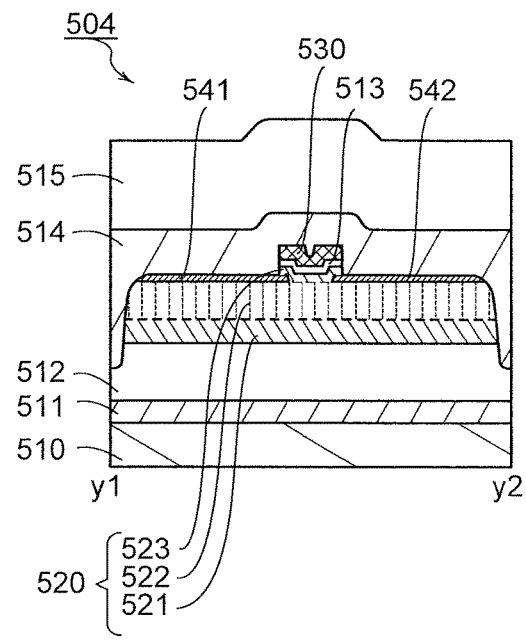
Figure 44C:
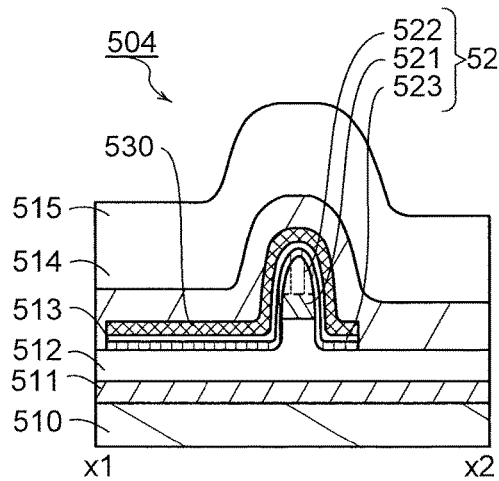
Figure 44D:
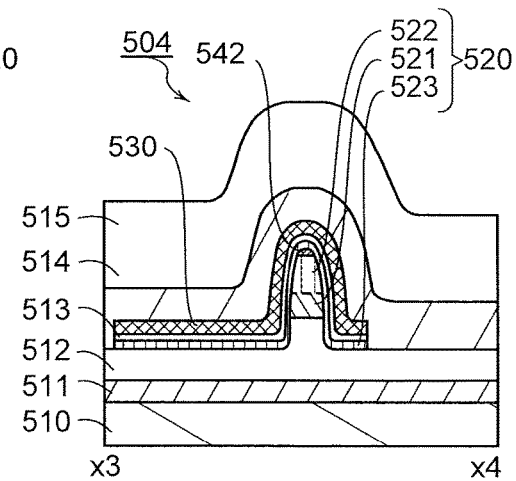
Figure 45A:
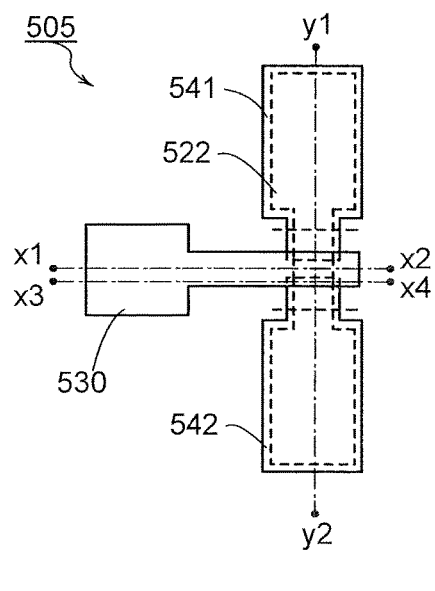
FIGS. 45A to 45D illustrate a structure example of an OS transistor.
Figure 45B:
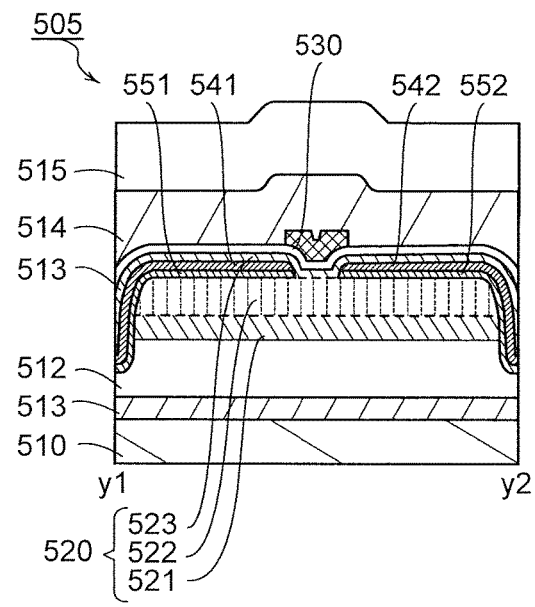
Figure 45C:
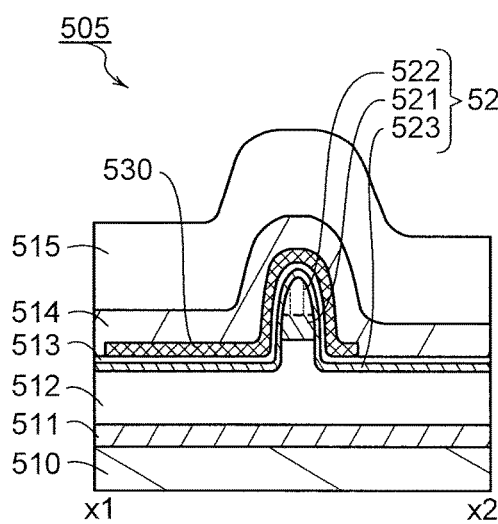
Figure 45D:
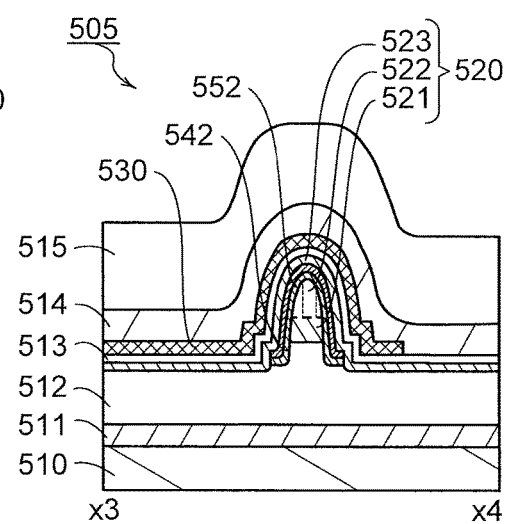
Figure 46A:
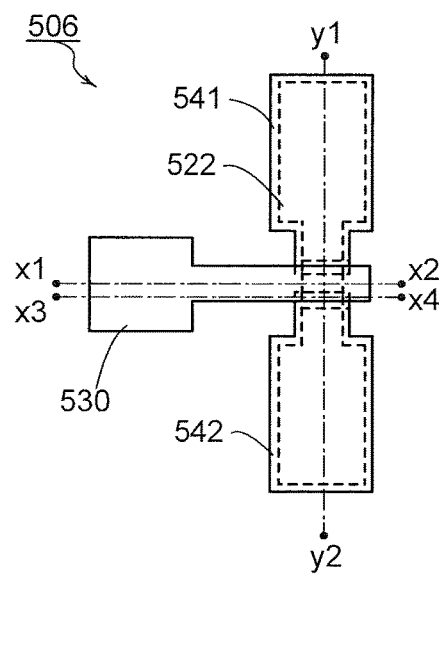
FIGS. 46A to 46D illustrate a structure example of an OS transistor.
Figure 46B:
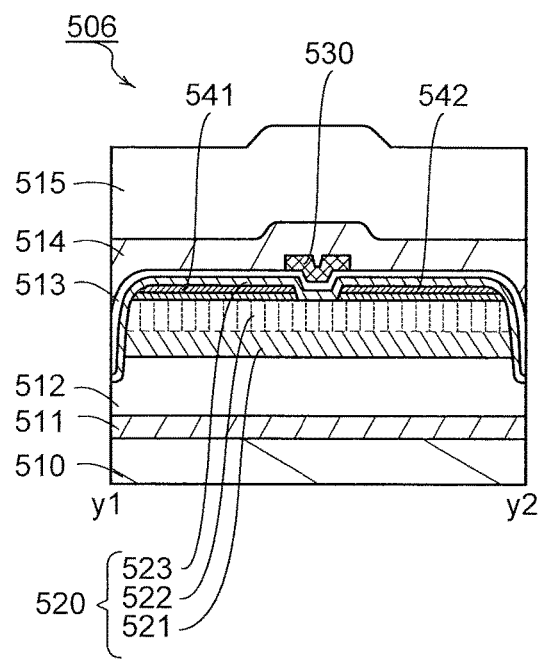
Figure 46C:
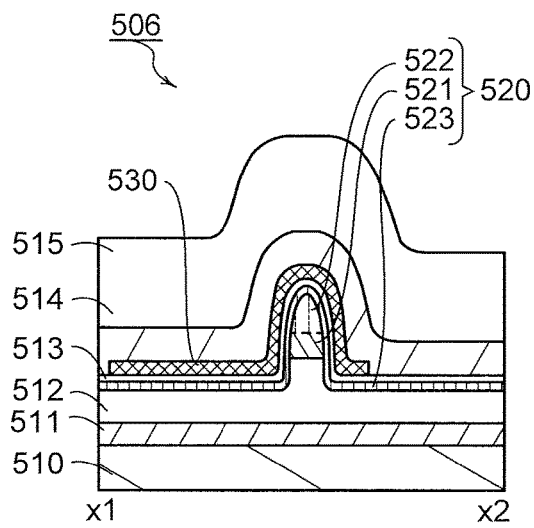
Figure 46D:
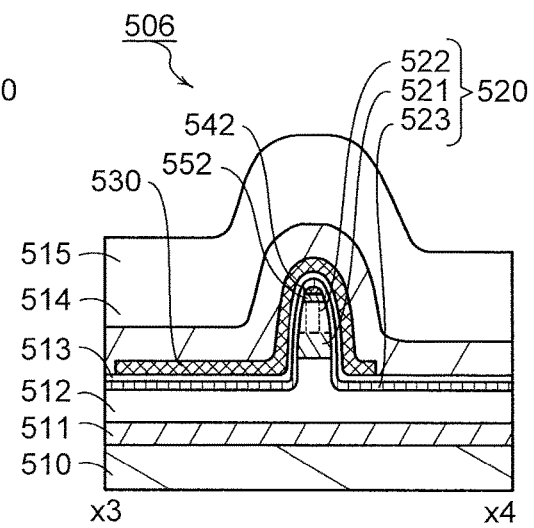

An OS transistor 502 in FIGS. 42A to 42D is a modification example of the OS transistor 501. FIG. 42A is a top view of the OS transistor 502. FIG. 42B is a cross-sectional view taken along line y1-y2 in 42A. FIG. 42C is a cross-sectional view taken along line x1-x2 in 42A. FIG. 42D is a cross-sectional view taken along line x3-x4 in 42A. Note that to clarify the device structure, FIG. 42A does not illustrate some components.

Like the OS transistor 501, the OS transistor 502 illustrated in FIGS. 42A to 42D also has the s-channel structure. The OS transistor 502 is different from the OS transistor 501 in the shapes of the conductive layer 541 and the conductive layer 542 and in that the conductive layer 531 is provided over the insulating layer 511.

The conductive layer 541 and the conductive layer 542 in the OS transistor 502 are formed from a hard mask used for forming the stacked film of the OS layer 521 and the OS layer 522. Therefore, the conductive layer 541 and the conductive layer 542 do not have regions in contact with the side surfaces of the OS layer 521 and the OS layer 522 (FIG. 42D).

For example, through the following steps, the OS layers 521 and 522 and the conductive layers 541 and 542 can be formed. A two-layer oxide semiconductor film including the OS layers 521 and 522 is formed. A single-layer or multi-layer conductive film is formed over the oxide semiconductor film. This conductive film is etched, so that a hard mask is formed. Using this hard mask, the two-layer oxide semiconductor film is etched to form the OS layers 521 and 522. Then, the hard mask is etched to form the conductive layer 541 and the conductive layer 542.

The conductive layer 531 can function as a back gate electrode of the OS transistor 502. The conductive layer 531 can be provided in the OS transistor 501 in FIGS. 41A to 41D, and OS transistors 503 to 506 (FIGS. 43A to 43D, FIGS. 44A to 44D, FIGS. 45A to 45D, and FIGS. 46A to 46D) which will be described later.

A signal sa and a fixed potential Vb may be supplied to the conductive layer 530 (gate electrode) and the conductive layer 531 (back gate electrode), respectively. Alternatively, the signal sa and a signal sb may be supplied to the conductive layer 530 and the conductive layer 531, respectively. Further alternatively, a fixed potential Va and a fixed potential Vb may be supplied to the conductive layer 530 and the conductive layer 531, respectively.

The signal sa is, for example, a signal for controlling a conduction state and a non-conduction state. The signal sa may be a digital signal with two kinds of potentials of a potential V1 and a potential V2 (V1>V2). For example, the potential V1 can be a high power supply potential and the potential V2 can be a low power supply potential. The signal sa may be an analog signal.

The fixed potential Vb is, for example, a potential for controlling the threshold voltage VthA corresponding to the conductive layer 530 (gate electrode) of the OS transistor 502. The fixed potential Vb may be the potential V1 or the potential V2. In this case, it is preferable since no potential generation circuit to generate the fixed potential Vb is needed. The fixed potential Vb may be a potential different from the potential V1 or the potential V2. In some cases, the threshold voltage VthA can be high by setting the fixed potential Vb low. As a result, drain current generated when gate-source voltage Vgs is 0 V can be reduced and leakage current in the circuit including the transistor can be reduced in some cases. For example, the fixed potential Vb may be set to be lower than the lower power supply potential. The threshold voltage VthA can be low by setting the fixed potential Vb high in some cases. As a result, drain current generated when the gate-source voltage Vgs is VDD can be increased and operation speed of the circuit including the OS transistor 502 can be improved in some cases. For example, the fixed potential Vb may be set to be higher than the low power supply potential.

The signal sb is a signal for controlling a conduction state and a non-conduction of the transistors. The signal sb may be a digital signal with two kinds of potentials of a potential V3 and a potential V4 (V3>V4). For example, the potential V3 can be a high power supply potential and the potential V4 can be a low power supply potential. The signal sb may be an analog signal.

When both the signal sa and the signal sb are digital signals, the signal sb may be a signal having the same digital value as the signal sa. In this case, there is a case where the on-state current of the OS transistor 502 and operation speed of the circuit including the OS transistor 502 are improved.

At that time, the potential V1 and the potential V2 of the signal sa may be different from the potential V3 and the potential V4 of the signal sb. For example, when a gate insulating layer (the insulating layer 512) corresponding to the back gate electrode to which the signal sb is input is thicker than a gate insulating layer (the insulating layer 513) corresponding to the gate to which the signal sa is input, the potential amplitude (V3−V□) of the signal sb may be higher than the potential amplitude (V1−V□) of the signal sa. Thus, the influence of the signal sa and the signal sb on the conduction state and the non-conduction of the transistors can be substantially the same in some cases.

When both the signal sa and the signal sb are digital signals, the signal sa and the signal sb may have different digital values. In that case, sometimes the OS transistor 502 can be controlled differently with the signal sa and the signal sb; thus, the OS transistor 502 can have high functionality. For example, if the OS transistor 502 is an n-channel transistor, the OS transistor 502 may be turned on only when the signal sa has the potential V1 and the signal sb has the potential V3, or may be turned off only when the signal sa has the potential V2 and the signal sb has the potential V4, in which case the OS transistor 502, a single transistor, may function as a NAND circuit, a NOR circuit, or the like. Furthermore, the signal sb may be a signal for controlling the threshold voltage VthA. For example, the potential of the signal sb in a period when the circuit including the OS transistor 502 operates may be different from the potential of the signal sb in a period when the circuit does not operate. Furthermore, the signal sb may be a signal whose potential is different between operation modes of the circuit. In that case, the potential of the signal sb is not switched so often as that of the signal sa in some cases.

When both the signal sa and the signal sb are analog signals, the signal sb may be an analog signal having the same potential as the signal sa, an analog signal whose potential is a constant times the potential of the signal sa, an analog signal obtained by adding or subtracting the potential of the signal sa by a constant, or the like. In that case, the on-state current of the transistor 502 is increased, and the operation speed of the circuits including the OS transistor 502 is improved in some cases. The signal sb may be an analog signal different from the signal sa. In that case, sometimes the OS transistor 502 can be controlled differently with the signal sa and the signal sb; thus, the OS transistor 502 can have high functionality.

The signal sa and the signal sb may be a digital signal and an analog signal, respectively. Alternatively, the signal sa and the signal sb may be an analog signal and a digital signal, respectively.

When fixed potentials are applied to the gate electrodes of the OS transistor 502, the OS transistor 502 can function as an element substantially equivalent to a resistor. For example, when the OS transistor 502 is an n-channel transistor, the effective resistance of the OS transistor 502 can be sometimes low (high) by making the fixed potential Va or the fixed potential Vb high (low). When both the fixed potential Va and the fixed potential Vb are high (low), the effective resistance can be lower (higher) than that of a transistor with only one gate in some cases.

<<Structure Examples 3 and 4 of OS Transistor>>

The OS transistor 503 in FIGS. 43A to 43D is a modification example of the OS transistor 501. The OS transistor 504 in FIGS. 44A to 44D is a modification example of the OS transistor 502. In each of the OS transistors 503 and 504, the conductive layer 530 is used as a mask, and the OS layer 523 and the insulating layer 513 are etched. Accordingly, edges of the OS layer 523 and the insulating layer 513 are substantially aligned with an edge of the conductive layer 530.

<<Structure Examples 5 and 6 of OS Transistor>>

The OS transistor 505 in FIGS. 45A to 45D is a modification example of the OS transistor 501, and the OS transistor 506 in FIGS. 46A to 46D is a modification example of the OS transistor 502. The OS transistor 505 has a layer 551 between the OS layer 523 and the conductive layer 541. The OS transistor 506 has a layer 552 between the OS layer 523 and the conductive layer 542.

The layers 551 and 552 can be formed using any of a transparent conductor, an oxide semiconductor, a nitride semiconductor, and an oxynitride semiconductor, for example. The layers 551 and 552 can be formed using an n-type oxide semiconductor layer or can be formed using a conductive layer that has higher resistance than the conductive layers 541 and 542. The layers 551 and 552 can be formed using any of, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, and the like. Alternatively, these layers may contain one or more of hydrogen, carbon, nitrogen, silicon, germanium, and argon.

The layers 551 and 552 may have a property of transmitting visible light. Alternatively, the layers 551 and 552 may have a property of not transmitting visible light, ultraviolet light, infrared light, or X-rays by reflecting or absorbing it. In some cases, such a property can suppress a change in electrical characteristics of the transistor due to stray light.

The layers 551 and 552 may preferably be formed using a layer that does not form a Schottky barrier with the OS layer 532. Accordingly, on-state characteristics of the OS transistors 505 and 506 can be improved.

Note that the layers 551 and 552 preferably have higher resistance than the conductive layers 541 and 542. The resistance of the layers 551 and 552 is preferably lower than the channel resistance of the transistor. For example, the layers 551 and 552 may have a resistivity of higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 551 and 552 having resistivity within the above range can reduce electric field concentration in a boundary portion between the channel and the drain. Therefore, a change in electrical characteristics of the transistor can be suppressed. In addition, punch-through current generated by an electric field from the drain can be reduced. Thus, a transistor with small channel length can have favorable saturation characteristics. Note that in a circuit configuration where the source and the drain do not interchange during the operation, only one of the layers 551 and 552 (e.g., the layer on the drain side) may be preferably provided.

<Oxide Semiconductor Film>

An oxide semiconductor film is described below. In this specification, the trigonal and rhombohedral crystal systems are included in the hexagonal crystal system. In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel"

indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like. In addition, examples of a crystalline oxide semiconductor include a single crystal oxide semiconductor, a CAAC-OS, a polycrystalline oxide semiconductor, and a microcrystalline oxide semiconductor.

<CAAC-OS Film>

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

<Microcrystalline Oxide Semiconductor Film>

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film <Amorphous Oxide Semiconductor Film>

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties intermediate between the nc-OS film and the amorphous oxide semiconductor film. The oxide semiconductor film having such a structure is specifically referred to as an a-like oxide semiconductor (amorphous-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, in the nc-OS film that has good quality, crystallization hardly occurs by a slight amount of electron beam used for TEM observation.

The crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

The density of an oxide semiconductor film might vary with its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

However, there might be no single crystal oxide semiconductor film having the same composition as the oxide semiconductor film. In that case, single crystal oxide semiconductor films with different compositions are combined in an adequate ratio to calculate film density equivalent to that of a single crystal oxide semiconductor film with the desired composition. For example, the film density of the single crystal oxide semiconductor film with the desired composition may be obtained by calculating the weighted average of the film densities of the single crystal oxide semiconductor films with the different compositions in consideration of the combination ratio therebetween. Note that it is preferable to use as few kinds of single crystal oxide semiconductor film as possible to calculate the film density.

Note that an oxide semiconductor film may be a stacked layer film including two or more films of an amorphous oxide semiconductor film, an a-like OS film, a microcrystalline oxide semiconductor film, and a CAAC-OS film, for example.

<<Film Formation Method>>

A sputtering method and a plasma-enhanced chemical vapor deposition (PECVD) method are typical examples of a method for forming an insulating film, a conductive film, a semiconductor film, and the like. The insulating film, the conductive film, the semiconductor film, and the like may be formed by another method, for example, a thermal CVD method. A metal organic chemical vapor deposition (MOCVD) method or an atomic layer deposition (ALD) method can be employed as thermal CVD method, for example.

A thermal CVD method has an advantage that no defect due to plasma damage is generated since it does not utilize plasma for forming a film. Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at the same time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated more than once until desired thickness is obtained, so that a thin film with excellent step coverage can be formed. The thickness of the thin film can be adjusted by the number of repetition times of the sequence of the gas introduction; therefore, an ALD method makes it possible to accurately adjust thickness and thus is suitable for manufacturing a minute FET.

The conductive film which is described in the above embodiment can be formed by a thermal CVD method such as a MOCVD method or an ALD method. For example, in the case where an InGaZnO$_X$ (X>0) Film is Formed, Trimethylindium, Trimethylgallium, and Diethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an InGaZnO$_X$ (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are used to form a GaO layer, and then a $Zn(CH_3)_2$ gas and an $O_3$ gas are used to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas that is obtained by bubbling with an inert gas such as Ar may be used instead of an $O_3$ gas, it is preferable to use an $O_3$ gas, which does not contain H. Instead of a $In(CH_3)_3$ gas, a $(C_2H_5)_3$ In gas may be used. Instead of a $Ga(CH_3)_3$ gas, a $Ga(C_2H_5)_3$ gas may be used. Furthermore, a $Zn(CH_3)_2$ gas may be used.

(Embodiment 5)

In this embodiment, the device structure of a semiconductor device is described. As described in Embodiment 1, the semiconductor device can include a Si transistor and an OS transistor. In such a structure example, the semiconductor device can be downsized by stacking the Si transistor and the OS transistor. A structure example of a semiconductor device with such a layered structure is described with reference to FIGS. 48A and 48B.

Figure 48A:
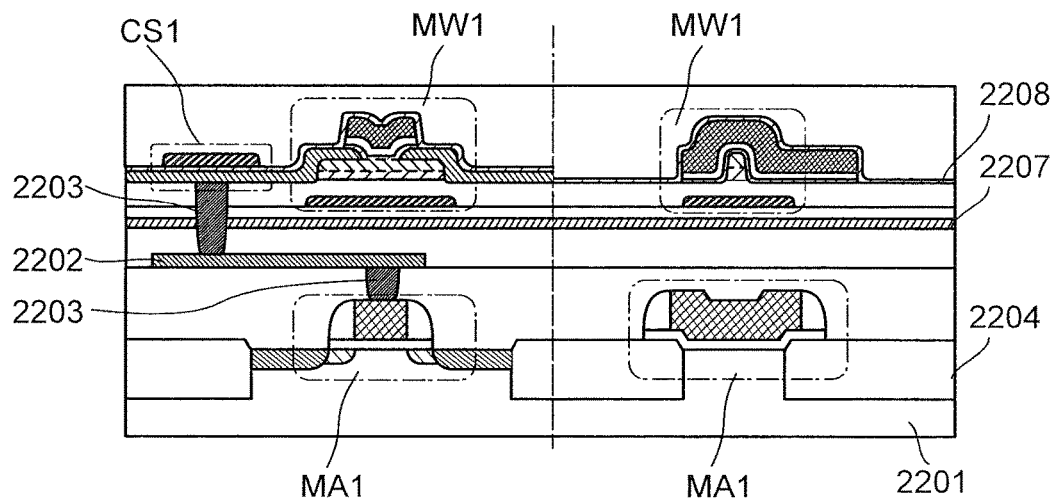
FIGS. 48A and 48B are cross-sectional views each showing a structure example of a semiconductor device.

A device structure of the circuit 101 illustrated in FIG. 1, which is an example of the semiconductor device, will be described. FIG. 48A typically illustrates the circuit 30 in the circuit 101. A cross-sectional structure of the transistor MW1, the transistor MA1, and a capacitor CB1 is shown in FIG. 48A. A cross-sectional structure of the transistors MW1 and MA2 in the channel length direction is shown on the left side, and a cross-sectional structure of the transistors MW1 and MA2 in the channel width direction is shown on the right side. FIG. 48A is not a cross-sectional view of the circuit 101 taken along a specific line but a view for illustrating the layered structure of the circuit 101.

For the semiconductor substrate 2201, a bulk or silicon on insulator (SOI) semiconductor substrate, or the like can be used. A crystalline structure of a semiconductor included in the semiconductor substrate 2201 is preferably a single-crystal structure or a polycrystalline structure. As a semiconductor material of the semiconductor substrate 2201, silicon, silicon carbide, silicon germanium, or the like is used. A transistor manufactured using a semiconductor substrate can operate at high speed easily. In the case of using a p-type single crystal silicon substrate as the semiconductor substrate 2201, an impurity element imparting n-type conductivity may be added to part of the semiconductor substrate 2201 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Here, a planar-type field-effect transistor is used as the transistor MA1. The insulating layer 2204 functions as an element separation region. The device structure of the transistor MA1 is not limited to the example of FIG. 48A. For example, a 3D transistor formed utilizing an projection portion of a semiconductor substrate (e.g., a fin-type transistor or a Tri-gate type transistor) can be employed.

The transistor MW1 and the capacitor CS1 are stacked over the transistor MA1. The transistor MW1 is an OS transistor in which a channel is formed in an oxide semiconductor layer. When the transistor described in Embodiment 4 is used as the transistor MW1, the transistor can have excellent subthreshold characteristics and a minute structure. In the example of FIG. 48A, a back gate electrode is provided for the transistor MW1; however, it is not necessarily provided. The transistor MW1 and the capacitor CS1 are each electrically connected to a gate electrode of the transistor MA1 via a plug 2203 and a wiring 2202.

Figure 48B:
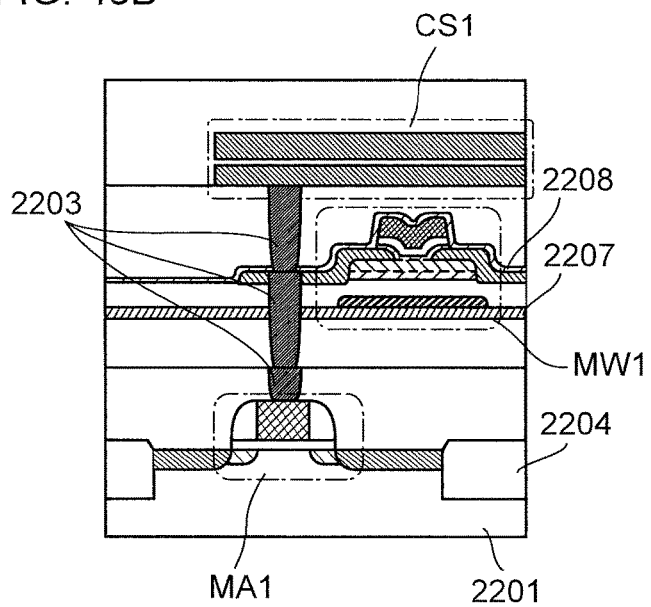

FIG. 48A illustrates an example in which an electrode of the capacitor CS1 and an electrode of the transistor MW1 are integrated and an insulating layer covering the transistor MW1 also serves as a dielectric of the capacitor CS1. For example, as shown in FIG. 48B, the capacitor CS1 can be stacked over the transistor MW1. The capacitor CS1 shown in FIG. 48B is electrically connected to the transistor MW1 and the transistor MA1 via the plug 2203.

An insulating layer 2207 is provided between the transistor MA1 and the transistor MW1. The insulating layer 2207 makes hydrogen remain in the lower portion, thereby improving the reliability of the transistor MA1. In addition, since the insulating layer 2207 suppresses diffusion of hydrogen from the lower portion to the upper portion, the reliability of the transistor MW1 also can be improved. The insulating layer 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

The insulating layer 2208 is provided so as to cover the transistor MW1. For the insulating layer 2208, a material that is similar to that of the insulating layer 2207 can be used, and in particular, an aluminum oxide layer is preferably used. The aluminum oxide layer has a high shielding (blocking) effect of preventing penetration of both oxygen and impurities such as hydrogen and moisture. Thus, by using the aluminum oxide layer as the insulating layer 2208, release of oxygen from the oxide semiconductor layer included in the transistor MW1 can be prevented and entry of water and hydrogen into the oxide semiconductor layer can be prevented.

The wiring 2202 and the plug 2203 can be formed using a metal selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), and the like; an alloy of such a metal; or a metal compound containing such a metal. It is particularly preferable to use a high-melting-point material that has both heat resistance and conductivity, such as tungsten or molybdenum. In addition, the wiring 2202 and the plug 2203 are preferably formed using a low-resistance conductive material such as aluminum or copper. The wiring 2202 and the plug 2203 are preferably formed using a Cu—Mn alloy, since in that case, manganese oxide formed at the interface with an insulator containing oxygen has a function of preventing Cu diffusion. The wiring 2202 and the plug 2203 may have a single layer structure or a stacked-layer structure.

In FIGS. 48A and 48B, regions where reference numerals and hatching patterns are not given show regions formed of an insulator. In these regions, an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used.

[Example 1]

Figure 49:
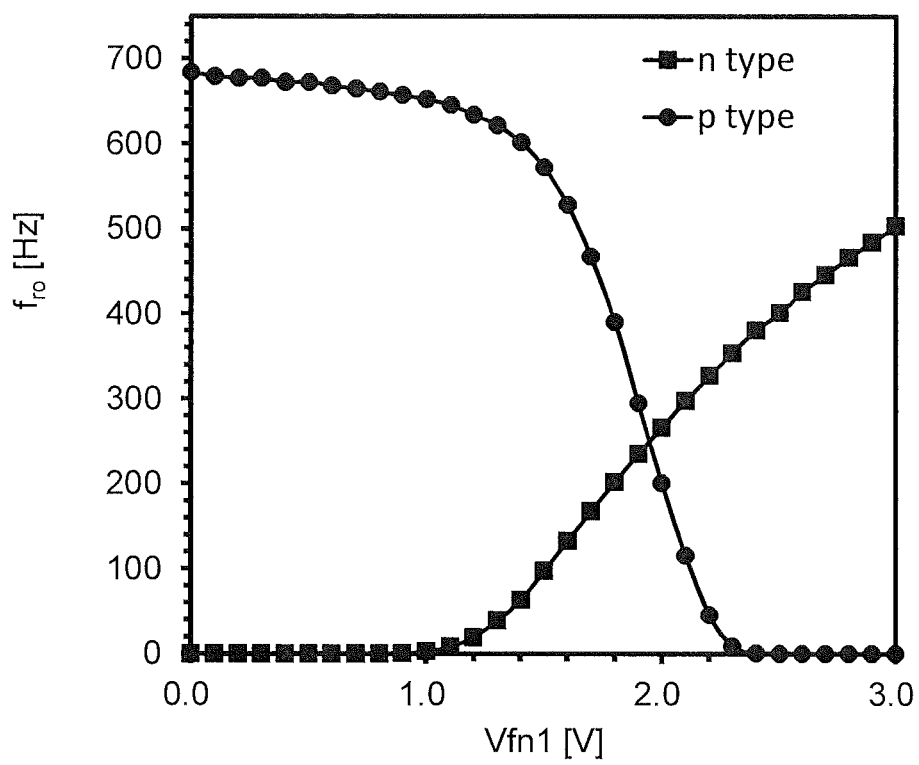
FIG. 49 is a graph showing a change in oscillation frequency calculated by simulation with respect to a holding potential of a ring oscillator circuit.

The operation of a ring oscillator circuit was examined by simulation. The examined ring oscillator circuit includes the seven-stage circuits 30 (FIG. 2). For the calculation, circuit simulator SPICE was used. FIG. 49 shows a change in oscillation frequency $f_{ro}$ of the ring oscillator circuit to the potential Vfn1 of the node FN1 of the circuit 30. The VDD is 3.0 V and GND is 0 V. FIG. 49 show a result in the case where the transistor MA1 is an n-channel transistor and the case where the transistor MA1 is a p-channel transistor.

As shown in FIG. 49, the oscillation frequency $f_{ro}$ is changed by the potential Vfn1. FIG. 49 shows that the oscillator circuit described in Embodiment 1 has a function of linearly changing the oscillation frequency by an analog potential held at the node FN1. Embodiment 1 shows that it is possible to provide an oscillator circuit with high controllability.

FIG. 49 also shows that the controllability of the oscillation frequency $f_{ro}$ is better when the transistor MA1 is an n-channel transistor than that when the transistor MA1 is a p-channel transistor. When the transistor MA1 is an n-channel transistor, $f_{ro}$ is linearly changed in the range where 1.2 V≥Vfn1≥3.0 V. Thus, when the delay time is controlled by the high power supply potential of the inverter as in the circuits 30 to 32, the transistor MA1 is preferably an n-channel transistor. Furthermore, when the delay time is controlled by the low power supply potential of the inverter as in the circuits 35 to 37, the controllability of the ring oscillator circuit is increased when the transistor MA1 is a p-channel transistor.

The simulation shows that a ring oscillator circuit which has excellent controllability and which is capable of storing oscillation frequency can be provided.
in which can be stored can be provided.

EXPLANATION OF REFERENCE

CB1: capacitor, CS11: capacitor, CS2: capacitor, CS9: capacitor, FD9: node, FN1: node, FN9: node, HN1: node, HN2: node, INV11: inverter, LN1: node, MA1: transistor, MA9: transistor, MB1: transistor, Mn1: transistor, Mn2: transistor, Mp1: transistor, MS1: transistor, MS9 transistor, MW1: transistor, MW9: transistor, ND1: node, ND1: output node, ND9: node, ND11: node, ND12: output node, NV1: node, NV2: node, Qn1: transistor, Qn2: transistor, Qn3: transistor, Qn4: transistor, Qn5: transistor, Qn6: transistor, Qn7: transistor, Qn8: transistor, Qn11: transistor, Qn12: transistor, Qn13 transistor, Qn14: transistor, Qp1: transistor, Qp2: transistor, Qp3: transistor, Rn7: resistor, Rn8: resistor, SN1: node, SN2: node, SW1: switch, SW2: switch, 11: circuit, 12: circuit, 20: circuit, 21: circuit, 30 circuit, 31: circuit, 32: circuit, 35: circuit, 36: circuit, 37: circuit, 41: circuit, 42: circuit, 43: circuit, 44: circuit, 45: circuit, 46: circuit, 70: circuit, 71: circuit, 80: circuit, 81: buffer circuit, 85: circuit, 90: circuit, 92: circuit, 100: circuit, 101: circuit, 102: circuit, 103: circuit, 111: circuit, 112: circuit, 121: control circuit, 200: phase locked loop (PLL), 201: PLL, 202: PLL, 210: loop filter, 211: phase comparator, 212: control circuit, 213: digital-to-analog converter (DAC), 214: voltage controlled oscillator (VCO), 215: frequency divider, 216: signal generation circuit, 301: level shift circuit, 302: level shift circuit, 303: level shift circuit, 304: level shift circuit, 305: level shift circuit, 306: level shift circuit, 307: level shift circuit, 321: level shift circuit, 322: latch circuit, 323: current control circuit, 331: inverter, 332: inverter, 333: inverter, 334: inverter, 345: transistor, 346: transistor, 347: transistor, 348: transistor, 349: transistor, 351: transistor, 352: transistor, 353: transistor, 354: transistor, 355: transistor, 371: amplifier circuit unit, 372: latch circuit, 373: current control circuit, 501: OS (oxide semiconductor) transistor, 502: OS transistor, 503: OS transistor, 504: OS transistor, 505: OS transistor, 506: OS transistor, 510: substrate, 511: insulating layer, 512: insulating layer, 512: insulating film, 513: insulating layer, 514: insulating layer, 515: insulating layer, 520: OS layer, 521: OS layer, 522: OS layer, 523: OS layer, 530: conductive layer, 531: conductive layer, 541: conductive layer, 542: conductive layer, 551: layer, 552: layer, 900: portable game machine, 901: housing, 902: housing, 903: display portion, 904: display portion, 905: microphone, 906: speaker, 907: operation key, 908: stylus, 910: information terminal, 911: housing, 912: display portion, 913: camera, 914: speaker portion, 915: operation button, 916: external connection portion, 917: microphone, 920: notebook PC, 921: housing, 922: display portion, 923: key board, 924: pointing device, 940: video camera, 941: housing, 942: housing, 943: display portion, 944: operation key, 945: lens, 946: joint, 950: information terminal, 951: housing, 952: display portion, 960: information terminal, 961: housing, 962: display portion, 963: band, 964: buckle, 965: operation button, 966: input/output terminal, 967: icon, 970: electric refrigerator-freezer, 971: housing, 972: refrigerator door, 973: freezer door, 980: motor vehicle, 981: car body, 982: wheel, 983: dashboard, 984: light, 1000: wireless IC, 1001: rectifier circuit, 1002: power supply circuit, 1003: demodulation circuit, 1004: modulation circuit, 1005: PLL, 1006: logic circuit, 1007: memory circuit, 1008: read-only memory (ROM), 1009: encoding circuit, 1010: antenna, 1011: antenna, 1012: communication device, 1013: radio signal, 1020: RF tag, 1050: programmable logic device (PLD), 1051: I/O element, 1052: random access memory (RAM), 1053: multiplier, 1054: PLL, 1070: microcontroller unit (MCU), 1071: CPU core, 1072: power source management unit (PMU), 1073: power gate, 1074: timer, 1075: PLL, 1080: wireless module, 1081: analog digital converter (ADC), 1082: watchdog timer, 1083: ROM, 1085: power supply circuit, 1086: interface (IF) element, 1400: display device, 1410: display panel, 1421: upper cover, 1422: lower cover, 1423: FPC, 1424: touch panel unit, 1425: FPC, 1426: back light unit, 1427: light source, 1428: frame, 1429: printed board, 1430: battery, 1500: imaging device, 1510: pixel portion, 1511: pixel, 1521: driver circuit, 1522: driver circuit, 1523: driver circuit, 1524: driver circuit, 1531: signal processing circuit, 1532: column driver circuit, 1533: output circuit, 1534: circuit, 1537: wiring, 1538: wiring, 1539: wiring, 1540: wiring, 1541: comparator, 1542: counter circuit, 2201: semiconductor substrate, 2202: wiring, 2203: plug, 2204: insulating layer, 2207: insulating layer, 2208: insulating layer.

This application is based on Japanese Patent Application serial No. 2014-151623 filed with Japan Patent Office on Jul. 25, 2014, the entire contents of which are hereby incorporated by reference.

The invention claimed is:

1. A circuit comprising:
    a first transistor including an oxide semiconductor in its channel;
    a second transistor including a gate electrically connected to one of source and drain of the first transistor;
    a capacitor electrically connected to the one of source and drain of the first transistor; and
    an inverter including an input, an output, a first terminal and a second terminal, wherein one of the first terminal and the second terminal is electrically connected to one of source and drain of the second transistor, and
    wherein a high power supply potential is applied to another of source and drain of the second transistor through no transistor.

2. The circuit according to claim 1, further comprising a third transistor electrically connected to the output of the inverter.

3. The circuit according to claim 1, further comprising a third transistor electrically connected to the one of first terminal and second terminal of the inverter, and to the one of source and drain of the second transistor.

4. The circuit according to claim 1, wherein another of first terminal and second terminal of the inverter is at a ground potential.

5. A ring oscillator including n circuits (n is an odd number) according to claim 1.

* * * * *